(12) United States Patent
Hess et al.

(10) Patent No.: US 8,790,594 B2
(45) Date of Patent: Jul. 29, 2014

(54) PATTERNING OF SURFACES TO CONTROL THE STORAGE, MOBILITY AND TRANSPORT OF LIQUIDS FOR MICROFLUIDIC APPLICATIONS

(75) Inventors: Dennis W. Hess, Atlanta, GA (US); Balamurali Balu, Atlanta, GA (US); Victor Breedveld, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 389 days.

(21) Appl. No.: 13/093,769

(22) Filed: Apr. 25, 2011

(65) Prior Publication Data

US 2011/0286896 A1    Nov. 24, 2011

Related U.S. Application Data

(60) Provisional application No. 61/327,322, filed on Apr. 23, 2010.

(51) Int. Cl.
*B01L 99/00* (2010.01)
*B82Y 30/00* (2011.01)
*B82Y 40/00* (2011.01)

(52) U.S. Cl.
CPC ............... *B82Y 30/00* (2013.01); *B82Y 40/00* (2013.01); *B01L 2300/0816* (2013.01)
USPC ............. 422/502; 427/538; 427/539; 216/67

(58) Field of Classification Search
CPC .............................. B82Y 30/00; B82Y 40/00
USPC ............. 422/502; 427/535, 538, 539; 216/67
See application file for complete search history.

(56) References Cited

U.S. PATENT DOCUMENTS

| | | | | |
|---|---|---|---|---|
| 5,324,566 | A * | 6/1994 | Ogawa et al. | 428/141 |
| 2003/0136518 | A1 * | 7/2003 | Shanov et al. | 156/345.41 |
| 2010/0172799 | A1 * | 7/2010 | Roeper et al. | 422/68.1 |

\* cited by examiner

*Primary Examiner* — Paul Hyun
(74) *Attorney, Agent, or Firm* — Troutman Sanders LLP; Ryan A. Schneider; Troy S. Kleckley

(57) ABSTRACT

Systems and methods to pattern surfaces to create regions of variable adhesive force on a superhydrophobic paper surface. By taking advantage of high surface energy sticky islands on a non-sticky superhydrophobic surface, microliter water drops can be registered or confined at specific locations; selected drops can then be transferred to another patterned substrate and the drops mixed and/or allowed to react without the need for pipettes or other fluid transfer tool.

17 Claims, 32 Drawing Sheets

| Treatment | Contact angle | Contact angle hysteresis | Result |
|---|---|---|---|
| SH-treatment |  166.7 ± 0.9 |  3.4 ± 0.1 | "Roll-off" Superhydrophobic |
| PFE-treatment |  144.8 ± 5.7 |  79.1 ± 15.8 | "Sticky" Near Superhydrophobic |

PATTERNING OF SURFACES TO CONTROL THE STORAGE, MOBILITY AND TRANSPORT OF LIQUIDS FOR MICROFLUIDIC APPLICATIONS

CROSS-REFERENCE TO RELATED APPLICATIONS

This application claims the benefit of U.S. Provisional Application No. 61/327,322 filed 23 Apr. 2010, the entire contents and substance of which are hereby incorporated by reference.

BACKGROUND OF THE INVENTION

1. Field of the Invention

This invention relates generally to the field of superhydrophobic surfaces, and more specifically to the patterning of superhydrophobic surfaces to control the storage, mobility and transport of liquid drops for microfluidic applications.

2. Description of Related Art

The Lotus Effect is named after the lotus plant, and was first used for technical applications by Professor Wilhelm Barthlott from the University of Bonn. The Lotus Effect generally refers to two characteristic properties: superhydrophobicity and self-cleaning, although in some instances, either one of these properties provide the benefits of the Lotus Effect.

Superhydrophobicity is manifested by a water contact angle larger than 150°, while self-cleaning indicates that loose (non-adhered) dirt particles such as dust or soot are picked up by a drop of water as it rolls off the surface, and are thus removed. The superhydrophobicity and self-cleaning properties of a Lotus Effect surface are illustrated in FIGS. 1a and 1b.

TABLE 1 provides common definitions of liquid/surface phenomena related to water. For example, it will be understood that the values will change with other liquids, such as saline solution, wherein in a low concentration saline solution, there is no appreciable effect, but in higher saline concentrations, the contact angle will be lower. Thus, these definitions are also applicable to liquids with low concentrations of salts and particulates such as those found in normally encountered environmental pollution and biological fluid environments.

TABLE 1

| Description | Contact Angle (degrees) | Hysteresis (degrees) |
|---|---|---|
| Hydrophilic | <45 | — |
| Hydrophobic | >45 and <150 | >10 |
| Superhydrophobic | >150 | <10 |

In general, a Lotus Effect surface arises when both of the following factors are achieved: the surface is covered with low surface free energy materials, and has a very fine structure. Low surface free energy materials provide a relatively high contact angle. The contact angle is a measure of the wettability of a surface with a fluid—water in this case. Readily wettable (hydrophilic) surfaces have relatively small water contact angles, and non-wetting (hydrophobic) surface have relatively large contact angles.

Regarding surface structure, surfaces that are rough tend to be more hydrophobic than smooth surfaces, because air can be trapped in the fine structures, which reduces the contact area between the liquid and the surface, or water and solid. It is recognized that when a water drop is placed on a lotus plant surface, the air entrapped in the nanosurface structures prevents the total wetting of the surface, and only a small part of the surface, such as the tip of the nanostructures, is in contact with the water drop. For the lotus plant leaves, the actual contact area is only 2-3% of a droplet-covered surface. This enlarges the water/air interface while the solid/water interface is minimized. Therefore, the water gains very little energy through adsorption to compensate for any enlargement of its surface. In this situation, spreading does not occur, the water forms a spherical droplet, and the contact angle of the droplet depends almost entirely on the surface tension of the water. The relationship between the surface water contact angle and the surface structural geometry (Wenzel roughness) can be given in Cassie-Bexter equation:

$$\cos \theta_A = r f_1 \cos \theta_Y + f_1 - 1 \qquad \text{Equation 1}$$

where the parameter r is the ratio of the actual solid-liquid contact area to its vertical projected area (Wenzel roughness factor), $\theta_A$ is the apparent contact angle on the rough surface, and $\theta_Y$ is the contact angle on a flat surface as per Young's equation, $f_1$ is the solid surface fraction.

Thus, the contact angle, θ, is a quantitative measure of the wetting of a solid by a liquid. It is defined geometrically as the angle formed by a liquid at the three phase boundary where a liquid, gas and solid intersect.

A low value of contact angle (θ) indicates that the liquid spreads, or wets well, while a high contact angle indicates poor wetting. If the angle θ is less than 90°, the liquid is said to wet the solid. If it is greater than 90°, it is said to be non-wetting. A zero contact angle represents complete wetting.

The difference between the maximum and minimum contact angle values is the contact angle hysteresis. FIG. 2 is a schematic representation of contact angle and angle hysteresis, which helps characterize surface heterogeneity, roughness and mobility. For surfaces which are not homogeneous, there will exist domains on the surface that present barriers to the motion of the contact line. For the case of chemical heterogeneity, these domains represent areas with different contact angles than the surrounding surface. For example, when wetting with water, hydrophobic domains will pin the motion of the contact line as the liquid advances, thus increasing the contact angles. When the water recedes, the hydrophilic domains will hold back the draining motion of the contact line, thus decreasing the contact angle. Thus, when testing with water, advancing angles will be sensitive to the hydrophobic domains, and receding angles will characterize the hydrophilic domains on the surface.

For situations in which surface roughness generates hysteresis, the actual microscopic variations of slope in the surface create the barriers that pin the motion of the contact line and alter the macroscopic contact angles.

Although the Lotus Effect was discovered in plants, it is essentially a physicochemical property rather than a biological property. Therefore, it is possible to mimic the lotus surface structure.

Superhydrophobic properties are desirable for many applications. Recently, there has been an increased interest in the fabrication of superhydrophobic surfaces with high adhesive force. Interestingly, these two seemingly incompatible properties—high advancing contact angle (repulsion force) and high adhesive force (attraction force)—can be combined on a single surface which has been termed as "sticky" superhydrophobic surface.

Currently, paper is more than just a substrate for writing, printing and packaging; recent scientific research has established its potential as an inexpensive, biodegradable, renewable, flexible polymer substrate. Innovative concepts of paper-based devices include transistors, batteries, super-capacitors, MEMS devices, sensors, and lab-on-a-chip (LOC) microfluidic devices.

It is known that superhydrophobic paper/cellulose surfaces can be fabricated with tunability in adhesive force (from extremely sticky to non-sticky or roll-off) by using a two-step plasma enhanced chemical vapor etching/deposition process. Further, there has been an increased interest in investigating paper as a potential candidate for lab-on-a-chip/microfluidics devices and field-effect transistors.

Fabrication of extremely water repellant superhydrophobic paper surfaces has been shown (contact angle (CA)≈166.7±0.9° ; CA hysteresis≈3.4±0.1°) for potential applications in the chemical and biomedical fields via plasma treatment. In defining superhydrophobicity, researchers often focus on the advancing contact angle, but the receding contact angle plays an important role as well, and protocols have been developed to control the adhesion of water drops on paper substrates by tuning the contact angle hysteresis between 149.8±5.8° and 3.5±1.1°, while maintaining the advancing CA above 150°. To distinguish between these substrates, we use the terminology "roll-off superhydrophobic" (CA>150°; hysteresis<10°) for low hysteresis substrates that exhibit the so-called lotus effect, and "sticky superhydrophobic" for substrates with high hysteresis (CA>150°; hysteresis>10°).

In the early stages of their development, LOC microfluidic devices were fabricated with technologies originally developed for the microelectronics industry, in particular photolithography and etching, and thus were fabricated from silicon wafers or glass substrates. Subsequently, researchers began investigating polymers as substrates (especially PDMS) in combination with soft lithography techniques because of the advantages of these substrates over silicon-or glass-based devices: transparency, flexibility, biochemical compatibility and permeability. However, even PDMS-based devices require the use of clean room facilities for the fabrication and incorporation of complex components such as valves, pumps and mixers.

Fluid actuation in these types of devices relies mostly on electrokinetic or pneumatic actuation, which requires an external power source (high voltage power supply, batteries, or compressed gas/vacuum sources). Overall, in spite of breakthrough advances in LOC concepts, most of the devices remain unsuitable for low-tech applications like biomedical diagnostics in developing countries due to the lack of simplicity and affordability.

Paper-based LOC devices (also referred to as lab-on-paper (LOP)) have emerged as a promising alternative technology. For fluid actuation on these devices, one can rely on capillary forces inside the porous paper, and thus avoid external power sources.

In a recent report on the top ten biotechnologies for improving health in developing countries "modified molecular technologies for affordable, simple diagnosis of infectious diseases" were ranked as the number one priority. Another report on the grand challenges for global health ranked the development of technologies to "measure disease and health status accurately and economically in poor countries" first among the top 14 priorities. Due to their affordability and potentially simple fabrication technology, LOP devices may offer improved global availability of medical technology.

In its simplest form, the concept of LOP dates back to the 1950s, when paper-based strips were first used for biomedical diagnostics. However, applications of these LOPs were limited by the fact that they could not perform multiplex analysis: i.e., it was impossible to perform multiple biochemical analyses on a single sample with the same strip. This limitation inspired the fabrication of multiple channels with barriers within a paper substrate, analogous to a microfluidic device, to enable multiplex analysis.

Creation of hydrophilic channels with hydrophobic barrier layers for biochemical assay devices was originally proposed in 1995 and 2003. More recently, this concept has been adapted by using modern photolithography techniques to create hydrophobic photoresist barriers.

This work has since been expanded to three-dimensional LOP devices by layering sheets of patterned paper with perforated barrier tape to guide the exchange of liquids between paper layers. Yet, a disadvantage of these LOPs was the limited flexibility due to the use of rigid photoresists (SU-8 or PMMA), which has been addressed by printing PDMS as a barrier polymer using a desktop plotter, thus creating flexible LOP devices. However, the low surface tension of uncrosslinked PDMS limits the spatial resolution of the patterns, resulting in broad and irregularly shaped barrier wall structures.

A new two-step method for patterning straight barrier walls was proposed: hydrophobize the entire paper substrate with Alkyl Ketene Dimer (AKD), and then create hydrophilic channels via a plasma patterning process. Although both PDMS-and AKD-based LOPs are flexible, the channels are relatively wide (1-2 mm) because of the patterning limitations. Controlled fabrication of channels with widths of several hundred micrometers has been achieved by printing hydrophilic patterns via inkjet printing.

The use of widely available technology to design LOP devices, for example a standard desktop printer, clearly offers substantially enhanced versatility, since it enables end-users to "program" LOP devices according to specific needs. A recent report has noted that programmable LOCs would be the next critical innovation in this technology. Most current LOP technologies limit the ability of non-expert users to program their own devices because of the complex chemicals, methods, and/or equipment needed for device fabrication.

Furthermore, all the LOP concepts discussed above depend on absorption of test fluids into the hydrophilic areas of porous paper and use capillary forces for fluid actuation. As a result, the fluid that has been incorporated inside a LOP cannot easily be extracted for further biochemical analysis. This is particularly important because the analysis in LOPs is currently semi-quantitative at best; the accuracy and sensitivity cannot compete with traditional analytical equipment.

One option to overcome this particular issue is to prevent absorption of the liquids into the paper matrix. By restricting droplets to the surface of the substrate, the samples are accessible for post-processing and quantitative analysis in a centralized testing center, while simple qualitative biochemical characterizations can still be performed at the point-of-care (POC).

In order to achieve this, droplets must be manipulated on a two dimensional substrate that enables basic unit operations: storage, guided transport, mixing and sampling. Two-dimensional microfluidic lab-on-chip devices have been previously obtained via electrowetting and optoelectrowetting (OEW), but these approaches require external power sources for operation and complicated fabrication methods. Ideally, a two-dimensional LOP should be inexpensive, enable design flexibility and operate without an external power source.

Thus, as discussed above, it would be desirable to pattern surfaces to create regions of variable adhesive force on a single superhydrophobic paper surface. It is to such systems and methods that that present invention is primarily directed.

BRIEF SUMMARY OF THE INVENTION

Briefly described, in exemplary form, the present invention comprises systems and methods to pattern surfaces to create regions of variable adhesive force on a single superhydrophobic paper surface. By taking advantage of high surface energy sticky islands on a non-sticky superhydrophobic surface, microliter water drops can be registered or confined at specific locations; selected drops can then be transferred to another patterned substrate and the drops mixed and/or allowed to react without the need for pipettes or other fluid transfer tool.

Superhydrophobic paper substrates with controlled adhesive properties offer the potential to serve as lab-on-a-chip/microfluidic devices in which individual drops can be addressed, merged with other drops (with reactants), and droplets stored for sampling merely by manipulating the drops on the paper surfaces.

These types of surfaces can find potential applications in the field of biomedical engineering, for example. The fact that these surfaces can be fabricated from paper, an inexpensive renewable biopolymer, widens the possible application base to include routine biological fluids tests at low cost.

The present patterning methods provide local control over droplet adhesion on superhydrophobic paper, and thus provide paper-based LOC microfluidic devices that enable manipulation (storage, transport, mixing and sampling) of drops of test fluids on the substrate, without absorption of these fluids into the porous paper. The present two-dimensional devices can be used for qualitative analytical fluid testing, as well as storage of large arrays of drops for transportation and further quantitative analysis.

The present invention provides a two-dimensional LOP device capable of storage, transfer, mixing and sampling of liquid drops by decorating superhydrophobic paper substrates with high surface energy ink patterns (for example, lines and dots). Surface energy and gravitational forces are used to manipulate and transfer drops, thus eliminating the need for an external power source.

The present invention's use of patterning changes the local contact angle hysteresis, resulting in sticky ink spots on non-sticky superhydrophobic paper; the substrates are therefore referred to as Hysteresis Enabled Lab-on-Paper (HELP) substrates. Patterns to manipulate microliter drops can be designed using standard word processing software and a commercially available desktop printing process that deposits waxy inks.

The simplicity of the software and hardware ensures that end-users can readily develop their own patterns to achieve desired functionality of the LOP devices. Further, the HELP substrates can serve as an inexpensive storage medium for test fluids, reagents and/or reaction products in the form of arrays of drops, which can then be transported to the centralized testing centers for detailed quantitative analysis after initial semi-quantitative on-chip analysis.

In an exemplary embodiment, use of commercially available phaser printing technology patterns superhydrophobic paper substrates with high-hysteresis ink patterns (dots and lines). By tuning the shape and size of the ink patterns, the drag-adhesion and extensional-adhesion of liquid drops to the substrate can be controlled. Experimental results for the adhesive forces of water drops on these patterned substrates are in good agreement with classical models for drag-adhesion (Furmidge equation) and extensional-adhesion (modified Dupré equation) over a wide range of pattern sizes and drop volumes.

The fundamental knowledge of the dependence of adhesive forces on pattern parameters and the resulting control over drop mobility are then used to design substrates for four basic functionalities that are relevant for lab-on-paper (LOP) applications: drop storage, drop transfer, drop mixing and sampling.

Conventional LOP devices depend on the capillary forces inside the paper to enable the transfer and mixing of test fluids. Hence, this approach rules out the possibility to extract multiple samples of the reaction products for various analyses. With the present substrates, the required unit operations are obtained by merely manipulating the liquid drops on top of the substrate by tuning adhesive forces.

Another advantage of the HELP substrates over existing LOP devices is the ability to store liquid drops after initial, qualitative on-chip analysis for further testing with specialized methods at centralized testing centers, which are relevant for bioanalytical applications in resource-limited settings.

The present substrates can also be used as a disposable storage medium in conjunction with high-throughput screening and potentially replace well plate technology.

The simplicity of the present patterning techniques using commercially available desk top printing technology and standard word processing software provides extreme flexibility in substrate design. End-users can easily program their own substrates according to specific needs, using the design rules disclosed herein, which represents the first step towards creating successful LOP devices. The present invention can utilize custom printing ink formulations to enhance compatibility with various test fluids and facilitate deposition of reagent species.

In another exemplary embodiment, paper substrates a placed inside a plasma reastor to undergo a two step process (oxygen etching and fluorocarbon (pentafluoroethane) film deposition to obtain superhydrophobicity "roll off". Patterns are designed (for example, on a computer running Microsoft® Word), the patterns including one or more of dots and lines. The "roll-off" superhydrophobic paper substrates are then fed into a printer in communication with the computer, and the patterns printed on the paper substrates in, for example, blank ink. The advancing contact angle of the blank ink is lower than the advancing angle of the "roll-off" superhydrophobic paper substrates. Thus, liquid drops, for example, water droplets, will have more affinity to the ink film than the "roll-off" superhydrophobic paper. Using this difference in the surface free energy provides beneficial operational control of water droplets, including the ability to register, confine, transfer and mix water droplets.

In another exemplary embodiment, the present invention comprises a method of processing a substrate to create surface regions of variable adhesive force thereon, comprising providing a substrate with a surface, processing the surface to form "roll-off" regions having a contact angle greater than approximately 150°, and contact angle hysteresis less than approximately 10°, and processing the surface to form "sticky" regions having a contact angle greater than approximately 140°, and contact angle hysteresis greater than approximately 10°.

In exemplary embodiments, the processing steps each comprise solvent-free processing, and/or the substrate is a paper substrate.

The "roll-off" regions can have a contact angle greater than approximately 165°, and contact angle hysteresis less than approximately 4°. The "sticky" regions can have a contact angle greater than approximately 144°, and contact angle hysteresis greater than approximately 75°.

In another exemplary embodiment, the "roll-off" regions have a contact angle in the range of approximately 166.7°±0.9°, and contact angle hysteresis in the range of approximately 3.4°±0.1°, and the "sticky" regions have a contact angle in the range of approximately 144.8°±5.7°, and contact angle hysteresis in the range of approximately 79.1°±15.8°.

The surface of the substrate can have crystalline and amorphous regions in a first ratio of crystalline-to-amorphous regions.

The steps of processing the surface can comprise selective etching of at least a portion of the amorphous regions of the surface. The steps of processing of the surface can further comprise coating at least a portion of the etched surface with a fluorocarbon film. The selective etching of at least a portion of the amorphous regions of the surface can provide a second ratio of crystalline-to-amorphous regions, wherein the second ratio is greater than the first ratio.

The selective etching of at least a portion of the amorphous regions of the surface can comprise domain-selective etching of at least a portion of the amorphous regions via a plasma treatment.

The steps of processing the surface can further comprise varying the plasma treatment in order to provide the roll-off and sticky regions.

The steps of processing the surface can comprise domain-selective etching of amorphous portions of the surface in an oxygen plasma and subsequently coating at least portions of the etched surface with a thin fluorocarbon film deposited via plasma-enhanced chemical vapor deposition using pentafluoroethane (PFE) as a precursor.

In another exemplary embodiment, the present invention comprises a method of processing paper to create surface regions of variable adhesive force thereon, comprising providing paper with a surface, processing the paper surface to form "roll-off" regions having a contact angle greater than approximately 150°, and contact angle hysteresis less than approximately 10°, and processing the paper surface to form "sticky" regions having a contact angle greater than approximately 140°, and contact angle hysteresis greater than approximately 10°. Preferably, the processing steps each comprise solvent-free processing.

In another exemplary embodiment, the present invention comprises a method of patterning a superhydrophobic surface to control the operation of a drop thereon, comprising providing a substrate with a surface, processing the surface to form "roll-off" regions having a contact angle greater than approximately 150°, and contact angle hysteresis less than approximately 10°, and patterning the surface to form "sticky" regions having a contact angle greater than approximately 140°, and contact angle hysteresis greater than approximately 10° using one or more ink patterns to provide regions on the superhydrophobic surface with anisotropic drop mobility.

The method can further comprise providing directionality by imposing geometrical constraints on the movement of a three phase contact line between drop, superhydrophobic surface and air through the shape of the one or more ink patterns.

The method can further comprise tuning a sliding angle of the drop on the superhydrophobic surface by creating chemical heterogeneity via the one or more ink patterns.

The one or more ink patterns can comprise, among other shapes, dots and lines.

In another exemplary embodiment, the present invention comprises a solvent-free, vapor phase, plasma processing "external sizing" method for controlling the adhesion forces on a superhydrophobic surface, preferably a cellulosic surface. The method can further comprise tuning the adhesion forces. Tuning the adhesion forces can comprise controlling the topography of the surface, preferably, a cellulosic surface. Controlling the topography of the surface can comprises plasma-enhanced etching regions of the surface. In another embodiment, controlling the topography of the surface comprises inkjetting regions of the surface. In another embodiment, controlling the topography of the surface comprises manipulating cellulosic type of a cellulosic surface.

In another exemplary embodiment, the present invention comprises a microfluidic device comprising a paper substrate, at least one region of a superhydrophobic surface on the paper substrate having a contact angle>150°, and contact angle hysteresis<10°, and at least one region of a superhydrophobic surface on the paper substrate having a contact angle>140°, and contact angle hysteresis<10°, wherein the device is a two-dimensional lab-on-paper device.

The at least one region of a superhydrophobic surface having a contact angle>150°, and contact angle hysteresis<10° can comprise ink. The microfluidic device can further comprise at least one liquid droplet. The at least one liquid droplet preferably adheres to the paper substrate at the at least one region having a surface contact angle>150°, and contact angle hysteresis<10°, rather than absorbing into the paper substrate, such that the at least one liquid droplet remains accessible for control by a control means of an operation of the at least one liquid droplet.

An operation of the least one liquid droplet can comprise one or more of registering at least one liquid droplet in a desired location on the paper substrate, confining at least one liquid droplet in a desired location on the paper substrate, transferring at least one liquid droplet from a first location to a second location on the paper substrate, wherein no liquid droplets are located at the second location prior to transfer, and transferring at least one liquid droplet from a first location to a second location on the paper substrate, wherein at least one liquid droplet is located at the second location prior to transfer.

These and other objects, features and advantages of the present invention will become more apparent upon reading the following specification in conjunction with the accompanying drawing figures.

BRIEF DESCRIPTION OF THE DRAWINGS

FIG. 1a shows water droplets on a wood surface treated for extreme water-repellant superhydrophobicity. FIG. 1b shows a water droplet on the leaf of the Asiatic crop plant absorbing dirt particles as it rolls.

DETAILED DESCRIPTION OF THE INVENTION

Figures 1A, 1B:
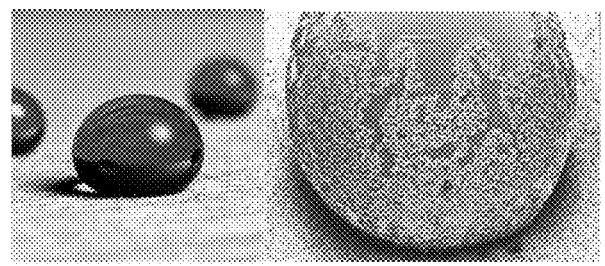
FIGS. 1a and 1b illustrates examples of the Lotus Effect.

To facilitate an understanding of the principles and features of the various embodiments of the invention, various illustrative embodiments are explained below. Although exemplary embodiments of the invention are explained in detail, it is to be understood that other embodiments are contemplated. Accordingly, it is not intended that the invention is limited in its scope to the details of construction and arrangement of components set forth in the following description or illustrated in the drawings. The invention is capable of other embodiments and of being practiced or carried out in various ways. Also, in describing the exemplary embodiments, specific terminology will be resorted to for the sake of clarity.

It must also be noted that, as used in the specification and the appended claims, the singular forms "a," "an" and "the" include plural references unless the context clearly dictates otherwise. For example, reference to a component is intended also to include composition of a plurality of components. References to a composition containing "a" constituent is intended to include other constituents in addition to the one named.

Also, in describing the exemplary embodiments, terminology will be resorted to for the sake of clarity. It is intended that each term contemplates its broadest meaning as understood by those skilled in the art and includes all technical equivalents which operate in a similar manner to accomplish a similar purpose.

Ranges may be expressed herein as from "about" or "approximately" one particular value and/or to "about" or "approximately" another particular value. When such a range is expressed, other exemplary embodiments include from the one particular value and/or to the other particular value.

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

It is also to be understood that the mention of one or more method steps does not preclude the presence of additional method steps or intervening method steps between those steps expressly identified. Similarly, it is also to be understood that the mention of one or more components in a composition does not preclude the presence of additional components than those expressly identified.

The materials described as making up the various elements of the invention are intended to be illustrative and not restrictive. Many suitable materials that would perform the same or a similar function as the materials described herein are intended to be embraced within the scope of the invention. Such other materials not described herein can include, but are not limited to, for example, materials that are developed after the time of the development of the invention.

Metrics for Surface Wetting and Particle Adhesion on Surfaces

The wetting of a solid with water, with air as the surrounding medium, depends on the relation between the interfacial tensions water/air, water/solid and solid/air. The ratio between these tensions determines the contact angle of a water droplet on a given surface, and is described by Young's equation (Equation 2). If a droplet is applied to a solid surface, it will wet the surface to a certain degree. At equilibrium, the energy of the system is minimized, which can be described by the Young's Equation:

$$\cos\theta = \frac{\gamma_{SV} - \gamma_{SL}}{\gamma_{LV}} \qquad \text{Equation 2}$$

where contact angle can also be considered in terms of the thermodynamics of the materials involved. This analysis involves the interfacial free energies between the three phases where $\gamma_{SL}$, $\gamma_{SV}$, and $\gamma_{LV}$ are the interfacial free energy per unit area of the solid-liquid (SL), solid-vapor (SV), and liquid-vapor (LV) interfaces, respectively. $\theta$ is the contact angle for a smooth surface.

Young's Equation 2 can only be applied to a flat, smooth surface, yet such a surface rarely existing for solids. As previously discussed, when a water drop is placed on a lotus plant surface, the air entrapped in the nanosurface structures prevents the total wetting of the surface, and only a small part of the surface, such as the tip of the nanostructures, can contact with the water drop. Air is enclosed between the wax crystalline microfibrils, forming a composite surface. This enlarges the water/air interface while the solid/water interface is minimized. Therefore, the water gains very little energy through adsorption to compensate for any enlargement of its surface. In this situation, spreading does not occur, the water forms a spherical droplet, and the contact angle of the droplet depends almost entirely on the surface tension of the water.

As previously discussed, the contact angle at a heterogeneous surface, and thus the one that is measured in practice can be described by Cassie's equation, Equation 1, where $f_1$ is the remaining area fraction of the liquid-solid interface, and r is the Wenzel roughness ratio (or ratio of the real surface to the projected surface) of the wet area. Due to the different growing/treatment mechanism, the $f_1$ and r can be very different for the Lotus Effect surfaces, leading to difference in water contact angle even if the surface chemistry is similar.

Besides the water contact angle, the hysteresis should also be considered in determining the surface hydrophobicity. On an inclined surface, the sliding angle and driving force needed to start a drop moving over a solid surface can be described via Equations 3 and 4, respectively:

$$\sin\alpha = \frac{\gamma_{LV}(\cos\theta_R - \cos\theta_A)w}{mg} \qquad \text{Equation 3}$$

$$F = \gamma_{LV}(\cos\theta_R - \cos\theta_A) \qquad \text{Equation 4}$$

In Equation 3, $\alpha$ is the sliding angle, m is the weight of the water droplet, w is the width of the droplet, $\gamma_{LV}$ is the surface tension of the liquid, and the $\theta_A$ and $\theta_R$ are the advancing and retreating contact angles, respectively. In Equation 4, F is the critical line force per unit length of the drop perimeter. These equations indicate how the difference between the contact angles on a sloping surface (the hysteresis) affect the water repellence (hydrophobicity).

Figure 2:
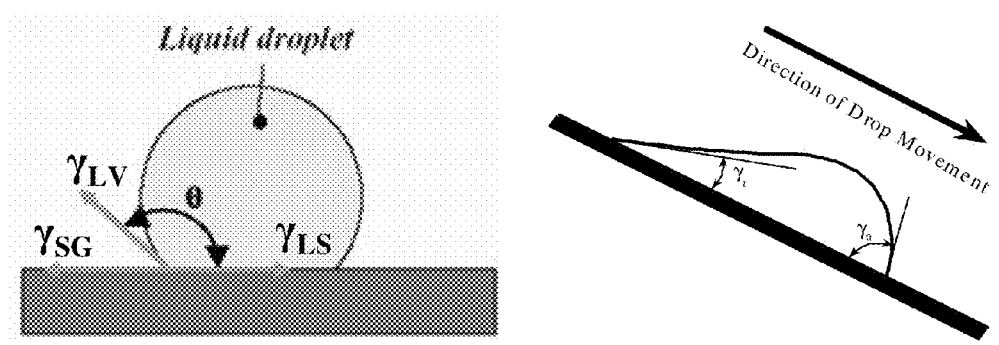
FIG. 2 is a schematic representation of contact angle and hysteresis.

FIG. 2 is a schematic representation of contact angle and hysteresis. Compared with the superhydrophobicity of the Lotus Effect, the mechanism of self-cleaning is seldom studied. In fact, the self-cleaning can be achieved if two conditions can be met:

(1) The surface is superhydrophobic so that water drops have very large contact angle and small sliding angle; and (2) The adhesion between the water drop and dust particles is greater than the adhesion between the surface and dust particles.

Adhesion of two components, such as adhesion of dust or dirt to a surface, is generally the result of surface-energy-related parameters representing the interaction of the two surfaces which are in contact. In general, the two contacted components attempt to reduce their free surface energy.

Strong adhesion is characterized by a large reduction in free surface energy of two adhered surfaces. On the other hand, if the reduction in surface free energy between two components is intrinsically very low, it can generally be assumed that there will only be weak adhesion between the two components. Thus, the relative reduction in free surface energy characterizes the strength of adhesion. And it was described by the Laplace-Dupré equation with work of adhesion ($w_a$)

$$w_a = \gamma(1 + \cos\theta) \quad \text{Equation 5}$$

where y is the surface tension of liquid that is in contact with the surface and θ is the Young's contact angle.

Usually dust particles include materials having higher surface energies than the surface materials, they are generally larger than the surface microstructure, and they just contact with the tips of these microstructures. This reduced contact area minimizes the adhesion between the lotus leaf surface and dust particles, so the particles can be picked up and removed from the leaf surface by the water droplet, which is contacting the whole area of the particle surface. Therefore, it is likely that hydrophobic particles are less likely be removed by water droplets than hydrophilic dust particles on a lotus leaf, and small particles, which have a size close to or even smaller than the microstructures, possibly will be pinched in the microstructures, instead of being removed by water droplet.

In an exemplary embodiment, handsheets were used as model paper substrates and were fabricated following TAPPI-standardized protocol T205 sp-02, using southern hardwood kraft (Alabama River Pulp Co.) and southern softwood kraft (North Carolina International Paper). Handsheets were placed inside a 13.56 MHz parallel plate plasma reactor to undergo a two step process (oxygen etching for 60 minutes to generate roughness and fluorocarbon (pentafluoroethane monomer) film deposition for one minute to establish surface hydrophobicity) that results in "roll-off" superhydrophobicity.

The patterns were designed using standard word processing software (Microsoft® Word 2007). Two types of simple patterns were used: dots and lines. The size of the dots and lines were varied using the font size in "pt"-units, as provided by Microsoft® Word 2007. The "roll-off" superhydrophobic handsheets were pasted on sheets of regular copy paper using Scotch® tape and fed through a Xerox® Phaser 8500n printer to print the patterns designed in the word processing software onto the superhydrophobic handsheet with black phaser ink. Brightfield microscopy images of the printed substrates (Leica microscope DM4500 B) were used to determine the conversion factor of the patterns from pt-units to µm; images were analyzed using Image J software. For dots, the conversion factor for the dot diameter was found to be 118.5 µm/pt; the conversion factor for line width was 404.9 µm/pt.

Water contact angle measurements were obtained with a Rame-Hart contact angle goniometer (model 100, Netcong, N.J.). Advancing and receding contact angles were measured by placing a drop of known volume on the substrate, and dragging the paper substrate left to right with respect to the drop.

In comparison with traditional methods that increase and decrease the drop size at a fixed position, the drag method probes a larger substrate area and yield better statistically averaged CA values, which is particularly important for inherently heterogeneous substrates like paper. Values of the advancing and receding CAs of non-patterned SH paper (after passage through the printer) are $\theta_{ASH}=165\pm2°$ and $\theta_{RSH}=135.3\pm2.9°$; for a substrate with full coverage of the ink film, $\theta_{A1}=113.8\pm2.7°$ and $\theta_{R1}=84.7\pm2°$.

The substrates were mounted on a flat surface attached to a rotating optical stage. The plate was tilted gradually until the drop rolled-off. The angle (in degrees) at which the drop started to slide was defined as the critical sliding angle.

The drop was placed on a horizontally placed paper substrate which had the "from" pattern (dot). Another substrate having the "to" pattern (line or dot) was then inverted and manually aligned to the drop, to obtain a configuration in which the drop touched the ink patterns on both substrates, which were placed parallel to each other. Then the "to" substrate was carefully lifted in a direction perpendicular to the "from" substrate and the resulting drop dynamics was recorded.

Adhesion on Patterned Paper

Sliding Drops on Sticky Islands

In the middle of the 20th century, four research groups independently reported that for a drop sliding on a homogeneous surface, the ratio of the force exerted on the drop (F) to the width of the drop perpendicular to the direction of sliding ($W_{drop}$) is constant:

$$\frac{F}{W_{drop}} = \frac{\rho V_g \sin\alpha}{W_{drop}} = K_1 \quad \text{Equation 6}$$

where ρ is the density of the liquid drop, V is the volume of the drop, g is the acceleration due to gravity, and α is the critical sliding angle. The constant $K_1$ was then related to the work functions associated with wetting ($\gamma_{LV}(1+\cos\theta_A)$) and dewetting ($\gamma_{LV}(1+\cos\theta_R)$) of the substrate by the drop:

$$\frac{\rho V_g \sin\alpha}{W_{drop}} = \gamma_{LV}(\cos\theta_R - \cos\theta_A) \quad \text{Equation 7}$$

where $\gamma_{LV}$ is the surface tension of the liquid, and $\theta_A$ and $\theta_R$ are the advancing and receding contact angles of the drop on the surface. This semi-empirical equation, hypothesized by Bikerman in 1950 and derived by Kawasaki in 1960, is popularly known as the Furmidge equation, in reference to the researcher who reiterated it in 1962. This equation is based on a force balance calculation on the receding and advancing edges of a two-dimensional drop sliding on an inclined surface.

For a three-dimensional drop, the contact angle varies continuously along the three-phase contact line, which complicates the mathematical analysis. Currently, some disagreement exists in the literature as to whether the local contact angles at the advancing and receding edge of the sliding drop are equal to the experimentally measured maximum ($\theta_A$) and minimum ($\theta_R$) contact angles. In spite of this ambiguity, it has been demonstrated that the Furmidge equation is a good empirical approximation for three-dimensional sliding drops and the Furmidge equation is used by most researchers.

After rearranging Equation 7 we obtain:

$$\frac{V \sin\alpha}{W_{drop}} = \frac{\gamma_{LV}(\cos\theta_R - \cos\theta_A)}{\rho g} \quad \text{Equation 8}$$

For a specific liquid-surface combination, the right hand side of Equation 8 is constant. On homogeneous substrates, the volume (V) and width ($W_{drop}$) of a drop are typically connected via simple geometrical relations, so that each drop size corresponds to a unique sliding angle $\alpha$. In the present invention, we aim to disrupt this one-to-one correspondence with the objective to independently control the critical sliding angle ($\alpha$) and the drop volume (V). Equation 8 suggests one possible route to achieve this: by making the drop width ($W_{drop}$) independent of the drop volume (V).

Figure 3:
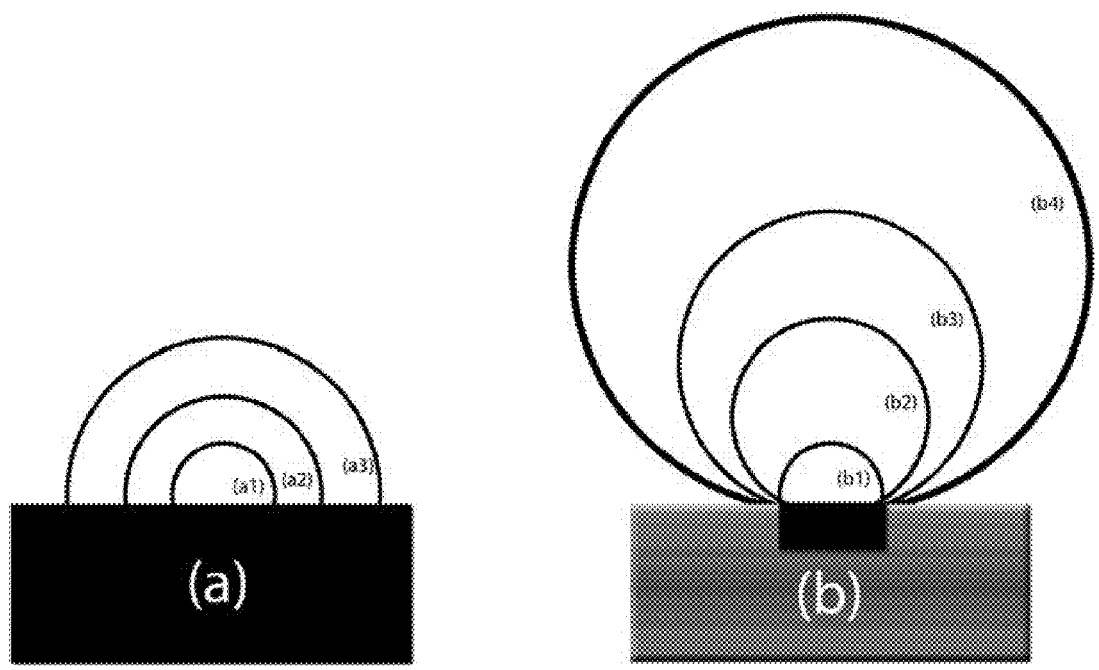
FIG. 3 is another schematic of side view profiles for various drop volumes 3(a) on a homogenous hydrophobic (CA≈90°) surface and 3(b) on a superhydrophobic (CA>150°) surface with hydrophobic (CA≈90°) pattern.

For simplicity, we will assume that the liquid in the following explanation is water. FIG. 3a shows a schematic of the side view of drops with various volumes dispensed on a homogeneous hydrophobic surface (advancing contact angle≈90°). When the drop volume increases, the width of the drop increases as well in order to maintain a constant contact angle on the substrate.

Next, consider the patterned substrate shown in FIG. 3b, where a hydrophobic island (advancing contact angle≈90° same as in FIG. 3a) is surrounded by a superhydrophobic surface (advancing contact angle>150°), which is extremely water repellant. In this case, when more liquid is added to the drop, it does not expand its contact line periphery onto the superhydrophobic substrate until the advancing contact angle of the surrounding superhydrophobic substrate is reached (>150°).

As a result, the drop width initially remains constant, while the contact angle changes: the width of the contact area between drop and substrate ($W_{drop}$) is equal to the size of the sticky island and independent of the volume (V). Only for sufficiently large drops (b4 in FIG. 3b), when the advancing contact angle of the surrounding superhydrophobic substrate is reached, will the base of the drop expand beyond the sticky island.

Figure 4:
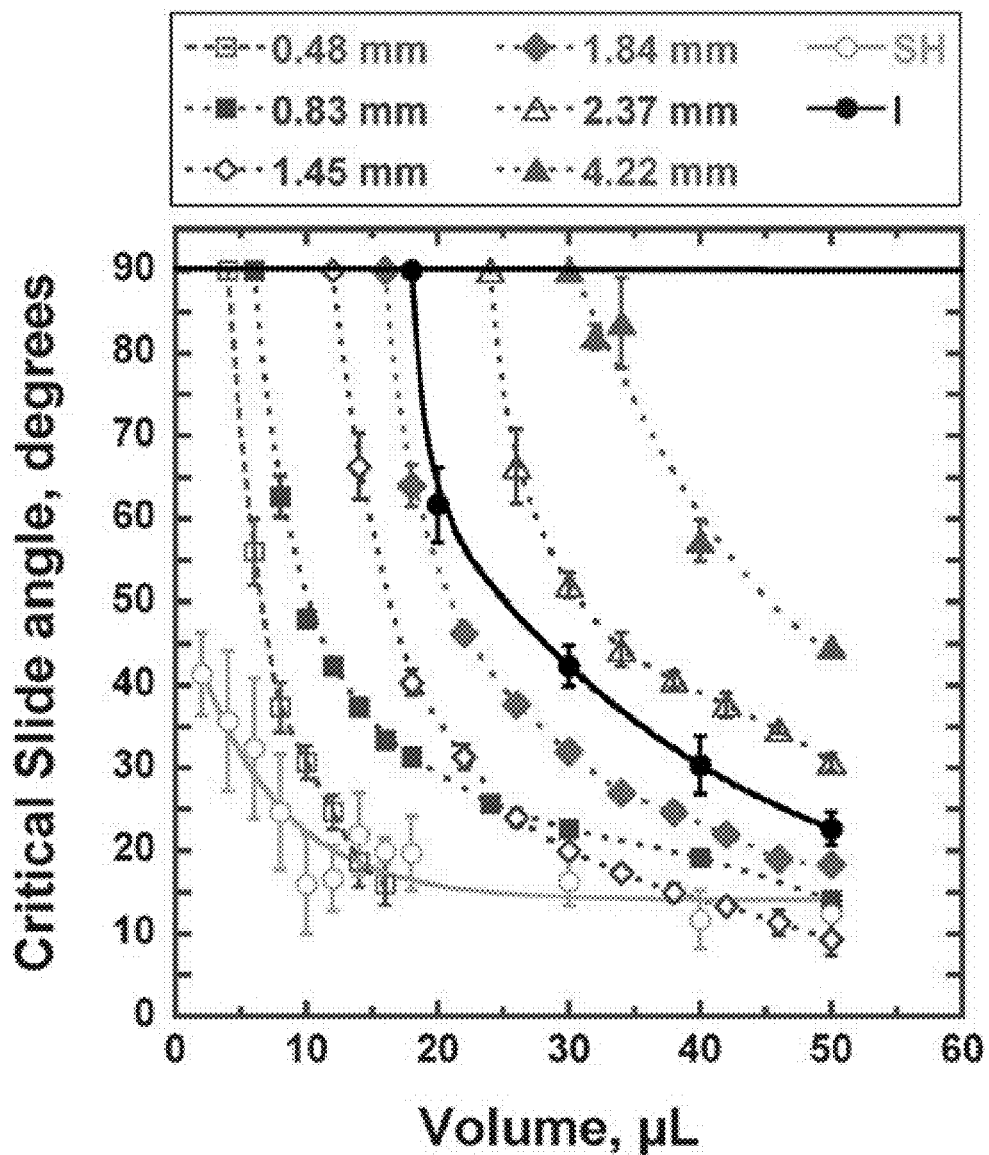
FIG. 4 is a graph of critical slide angle versus drop volumes on patterned substrates (for various dot sizes) and control substrates (SH and I); curves are to guide the eye.

With such patterned substrates, the critical sliding angle ($\alpha$) at constant drop volume (V) can be manipulated by changing the dimensions of the sticky island (Equation 8). We experimentally obtained patterned substrate as follows: "roll-off" superhydrophobicity was first achieved on the paper substrates using plasma etching and deposition. The hydrophobic island on the superhydrophobic surface was then obtained by printing "•" (from the symbol menu in Microsoft® Word 2007; designated "dots" in the remainder of this manuscript) using a commercially available phaser printer (Xerox 8500n) and standard black ink. The difference in advancing contact angle between superhydrophobic paper (165.1±2°) and homogeneous full-coverage films of black phaser ink (113.8±2.7°) is sufficient to create the scenario depicted in FIG. 3b. Our superhydrophobic substrate was robust enough that the bending and pressing of the printing process did not affect its advancing CA. FIG. 4 shows the critical sliding angle (angle at which the drop started to slide) versus drop volume for different dot sizes along with the sliding angles of two homogeneous control substrates (blank superhydrophobic paper after passage through the printer (SH) and a full coverage ink film printed on the superhydrophobic paper surface (I)).

Data points on the line that marks the critical slide angle of 90° represent the largest drop that did not slide from vertical substrates. Drop behavior on the control substrates (SH and I) was in good agreement with predictions from a modified Furmidge equation. As expected, for each substrate, the critical slide angle decreases monotonically with increasing drop volume (within experimental error). When comparing the results for patterned substrates with the homogeneous control substrates, it is evident from FIG. 4 that at a constant drop volume (V), the critical slide angle ($\alpha$) increases with increasing dot width. Another interesting observation is that patterned surfaces with large dot sizes (e.g., 2.37 and 4.22 mm) require larger slide angles (i.e., surfaces are more sticky) than a homogenous ink substrate.

Since a continuous ink film essentially is a dot with infinite width, one might have expected that ($\alpha$) for the ink film would be higher than for all printed dots. However, this apparent anomaly can be explained using the Furmidge equation. For a drop to slide on a surface, it must deform so that the advancing and receding edge of the drop both reach the experimentally measured advancing and receding CA, respectively, for that substrate. If the drop slides from a printed dot, the advancing CA is set by the superhydrophobic paper, while the receding CA is that of the ink film.

In contrast, for homogeneous substrates both advancing and receding contact angles are for the same surface material. For experiments with the smaller dots (<2.37 mm) the initial CA of the drop after dispensing it onto the horizontal substrate was essentially equal to the advancing CA of the superhydrophobic paper surface (similar to configurations b3 or b4 in FIG. 3b), because the drops are large relative to the dot. For the bigger dots, however, the initial CA was closer to the advancing angle on the ink film (configuration b1 in FIG. 3b).

Hence, on larger dots a drop must deform to a greater extent before its advancing CA reaches≈165.1±2°) and the drop starts to slide; thus resulting in higher critical sliding angles for the bigger dots. FIG. 4 demonstrates clearly that the critical sliding angle for drops of any size can be tuned by adjusting the size of the dots printed on the superhydrophobic surface. The data in FIG. 4 can be interpreted quantitatively by inspecting the Furmidge equation (Equation 7) more closely. This equation essentially represents a force balance:

$$F_E[=\rho V_g \sin\alpha]=F_P[=W_{drop}\gamma_{LV}(\cos\theta_R - \cos\theta_A)] \quad \text{Equation 9}$$

where $F_E$ is the experimentally measured gravitational force that is necessary to slide a drop on a surface and $F_P$ is the force that can be predicted theoretically from the values of $W_{drop}$, $\theta_A$ and $\theta_R$, which can be determined via independent experiments.

Based on FIG. 3b, the width of the drop ($W_{drop}$) should be equal to the width of the dot ($W_{dot}$) for a wide range of drop sizes. It was observed experimentally that for large drops, gravity deformed the drops sufficiently to extend the contact line of the drop beyond the dot width ($W_{dot}$) as shown in FIG. 3b. We denote this as the "outside" configuration (b4) and the corresponding predicted force as $F_{PO}$. Once the contact line of the drop extends beyond the ink periphery, the surface energy of the ink film no longer affects the size of the contact area, $W_{drop}$, or the contact angle $\theta_A$. Thus for the $F_{PO}$ configuration, these parameters are determined solely by the properties of the superhydrophobic paper and $W_{drop}$ can therefore be obtained independently by measuring the drop width on non-patterned superhydrophobic paper substrates as a function of drop volume.

The results from these experiments (data not shown) were used to calculate $W_{drop}$ for any drops for which $W_{drop} > W_{dot}$. When the substrate in this "outside" drop configuration is tilted, there are two contributions to the adhesion force $F_{PO}$: one from the part of drop in direct contact with the ink dot (advancing CA of paper substrate (SH) and receding CA of ink (I)) and another from the part of the drop only in contact with the superhydrophobic paper (both advancing and receding CA of SH). Assuming that these force contributions are additive, the predicted force $F_{PO}$ can then be modeled as:

$$F_{PO} = [W_{dot} \gamma_{LV}(\cos\theta_{R1} - \cos\theta_{A1})] + [(W_{drop} - W_{dot})\gamma_{LV}(\cos\theta_{RSH} - \cos\theta_{ASH})] \quad \text{Equation 10}$$

where $\theta_{ASH}$ is the advancing CA of SH paper, $\theta_{R1}$ and $\theta_{RSH}$ are the receding CAs of the ink film and SH paper, respectively. If, on the other hand, the drop is confined to the perimeter of the dot (configurations b1-3 in FIG. 3b), the force $F_{PP\ needed}$ to slide the drop depends only on a single length scale, the dot size ($W_{dot}$). For this configuration, the second term on the right hand side of Equation 10 disappears ($W_{dot} = W_{drop}$), resulting in:

$$F_{PP} = [W_{dot}\gamma_{LV}(\cos\theta_{R1} - \cos\theta_{ASH})] \quad \text{Equation 11}$$

The scenario for which $W_{drop} < W_{dot}$ was not encountered with the dot sizes and drop volumes in this study. For homogeneous control substrates (I and SH) there is no need to modify the original Furmidge equation (Equation 7), provided that the appropriate CA values are used to calculate the adhesion force ($F_I$ for ink film and $F_{SH}$ for SH paper).

Figure 5:
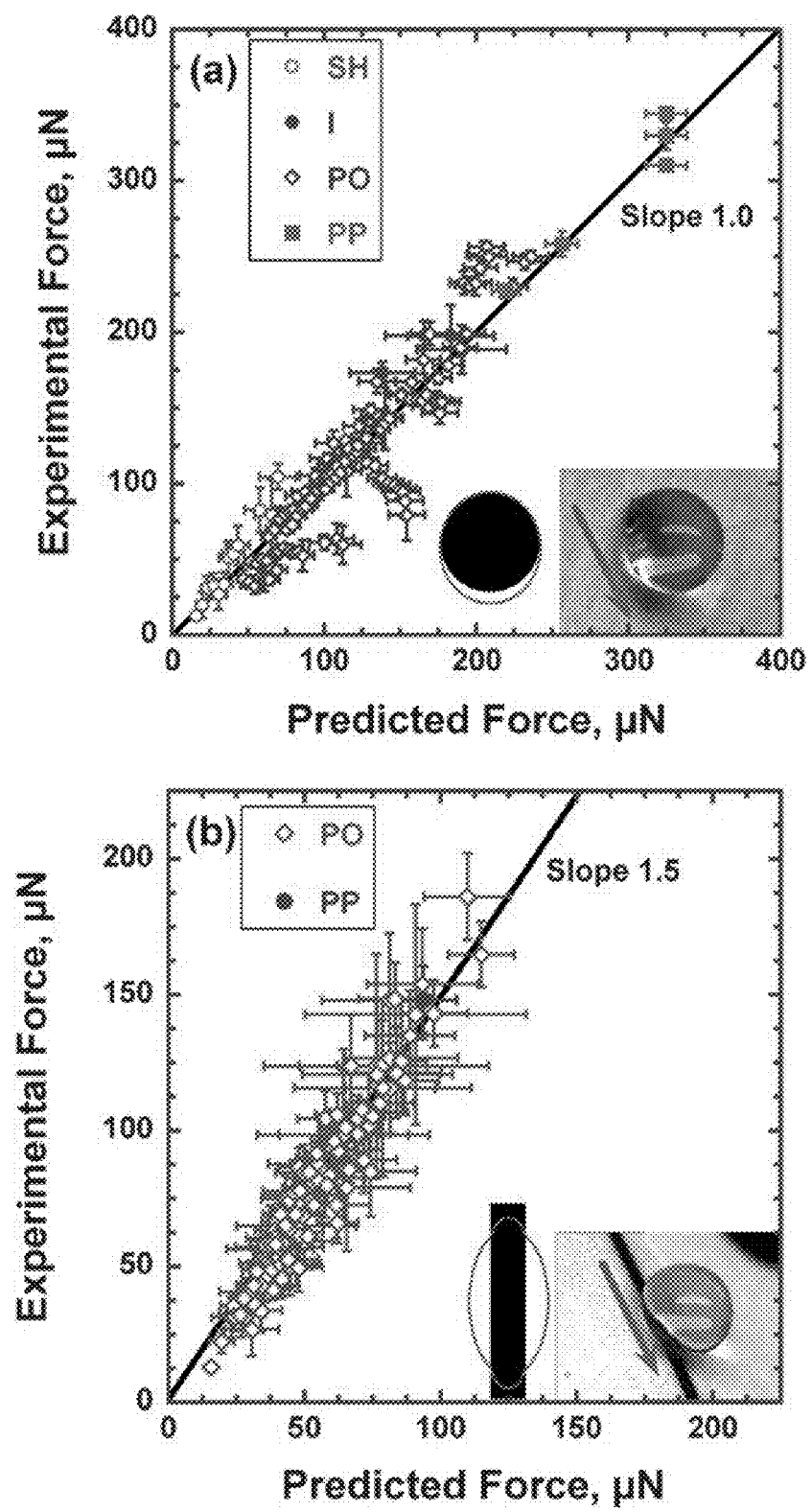
FIGS. 5(a) and 5(b) are graphs of experimental versus predicted drag-adhesion force for dots 5(a) and lines 5(b) for the following substrates: Superhydrophobic paper after printing a blank pattern (SH), ink film on a SH paper (I), configuration in which the contact line of the drop is outside the ink pattern's periphery (PO) and configuration in which the contact line of the drop is on the ink pattern's periphery (PP). (Insets: Schematic of contact line profile compared to the pattern geometry and photograph of a 4 μL drop just before sliding on a 0.83 mm dot 5(a) and a 0.3 mm line 5(b)).

FIG. 5a shows a plot of experimentally determined sliding force $F_E$ versus predicted values $F_{PO}/F_{PP}/F_I/F_{SH}$ for a range of drop volumes and dot diameters (0.36 to 4.22 mm, or 3 to 36 pt) including the data presented in FIG. 4. It is evident that the data correspond quantitatively to the predictions from the modified Furmidge equation, which is based on simple geometrical arguments and has no adjustable parameters. Our sliding angle measurements were performed manually, so that slight vibrations induced during the measurements could not be avoided. Also, the SH paper and ink film are both heterogeneous with respect to topography. We believe that the deviations from the model in FIG. 5a for some substrates are a result of these inevitable experimental errors.

We subsequently extended our experiments to a significantly more complicated ink pattern: lines. For these tests, lines were generated using Microsoft® Word 2007 and printed on superhydrophobic paper. We investigated the sliding behavior of drops along the printed lines for different line widths (0.10 to 2.83 mm or 0.25 to 7 pt). It must be noted that the motion of drops on line patterns is anisotropic (parallel versus perpendicular to the line). Our initial experiments focused entirely on drop sliding parallel to the lines. In this case, the Furmidge model for the adhesion force for drops that extend outside the line ($F_{PO}$) can be expressed as:

$$F_{PO} = [W_{line}\gamma_{LV}(\cos\theta_{R1} - \cos\theta_{A1})] + [(W_{drop} - W_{line})\gamma_{LV}(\cos\theta_{RSH} - \cos\theta_{ASH})] \quad \text{Equation 12}$$

where the only difference between Equations 10 and 12 is that the advancing CA in the first term of Equation 12 is now the advancing CA of the ink; as the drop slides along the line, the part of the drop that resides on the line always remains in contacts with the ink film. Similar to dots, if the drop is contained within the line, $W_{drop} = W_{line}$ and the second term of the equation vanishes so that:

$$F_{PP} = [W_{line}\gamma_{LV}(\cos\theta_{R1} - \cos\theta_{A1})] \quad \text{Equation 13}$$

FIG. 5b plots experimental sliding force versus predicted force ($F_{PO}$ and $F_{PP}$) for the line patterns. Although a quantitative correlation between model and experiments is obvious, one-to-one correspondence was not observed. The experimental forces always exceeded the model prediction and linear least-square regression yielded a simple correction factor of 1.5, as indicated by the line in FIG. 5b. Although we have no quantitative explanation for this correction factor, the inset of FIG. 5b clearly shows its qualitative origin: the complicated geometry of the contact line of a drop on a line. The fact that the correction factor is larger than unity can be interpreted as an enhancement of the length of the contact line, which can be attributed to the curvature of the contact line induced by the printed line (see inset in FIG. 5b).

Transfer of Drops between Substrates

The experiments and models in the previous section give excellent insight into the 'drag adhesion' of drops sliding on substrates patterned with ink dots and lines. This disclosure focuses on the force of adhesion that is observed when drops are pulled-off perpendicular to the patterned substrates. We refer to this kind of adhesion as 'extensional adhesion'. The objective of these experiments was to capitalize on differences in extensional adhesion between different patterned substrates to permit transfer of drops between substrates.

In 1896, Dupré rearranged Young's classical contact angle equation to describe the work of adhesion for a drop to detach from a surface:

$$W_{adh} = \gamma_{LV}(1 + \cos\theta) \quad \text{Equation 14}$$

where $\theta$ is the equilibrium CA of the liquid drop on the surface. At that time, the scientific community did not define maximum (advancing) and minimum (receding) CAs. When a drop detaches from a surface in a direction perpendicular to the plane of the surface, the contact line of the drop experiences a receding CA value rather than the equilibrium CA. As a result, the above equation must be adapted to:

$$W_{adh} = \gamma_{LV}(1 + \cos\theta_R) \quad \text{Equation 15}$$

This work of adhesion can be converted to the force of adhesion by multiplying the right hand side of the equation by a characteristic length scale, $L_{char}$:

$$F = L_{char}\gamma_{LV}(1 + \cos\theta_R) \quad \text{Equation 16}$$

In experiments, it is reasonable to assume that this length scale is proportional to the characteristic size of the ink pattern (dot diameter or line width). Hence, Equation 16 becomes:

$$F = (\alpha W)\gamma_{LV}(1 + \cos\theta_{R1}) \quad \text{Equation 17}$$

where $\alpha$ is the proportionally constant and $W$ is the width of the ink pattern. Therefore, it is expected that a drop positioned on a small ink island will experience a smaller force of adhesion than the same drop sitting on a relatively large ink island. This lead the inventors to determine whether this difference in adhesion force can be used to overcome gravity, and transfer a drop from a substrate with a smaller ink island to a substrate with a larger ink island. The resulting force balance between gravity on the drop and adhesive forces of the two substrates is:

$$\rho V g = \alpha_1 W_1 \gamma_{LV}(1 + \cos\theta_{R1}) - \alpha_2 W_2 \gamma_{LV}(1 + \cos\theta_{R1}) \quad \text{Equation 18}$$

where the subscripts 1 and 2 denote the large and small ink islands, respectively. By rearranging the above equation, one can predict the maximum volume of the drop that can be transferred between two substrates:

$$V_{predicted} = \frac{\alpha_1 W_1 \gamma_{LV}(1 + \cos\theta_{RI}) - \alpha_2 W_2 \gamma_{LV}(1 + \cos\theta_{RI})}{\rho g} \quad \text{Equation 19}$$

Figure 6:
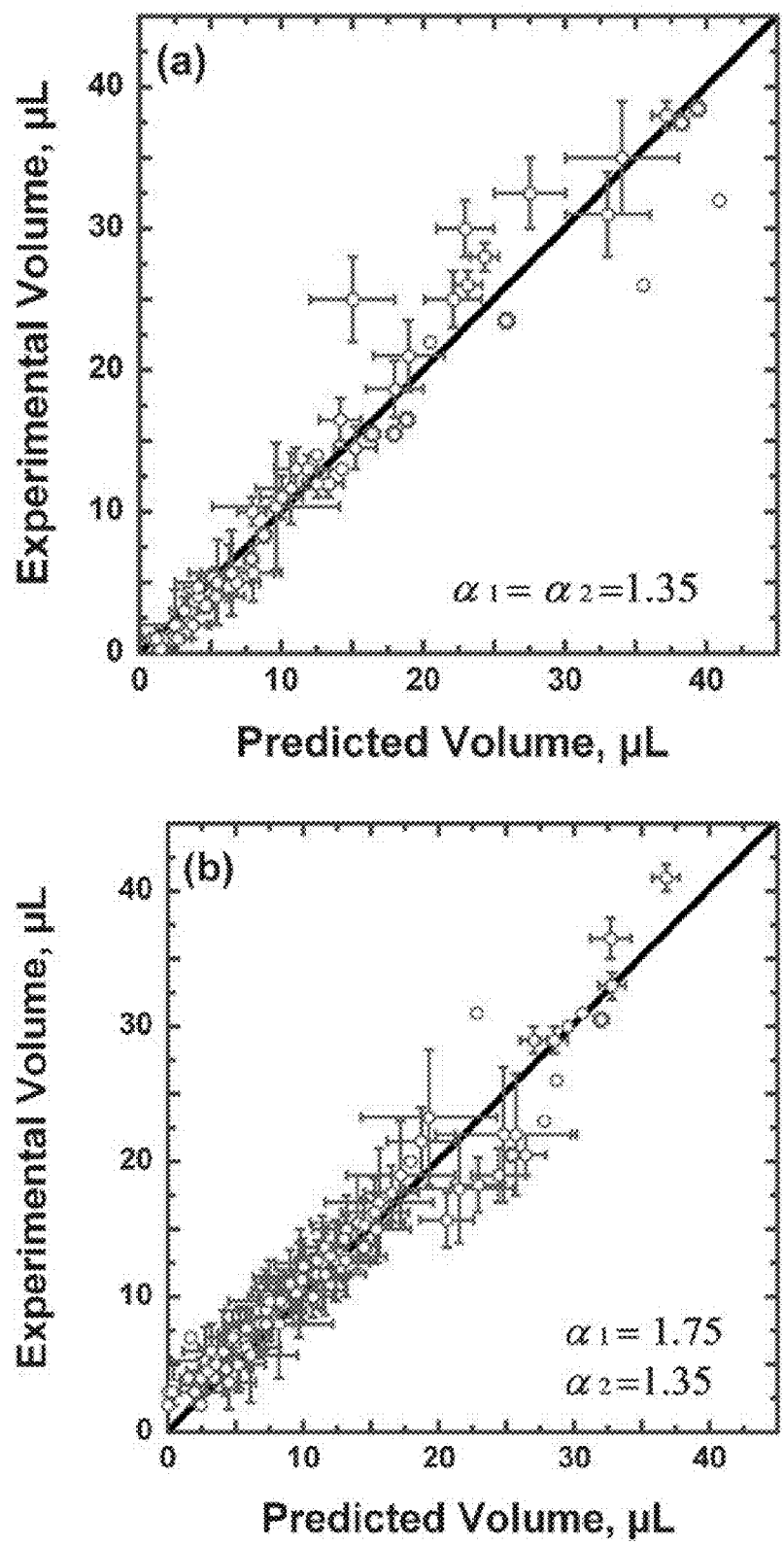
FIGS. 6(a) and 6(b) are graphs of experimental versus maximum drop pick-up volume for transfer from dot-to-dot 6(a) and dot-to-line 6(b); $\alpha_1$ and $\alpha_2$ are the fit parameters in Equation 19.

The model prediction was tested by determining the maximum drop volume that could be transferred (lifted) for a wide variety of dot-dot size combinations. FIG. 6a shows a plot of the experimental versus predicted pickup volumes (from Equation 19) for the various dot-dot configurations used in this study. A linear least-squares regression (data not shown) was performed to find the proportionality constants $\alpha_1$ and $\alpha_2$ (in Equation 19), and the values were found to be $\alpha_1 = \alpha_2 = 1.35$.

A closer look at the force equations for extensional-adhesion (Equation 19) and drag-adhesion (Equation 7) reveals that the force needed to overcome extensional-adhesion will always be greater than for drag-adhesion for a specific liquid-substrate combination. This can be explained by comparing Equation 7 and Equation 19:

$$F_{extensional\text{-}adhesion} \approx (1+\cos\theta_R) > F_{drag\text{-}adhesion} \approx (\cos\theta_R - \cos\theta_A) \quad \text{Equation 20}$$

To achieve equality between the adhesive forces, the advancing CA ($\theta_A$) would have to be 180°, which is not possible with the tested superhydrophobic substrates. Hence, the extensional-adhesion is always greater than the drag-adhesion for the present substrates. When the substrates are not parallel to each other during the drop transfer, a combination of drag and extensional adhesion may be experienced, and the force balance becomes more complex. The drop transfer experiments were performed manually without using tools to optimize alignment. In spite of this, a good correlation between experimental and predicted values supports this simple model hypothesis.

Further extending this model to the more complex line configurations was achieved by determining the transfer of drops from a dot to a line. This configuration was selected (dot-to-line) because of its applicability to the proposed LOP device that is discussed below. In this scenario, the width of the lines and dots were used as the characteristic length scales $W_1$ and $W_2$, respectively. The $\alpha_2$ value of 1.35 was used, as determined from dot-dot transfer experiments. The $\alpha_1$ value of 1.75 was obtained by linear least-squares regression as discussed previously. FIG. 6b shows the experimental versus the predicted pickup volume for the various dot-line configurations used herein.

In these studies, the differences in the surface energy between ink and superhydrophobic paper to control the adhesion forces exerted on the drop were taken advantage of. Two modes of adhesion exist for the drops, which were designated as 'extensional-adhesion' force and 'drag-adhesion' force, respectively, and these two adhesion forces can be tuned by varying the length scales of the ink patterns.

Functional Unit Operations with Patterned Substrates

It is shown that patterned superhydrophobic paper substrates can be used to control the mobility of liquid drops on these substrates, both parallel and perpendicular to the substrate. The underlying mechanism is that the ink patterns locally increase the contact angle hysteresis on a low hysteresis superhydrophobic surface. These patterned substrates are referred to as Hysteresis Enabled Lab-on-Paper (HELP) substrates. The fundamental wetting properties of these substrates can be used to engineer unit operations that can then be combined in lab-on-paper devices. The implementation of four basic functionalities are critical for any device based on droplet manipulation: storage, transfer, mixing and sampling. The complete list of possible functionalities is certainly longer, especially when more complex ink patterns and modifications in ink chemistry are considered.

Storage

The patterned paper substrates have a peculiar combination of two extreme wetting properties: minimal contact area between liquid and substrate due to high advancing contact angles and good adhesion due to hysteresis. It is believed that these properties make HELP substrates potential candidates to serve as storage media for arrays of microliter drops of test fluids and reagents. This type of storage is generally achieved with more expensive well plates that confine liquids in three-dimensional wells with larger interfacial contact areas.

Figure 7:
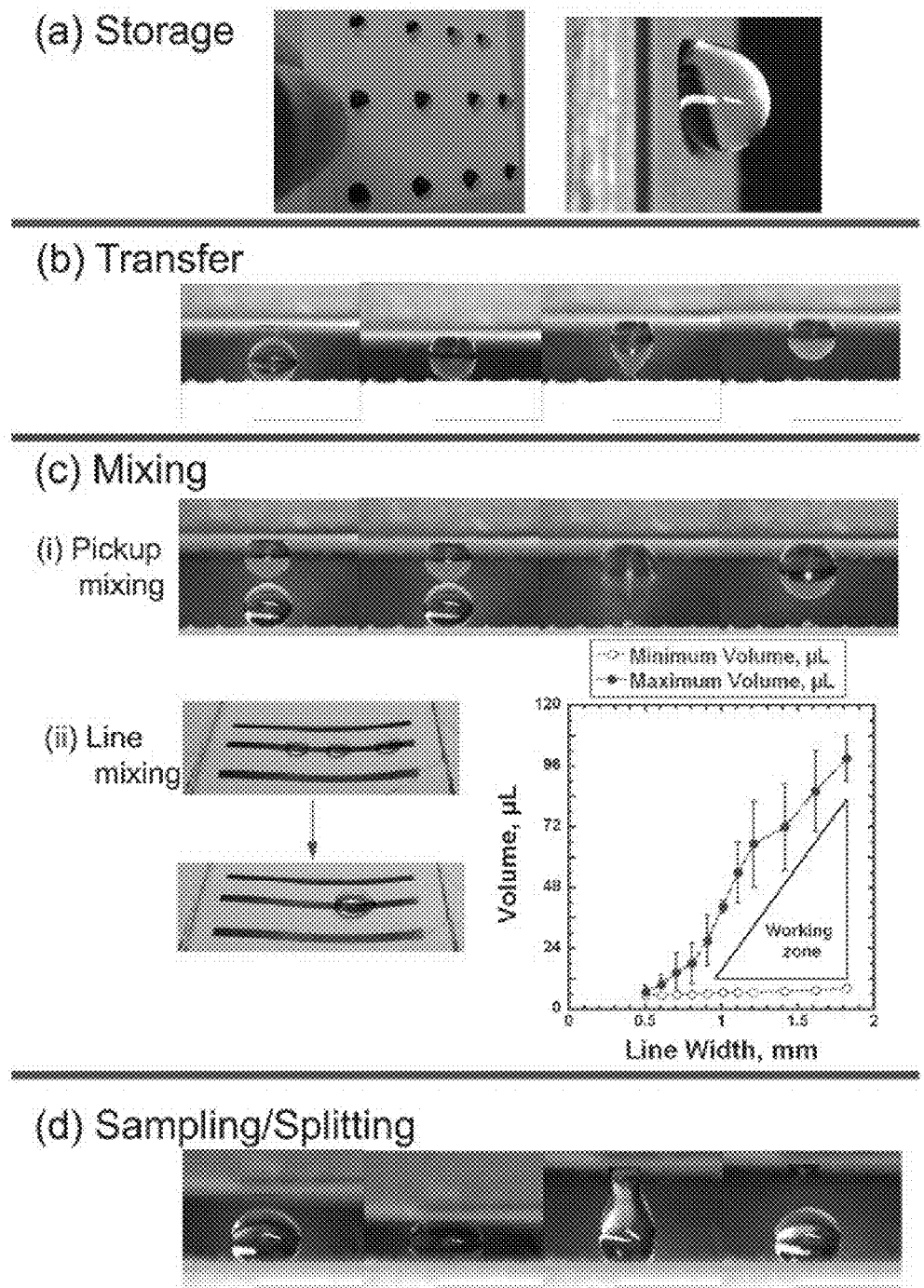
FIGS. 7(a), 7(b), 7(c) and 7(d) illustrate storage, transfer, mixing and sampling/splitting operations according to exemplary embodiments of the present invention, wherein FIG. 7(a) are photographs of an array of drops (food coloring was added to enhance contrast) and a high magnification image of a single drop stored on a vertical substrate; 7(b) is a series of snapshots of a drop being transferred between two substrates, 7(c) are photographs of merging and mixing: (i) via "pickup mixing" (two drops), (ii) "line mixing" (three drops) and a plot that shows the working zone of drop volumes suitable for line mixing and, 7(d) are photographs of drop splitting between two substrates.

It is believed that the present patterned substrates can provide an inexpensive replacement for current technologies for the storage of array of drops for high throughput screening. The photograph on the left in FIG. 7a shows an array of water drops (colored using food color) stored on a vertical substrate. The three rows had dot sizes of 1.84, 2.37 and 3.32 mm and drop volumes of 15, 20 and 25 µL, respectively. The photograph on the right in FIG. 7a shows a high magnification image of a 12 µL water drop stored on a vertically placed substrate with a 1.7 mm dot. In spite of the low interfacial contact area, the drop withstands a tilt of 90°.

Transfer

As disclosed above, the transfer of microliter drops between two patterned substrates with different pattern dimensions were investigated, and it was shown that the maximum drop volume that can be transferred between substrates can be predicted using the modified Young-Dupré equation. FIG. 7b shows a sequence of frames from a movie that captured the transfer of a 4 µL water drop from a 0.4 mm dot to a 1.45 mm dot. This functionality enables selective transfer of drops from an array by carefully tuning the size and location of dots on a pick-up substrate; the superhydrophobicity of the base paper will guarantee that no transfer will occur in non-patterned areas of the pick-up substrate.

Mixing

The patterned paper substrates can also be used to merge and mix liquid drops. Explored were two strategies for drop mixing, referred to as pickup mixing and line mixing. FIG. 7c(i) shows how two 4 µL water drops (attached to the "from" (0.4 mm) and "to" (1.45 mm) substrates, respectively) are merged into a single drop using pickup mixing. After the two drops are roughly aligned and the substrates are brought together, the drops touch and merge. The final position of the merged drop depends on the competing adhesive forces of the upper "from" and lower "to" dots. As demonstrated previously, the size of "from" and "to" substrates can be tailored to enable pickup mixing for a variety of drop volumes.

The second mixing strategy, line mixing (FIG. 7c(ii)), enables mixing of two or more drops on a line by taking advantage of the fact that the mobility of the drop on the line depends on the drop's configuration on the line. There are three basic configurations that are important for line mixing.

(1) If the drop is positioned on the line without touching the end points of the line, the force needed to induce sliding along the line is given by Equations 12 and 13, as discussed previously, and shown in FIG. 5b.

(2) When a drop slides and reaches the end of the line, its advancing edge contacts the SH paper and hence $\theta_{A1}$ in Equations 12 and 13 must be replaced by $\theta_{ASH}$, which results in a significantly increased value of $F_{PO}$ and $F_{PP}$. Therefore, the sliding angle for a drop at the end of a line is always greater than at other positions.

(3) The mobility of a drop perpendicular to the line is much lower than along the line for the same reasons, which restricts drop movement to the line. These considerations concerning drop mobility on a line can be used to design a mixing strategy for drops positioned on the line, by simply tilting the line back and forth drops can be moved towards the line edge, where they become pinned, so that trailing drops can merge. Subsequent rocking of the substrate then moves the merged drop back and forth along the line, which induces internal mixing of the drop. FIG. 7c(ii) shows pictures of the merging and mixing of three 20 μL drops into a single 60 μL drop via this line mixing strategy.

There are some limitations to this type of mixing. When drops start sliding, they initially accelerate along the line; if their momentum becomes too large, the adhesive force at the end of the line may be insufficient to ensure adherence to the line edge. Similarly, vibrations can provide energy for the drop to break away from the line. Both effects will limit the maximum drop size for line mixing, but it is beyond the scope to model these phenomena in detail herein.

Instead, the overall effect is explored by evaluating the reproducibility of drop size limits for line mixing. Three individuals with different levels of experience and skill sets performed line mixing experiments and independently determined the minimum and maximum drop volumes that could be mixed for different line widths. The plot in FIG. 7c(ii) shows the results of these tests; the 'working zone' drawn between the two curves denotes the drop volume range for mixing as a function of line width. It is important to point out that these experiments were performed with lines that were 3 cm long. According to experience with line mixing, longer lines expand the 'working zone' because of improved operator control over the drop position.

Sampling/Splitting

Similar to the transfer of drop between two substrates (shown in FIG. 7b), the patterned substrates can also be used to sample small volumes of liquid from a single drop. FIG. 7d shows the sampling of a small volume of liquid to a 1.45 mm dot from an 8 μL drop resting on another 1.45 mm dot. By using closely matched "from" and "to" dot sizes, patterned SH substrates can be used to collect small sample volumes of liquid from a single drop. This functionality is useful in LOP applications in which it is desirable to obtain multiple samples from individual drops for multiplex analysis.

Integrated Lab on Paper Concepts Based on HELP Substrates

Figure 8:
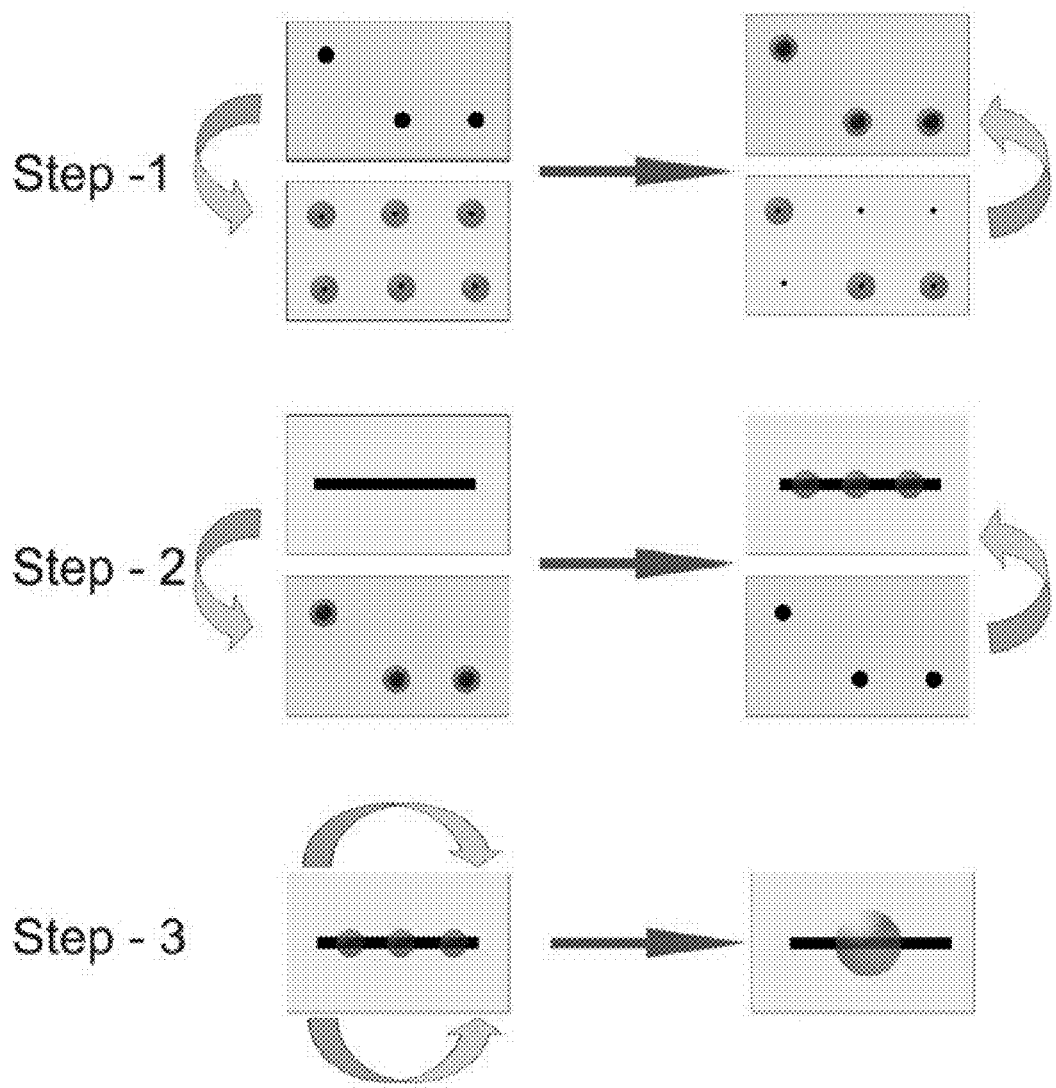
FIG. 8 is a schematic of an LOP according to an exemplary embodiment of the present invention that can be fabricated using exemplary HELP substrates of the present invention.

By using the functionalities described above, it is possible to confine microliter drops to specific locations on a storage substrate, selectively transfer (pick up) drops between substrates, combine/mix drops, and sample/split the products into multiple drops. These unit operations can be combined to create a simple lab-on-paper (LOP) device. FIG. 8 shows a schematic of such a LOP device that can be fabricated using the HELP substrates. As starting point, an array of drops is positioned on a substrate using a pattern of dots. In Step 1, selected drops are transferred to another substrate which has larger dots printed at specific locations. In Step 2, these selected drops are picked up by a third substrate with a line pattern. Finally, in Step 3, the three drops on the line are merged into a single drop and mixed via 'line mixing'. Thus, selected reactants can be picked up from an array of reactants and mixed to obtain the final product. This specific LOP configuration is an exemplary embodiment of other possible configurations that can be fabricated. The versatility of the printing technique provides the opportunity to design and create new LOP configurations at the end-user level.

Various embodiments of the present invention are further illustrated by the following non-limiting examples.

EXAMPLE 1

Fabrication of "Roll-off" and "Sticky" Superhydrophobic Cellulose Surfaces via Plasma Processing In this example, superhydrophobicity on cellulose paper was obtained by domain-selective etching of amorphous portions of the cellulose in an oxygen plasma and subsequently coating the etched surface with a thin fluorocarbon film deposited via plasma-enhanced chemical vapor deposition using pentafluoroethane (PFE) as a precursor. Variation of plasma treatment yielded two types of superhydrophobicity: "roll-off" (CA of 166.7°±0.9°; CA hysteresis of 3.4°±0.1°) and "sticky" (CA of 144.8°±5.7°; CA hysteresis of 79.1°±15.8°) near superhydrophobicity. The nanometer scale roughness obtained by delineating the internal roughness of each fiber and the micrometer scale roughness which is inherent to a cellulose paper surface are robust when compared to roughened structures created by traditional polymer grafting, nanoparticle deposition, or other artificial means.

The materials used for this example will be described below. First, the choice of substrate will be discussed. Three different substrates were employed: (1) Standard copy-grade paper (Office Depot; "Premium white copy paper"; brightness: about 104, weight: about 76 g/m$^2$), (2) handsheets, control paper substrates without filler particles or other additives, and (3) silicon wafers as well-defined model substrates. Handsheets were prepared using TAPPI standardized method T205 sp-02: dry sheets of soft and hard wood fibers (1:1 mass ratio) were soaked overnight, beaten to a pulp in a valley beater, and diluted to appropriate consistency; the pulp was poured into a mesh-bottom mold, and the water was allowed to drain under gravity to form a handsheet, which was then pressed between blotter paper sheets and further dried in a hot press.

Next, the plasma reactor reagents are described. PFE monomer gas (N4 grade, 99.99%) was obtained from DuPont (Wilmington, Del.). Argon carrier gas (Ultra High Purity, 99.99%) was purchased from Air Products and Chemicals, Inc. (Allentown, Pa.). Nitrogen (Ultra High Purity, 99.999%) and oxygen (Ultra Pure Carrier, 99.996%) were purchased from Airgas Inc. (Radnor, Pa.).

A 6 inch (in.) parallel plate plasma reactor for the plasma processing. The stainless steel bottom electrode was grounded and heated to about 110° C. using Omegalux CIR 2015 cartridge heaters (Omega Engineering Inc., Stamford, Conn.). The temperature at the bottom electrode was monitored using a type K thermocouple controlled by a Syskon RKC temperature controller (RKC Instrument Inc., South Bend, Ind.). The stainless steel top electrode of the reactor was connected to a HF-300 13.56 MHz, RF power supply (ENI Power Systems, Rochester, N.Y.). To minimize reflected power in the plasma reactor, a matching network (Heathkit SA-2060A, Heath Company, Benton Harbor, Mich.) was placed between the top electrode and the power supply. The reactor pressure was monitored and maintained using a pressure gauge (Varian Inc., Lexington, Mass.) and an Alcatel 2063C rotary vacuum pump (Alcatel, Annecy, France). Additional details of this reactor can be found in Vaswani et al., *Surf Coat. Techno.* 2005, 195, 121-129, which is incorporated herein in its entirety as if fully set forth below. The plasma process for surface modification of the substrates involved two steps: (1) reactive etching in an oxygen plasma and (2) fluorocarbon deposition.

The etching process will now be described. After placing a sample on the heated lower electrode, the reactor was evacuated to base pressure of about 20 mTorr and oxygen flow was initiated at a flow rate of about 6 standard cubic centimeters per minute (sccm). After the reactor reached a stable (steady state) pressure of about 100 mTorr, an RF power of about 150 W was applied to the top electrode for about 30 minutes (min). At the end of the plasma treatment, the oxygen flow was terminated and the reactor was again evacuated to the base pressure. The relatively low pressure and high power combination was somewhat arbitrarily selected with the aim to enhance the cellulose etch rate and promote domain selective etching. Etching proceeds by reaction of oxygen species (primarily O• and O*) with cellulose (P) to form water vapor, carbon monoxide (CO), and carbon dioxide ($CO_2$), thereby removing material from the surface according to the following reactions, shown as:

P+O*→P*+OH  Equation 21

P*+O•→P'O+CO+$CO_2$  Equation 22

A thin film of fluorocarbon was then deposited onto the substrates. The deposition gas mixture consisted of a precursor gas (PFE flowing at about 20 sccm) and a carrier gas (argon flowing at about 75 sccm). After the reactor reached a stable (steady state) pressure of about 1 Torr, an RF power of about 120 W was applied to the top electrode for about 2 min. Electron impact collisions with the precursor formed various $C_xF_yH_z$ moieties, which reacted primarily at the substrate surface to form an adherent cross-linked fluorocarbon film. At the end of the deposition, the plasma power was turned off and the reactor evacuated to the base pressure. Finally, the reactor was re-pressurized to atmospheric pressure by backfilling with $N_2$ gas, and the sample was removed from the reactor for surface characterization. Under these conditions, the thickness of the deposited fluorocarbon film on a silicon wafer, which can readily be measured via ellipsometry, was about 100 nm. For convenience, the process comprising Steps 1 (etching) and 2 (deposition) will be referred to as superhydrophobic ("SH")-treatment in this example. Control experiments, designated "SH-control-treatment", were performed in which the samples were processed similar to the SH-treatment, but without striking the plasma in the etching step (1). These experiments were designed to isolate the effect of processing conditions (oxygen exposure, exposure to vacuum, heating) from the actual etching. In addition to these control studies, some samples were only exposed to Step 2 (fluorocarbon deposition), eliminating Step 1 entirely. This third treatment was termed PFE-treatment.

The sample characterization techniques that were used will now be described. First, scanning electron microscope (SEM) measurements were obtained with a LEO scanning electron microscope (model 1530) operated at a pressure of about $1.0 \times 10^{-7}$ Torr at room temperature. The operation voltage was adjusted between about 5 and about 10 kV depending on the magnifications used to avoid damaging the paper samples. Since both the paper and PFE film are insulators, the substrates were sputter coated (EMS 350) with a thin film of gold (having a thickness of about 20 nm) prior to SEM measurements.

X-ray photoelectron spectroscopy (XPS) was performed using a PHI model 1600 spectrometer with Al Kα X-rays.

Water CA measurements were obtained with a Rame-Hart CA goniometer (model 100). For the static CA measurements, 4 μL water drops were used and still images were recorded and analyzed. Since the adhesion force of the water drops to the PFE-treated paper substrates was very strong, the commonly accepted method for CA hysteresis measurements could not be performed. Because of the strong interactions between the "sticky" near superhydrophobic PFE-treated paper substrates and the water drop, the receding angle decreased with the drop volume in the standard volume-change hysteresis tests. Hence, a different method was adopted: after the static CA measurement, the substrate was slowly moved perpendicular to the needle and the difference between the CA at the advancing and receding contact lines was taken as the CA hysteresis. This method of measuring CA hysteresis was found to be reproducible for the sticky substrates. Moreover, for the SH-treated paper substrate, this method was in agreement with the commonly accepted volume-change method.

Before discussing the results, it may be appropriate to briefly discuss superhydrophobicity. The most common definition for superhydrophobicity, as described above, is the existence of a static water CA larger than 150°. Although the CA is a good descriptor of the interaction between water and solid surfaces, the threshold of 150° is not sufficient to guarantee the water-repellant behavior associated with lotus leaves (i.e., droplet roll-off and self-cleaning). In order to predict the mobility of water droplets, it is also necessary to determine the CA hysteresis (i.e., the difference between advancing and receding CAs at the leading and trailing edge of a moving droplet). It has been found that for a CA hysteresis less than 10°, water drops roll off the surfaces, while for a hysteresis greater than 10° drops tend to stick to the surface, even if such a surface has a CA greater than 150°. Thus, in this example, both the water CA and CA hysteresis will be provided in order to better categorize the interactions of hydrophobic substrates with liquids.

Figure 9:
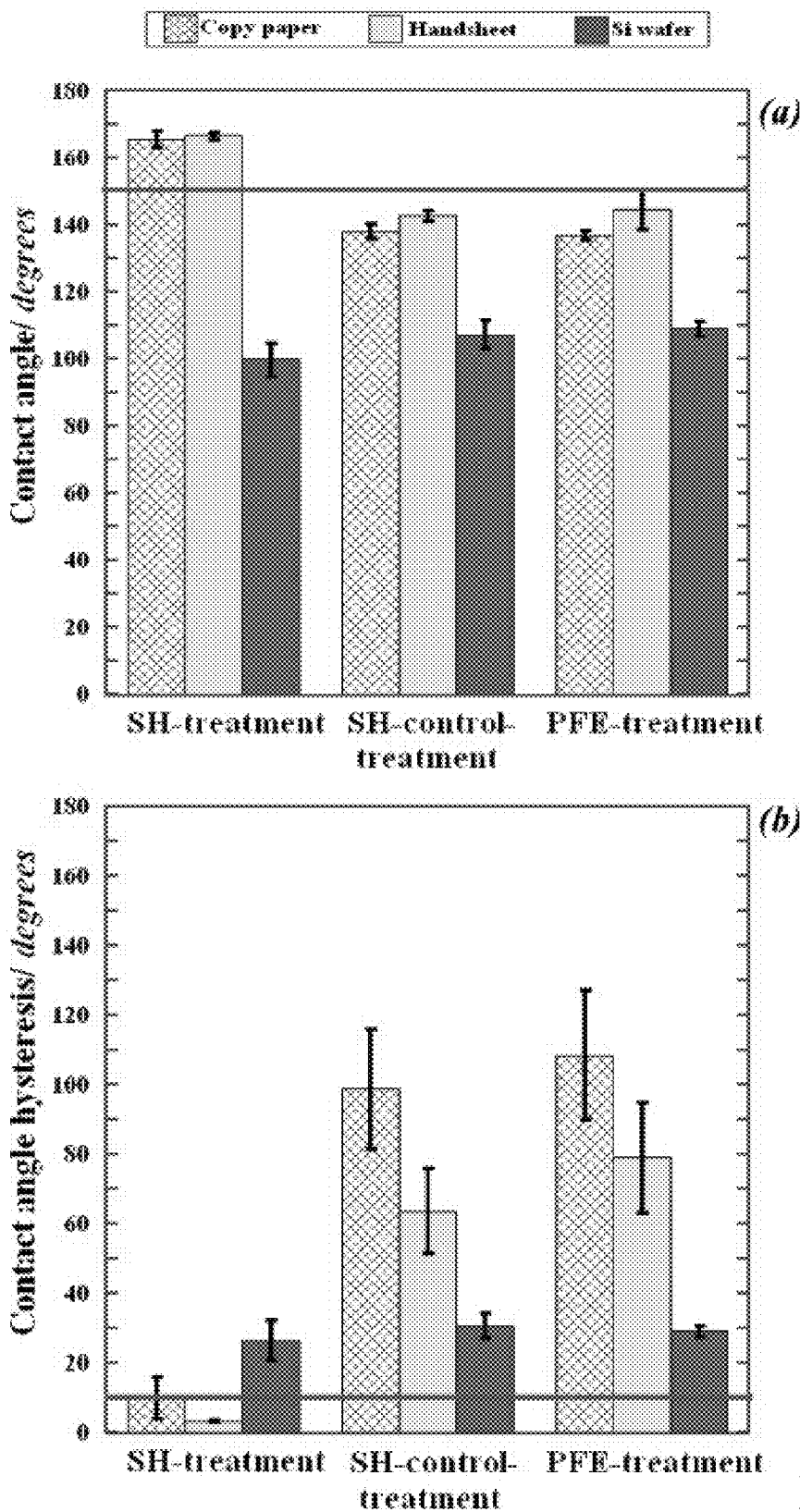
FIG. 9 provides graphs of 9(a) CA and 9(b) CA hysteresis measurements for the copy paper, handsheets, and Si wafers for three plasma treatments in accordance with the embodiments of EXAMPLE 1, wherein the dark solid line in each graph indicates the cutoff value for "roll-off" superhydrophobicity, and the error bars represent 95% confidence intervals.

The charts in FIG. 9 show a comparison of the water CA and CA hysteresis of copy paper, handsheet, and silicon wafer subjected to three tests: (1) SH-treatment, (2) SH-control-treatment, and (3) PFE-treatment. The results for substrates without PFE deposition are not presented in the chart. CA measurements on untreated and oxygen plasma treated (only Step 1 of SH-treatment) copy paper showed a CA of 81.9° 3.6°, while for untreated and oxygen plasma treated handsheets the water drop was absorbed into the paper in less than 1 s, so that the CA could not be measured. Even with the copy paper, slow water absorption takes place, and as a result, CA hysteresis could not be measured for either substrate without PFE deposition. In spite of these challenges, CA measurements clearly revealed the hydrophilic nature of these samples in the absence of fluorocarbon.

Figure 31:
FIG. 31 illustrates the difference between the results of SH-treatment and control experiments (PFE-treatment (and SH-control-treatment)), showing images from the CA and hysteresis measurements on treated handsheet samples.
Figure 31:
Figure 31:
Figure 31:

The SH-treatment resulted in a water CA greater than (>) 150° and CA hysteresis less than (<) 10° for both copy paper and handsheet. These substrates were superhydrophobic according to the classical definition. In comparison, the handsheet and copy paper exposed to PFE-treatment (and SH-control-treatment) resulted in high CA (>140°) along with relatively large CA hysteresis)(60-110°). The fact that both control experiments (SH-control and PFE-treatment) yield the same result for all three substrates proves that the processing conditions (pressure, temperature, and oxygen flow without plasma) of the plasma etching (Step 1) are not the main cause of the observations. To illustrate the difference between the results of SH-treatment and the control experiments, images from the CA and hysteresis measurements on treated handsheet samples are shown in FIG. 31. Whereas typical "roll-off superhydrophobicity" was observed after SH-treatment with a very low CA hysteresis of about 3.4°, the properties of the control sample can best be described as "sticky superhydrophobicity": the water drop sticks to the surface in spite of exhibiting a very high CA (140°) with a CA hysteresis of about 79°. Although the CA on the control substrates did not strictly meet the stated operational definition of superhydrophobicity (>150°), the 95% confidence interval in the data was within the 150° criteria. Nevertheless, this behavior will be characterized as "sticky near superhydrophobicity". In the remainder of this example, the terms "roll-off superhydrophobicity" (CA>150°, hysteresis<10°) and "sticky superhydrophobicity" (CA>150°, hysteresis>10°) will be used to categorize the substrates.

Figure 10:
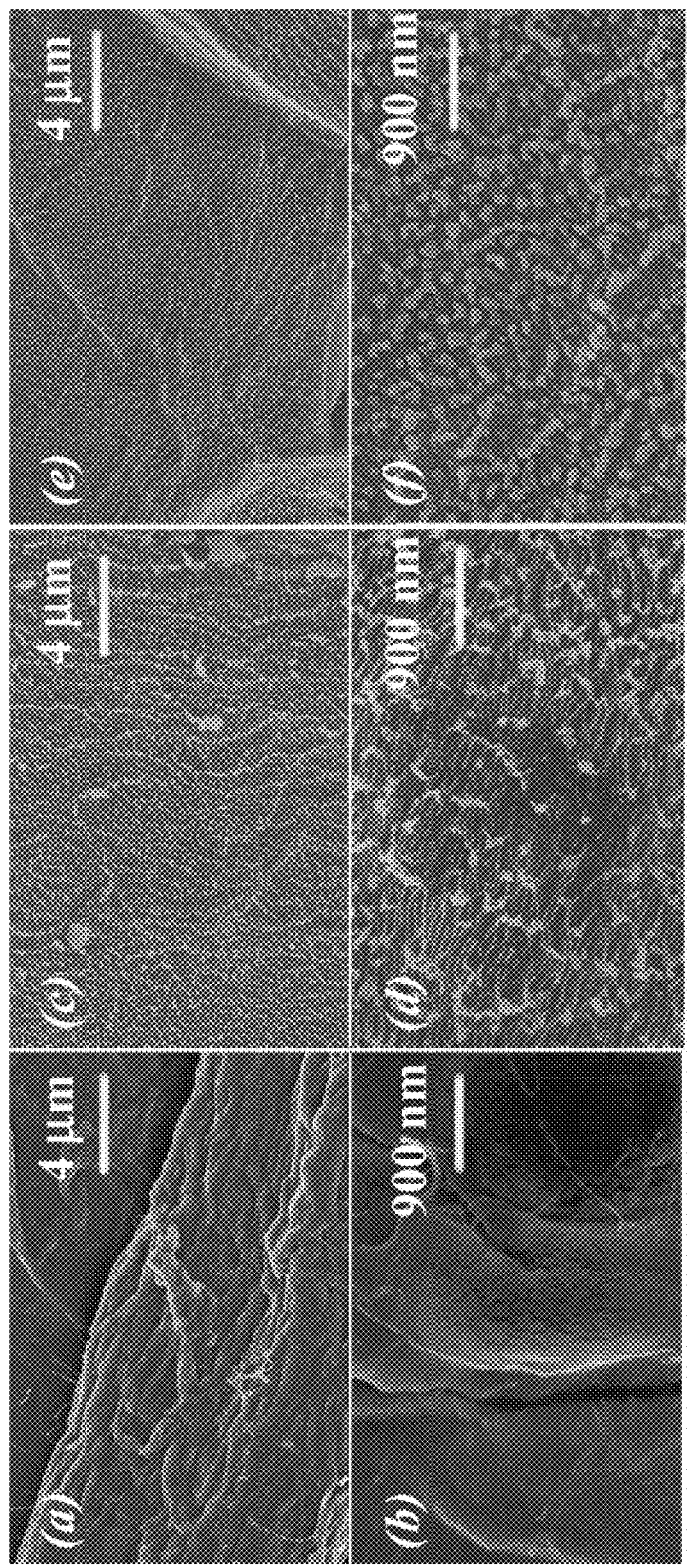
FIG. 10 provides high-magnification scanning electron microscope (SEM) images of an "untreated" handsheet fiber at 10(a) about 5000× magnification and 10(b) about 20,000× magnification, oxygen-etched handsheet fiber at 10(c) about 5000× magnification and 10(d) about 20,000× magnification, and oxygen-etched and PFE-coated handsheet fiber at 10(e) about 5000× magnification and 10(f) about 20,000× magnification in accordance with the embodiments of EXAMPLE 1.

Oxygen plasma etching of amorphous cellulose domains will now be discussed. The data in FIGS. 9 and 31 strongly suggest that the SH-treatment generated the desired roughness topography for "roll-off" superhydrophobicity due to etching in the oxygen plasma, but the macroscopic CA measurements did not provide undisputable proof of this. To verify the effect of plasma etching (Step 1) and deposition (Step 2) in more detail, high-resolution SEM images were obtained for three samples: (1) untreated handsheets, (2) oxygen etched handsheets (Step 1 of the SH-treatment), and (3) oxygen etched and PFE deposited handsheets (SH-treatment). FIG. 10 shows the direct comparison at two SEM magnifications: about 5000× and about 20,000×, respectively. It should be noted that the SEM images display single fibers. The fluffy, "cotton-like" surface of the untreated sample (see FIGS. 10$a$ and $b$) can be attributed to the soft amorphous primary layer of the fibers. After oxygen etching, the fibers exhibited a roughened surface with nanometer-scale features (see FIGS. 10$c$ and $d$) that were not observed with the untreated sample. The features on the roughened surface were attributed to the crystalline portions of the fiber, which remained after selective etching of the amorphous portions of the fibers by the oxygen plasma treatment. XPS studies were performed on the untreated and oxygen etched samples. The O/C ratio of untreated and oxygen etched handsheets were 0.84 and 1.27, respectively. XPS survey scans (data not shown) on the oxygen etched surface displayed only peaks for O1s and C1s, which was expected for cellulose fibers. Moreover, the feature sizes of the etched sample shown in FIGS. 10$c$ and $d$ are consistent with the dimensions of crystalline microfibrils. PFE deposition (about 100 nm thick) on the etched surface (see FIGS. 10$e$ and $f$) accentuated the features present and partially covered ridges created by oxygen etching. Preliminary atomic force microscope (AFM) investigations confirmed the surface topography observed in the SEM images. The surface roughness created by the SH treatment was believed sufficient to generate "roll-off" superhydrophobicity.

The significance of the natural topography of the cellulose fibers for the two behaviors will now be discussed. The fundamental difference between the SH-treated and control samples (SH-control and PFE-treatment) is that the latter were not subjected to oxygen etching, which created nanometer-scale roughness along with the natural micrometer-scale roughness present in the paper surfaces. Since paper is a porous substrate, both samples were considered to be physically heterogeneous (air pockets at the interface) irrespective of their different roughness scales. Thus, the superhydrophobic behavior observed in the "roll-off" and near "sticky" superhydrophobic paper surfaces was expected to be modeled by Cassie's model, which assumes that a liquid does not completely wet the rough hydrophobic surface and attributes the increased CA to the presence of air pockets (composite surface) at the liquid-solid interface according to:

$$\cos \theta = f \cos \theta_y - (1-f) \qquad \text{Equation 23}$$

where f is the wetted area fraction and $\theta$ and $\theta_y$ are the apparent and Young's actual CAs of the surface, respectively. However, recent studies have reported different CAs for the same wetted surface fraction merely by changing surface topography. The variation in CAs was attributed to differences in the contact line topology and tension. Thus, both the three-phase contact line topology and the wetted surface fraction are involved in establishing the CA; such considerations were not addressed by Cassie. It was therefore concluded that the higher CAs obtained for the "roll-off" and "sticky" superhydrophobic samples were likely due to the decreased wetted surface fraction and the difference in surface topography which changed the contact line topology.

It has been reported that the hysteresis of a superhydrophobic surface depends upon two properties: (1) metastable state energy and (2) barrier energy for the drop to move from one metastable state to another metastable state. These two energies depend on the chemical heterogeneity, contact line topology, roughness, and the wetted fraction of the surface. It is postulated that the "roll-off" superhydrophobic paper possesses a high metastable state energy and a low barrier energy which may have been due to the increased contact line tension and roughness and decreased wetted surface fraction. This energy combination caused water drops to "hop" or "skid" on the surface in search of a lower energy state, thereby causing roll-off with a CA hysteresis of 3.4°. In comparison, it is postulated that the "sticky" superhydrophobic paper possessed a relatively low metastable state and a very high barrier energy combination. This may have been due to the decreased contact line tension and roughness and increased wetted surface fraction and chemical heterogeneity. As a result, the water drop remained pinned at the initial lower energy location without the ability to move, thereby displaying a CA hysteresis of 79.1°.

Silicon wafers are flat and should not be affected significantly by treatment with oxygen plasma. Indeed, the CA and hysteresis were the same for all three treatments, with higher CA and lower hysteresis than for an untreated sample, as a result of the fluorocarbon coating. It can therefore be concluded that the natural micrometer topography of the paper surface was responsible for the "sticky" superhydrophobicity. In order to obtain "roll-off" superhydrophobicity, a secondary nano-scale roughness must be added, which was achieved by uncovering the implicit nanostructure of microfibrils via oxygen etching. Thus, the natural implicit and explicit roughness present in cellulose fibers played an important role in determining whether the paper was "roll-off" or "sticky" superhydrophobic.

The robustness and stability of the superhydrophobic paper substrates will now be discussed. An important property of superhydrophobic paper substrates for practical applications is the robustness of the small micrometer and sub-micrometer scale features. Even if a substrate is superhydrophobic immediately after creation, several operational factors can affect stability by decreasing the water CA and/or increasing CA hysteresis: condensation of water vapor in the air pockets present at the liquid-solid interface, external pressure applied to the liquid, which compresses the air pockets, and damage to the fragile nanometer-scale features. The first two issues are related to the application in which the substrates will be used. On the other hand, it is expected that the robustness of the roughness generated by the processes described herein, which originates from the internal morphology of cellulosic fibers, should be improved relative to that of structures created by traditional polymer grafting or nanoparticle deposition. To confirm this, the robustness of the surface was tested with a standardized ASTM scotch tape test. The result was damage to the paper substrate, with a layer of fibers adhering to the scotch tape. Apparently, adhesion failure occurred at fiber-fiber interfaces rather than fiber-PFE interfaces, which demonstrated that the PFE film had excellent adhesive bonding to the fibers. This observation is consistent with the fact that cellulose has numerous —OH moieties which serve as reaction sites for covalent bonding to a cross-linked PFE film. This covalent bonding was stronger than the fiber-fiber hydrogen bonding. After failure of the scotch tape test to confirm the robustness of the topology of the modified surface, another simple wear test was performed on the roll-off superhydrophobic handsheet by pressing it firmly with a bare finger. Although this is not a standardized test, the procedure closely replicates common handling of paper and paperboard and therefore offers insight into practical use of the modified paper surfaces. After this test, the handsheet showed an average CA and CA hysteresis of 157.1°±4.2° and 21.4°±14.5°, respectively, which indicated that the superhydrophobicity was retained. The slight decrease of CA, increase of CA hysteresis, and increased variability of both parameters after the wearability test were likely due to contamination of the surface by grease/dust from the finger, although partial destruction of the nanometer-scale structures cannot be excluded. In addition, CA and CA hysteresis values of SH-treated handsheets and copy paper were constant after storage for several days under ambient conditions (temperature was about 25° C., and relative humidity was about 40%). These studies established the stability of the PFE film under ambient conditions and thus the inhibition of surface oxidation by atmospheric oxygen.

In conclusion, roll-off superhydrophobic and sticky superhydrophobic surfaces were prepared on standard hydrophilic paper substrates using plasma processing techniques in this example. The superhydrophobic paper surfaces were robust, flexible, breathable, biodegradable and may also be recyclable. Due to the hydrophobic nature of the fluorocarbon layer, the coated fibers can be easily separated in the froth floatation process during paper recycling. Food and Drug Administration (FDA) regulations suggest that fluorine can be used in a water or oil repellant material with a basis weight of 0.22-2.44 $g/m^2$ depending upon the chemical form in which it is present. On the basis of these regulations, it is believed that the 100 nm film on a paper substrate with a basis weight of about 76 $g/m^2$ (typical for a copy paper) will fall within the limits specified even if the fluorine is not fully removed when the paper is recycled. Prior to the inventors', the combination of the above-discussed properties (robustness, flexibility, breathability, biodegradability, renewability, and recyclability) had not been found for superhydrophobic surfaces, and in particular, not for a commodity product like paper. These results could find application in packaging, printing, de-inking (paper recycling), biomedical, and chemical industries.

EXAMPLE 2

Tunability of the Adhesion of Water Drops on a Superhydrophobic Paper Surface via Selective Plasma Etching Described in this example is the fabrication of a sticky superhydrophobic paper surface with extremely high contact angle hysteresis: advancing contact angle of about 150° (superhydrophobic) and receding contact angle of about 10° (superhydrophilic). In addition, described is the controlled tunability of the contact angle hysteresis from about 149.8°±5.8° to about 3.5°±1.1°, while maintaining superhydrophobicity, as defined through an advancing contact angle above 150°. The hysteresis was tuned through the controlled fabrication of nano-scale features on the paper fibers via selective plasma etching. The variations in contact angle hysteresis were attributed to a transition of the liquid-surface interaction from a Wenzel state to a Cassie state on the nano-scale, while maintaining a Cassie state on the micro-scale.

Commercial copy paper contains filler particles and other additives to enhance its physical and optical properties. In order to initially avoid the interaction of these particles with the surface modification techniques employed, control samples, generally referred to as handsheets, which were prepared according to TAPPI standardized method T205 sp-02 using southern hardwood kraft (Alabama River Pulp Co.) and southern softwood kraft (North Carolina International Paper) were used. The handsheets were fabricated to ensure that the most relevant properties of the handsheets were in the same range as those of commercial copy paper: basis weight (66.68±2.68 $g/m^2$), thickness (105.59±4.86 μm) and roughness (amplitude $R_a$=6.17±0.24 μm). Four types of substrates were prepared with different fiber combinations and drying methods as shown in TABLE 2.

TABLE 2

Handsheet Drying Method and Fiber Type

| Handsheet designation | Method of drying | Fiber type |
|---|---|---|
| HS-OD | Overnight drying | 50% hardwood-50% softwood |
| H | Rapid drying | 100% hardwood |
| S | Rapid drying | 100% softwood |
| HS | Rapid drying | 50% hardwood-50% softwood |

The details of the parallel plate RF (13.56 MHz) plasma reactor configuration and operational procedures are as described in EXAMPLE 1. The experimental conditions for oxygen etching to create appropriate roughness of the cellulose fibers and subsequent deposition of a fluorocarbon film from the PFE monomer are listed in TABLE 3.

TABLE 3

Plasma Reactor Parameters for Etching and Deposition on Handsheets

| Parameters | Etching | Deposition |
|---|---|---|
| Gas | Oxygen | Pentafluoroethane (PFE) and Argon |
| Flow rate | 75 sccm | 20 sccm (PFE) and 75 sccm (Argon) |
| Temperature | 110° C. | 110° C. |
| Pressure | 0.55 Torr | 1 Torr |
| Power | 10 W | 120 W |

XPS spectra were obtained as described in EXAMPLE 1.

Fourier transform-infrared (FT-IR) spectra were obtained using a Bruker Equinox 55 FT-IR spectrometer, equipped with a nitrogen-cooled MCT detector. A thin strip of the substrate (0.76 cm×6.35 cm) was cut and pressed against a ZnSe ATR crystal using a flat metal strip. The pressure on the sample was controlled by a set screw and kept approximately constant for all samples.

SEM micrographs were obtained (LEO 1530, Carl Zeiss SMT Inc., Peabody, Mass.) at an operation voltage of 10 kV. Substrates were sputter coated (EMS 350; Electron Microscopy Sciences, Hatfield, Pa.) with a thin film of gold having a thickness of about 15 nm prior to SEM studies.

Water CA measurements were obtained by placing the handsheet on a translation stage. Next, a 4 µl drop suspended from a needle was brought into contact, and the stage was moved in the x-direction (left to right). The CAs on the advancing and receding sides of the drop were measured. The advantage of this dynamic method is that it scans a large substrate area and thus yields better statistically averaged values of CA, especially for heterogeneous substrates like paper. One of the disadvantages of this method is that receding CA values of less than 10° cannot be measured, because the drop can break apart while being dragged on the surface. For the most "sticky" substrates, the receding CA was in this range and the breakup of drops was observed. In these cases, the standard volume increment/decrement method for measuring advancing and receding CAs was used. The droplet volume was increased from 4 µl to 12 µl in increments of 4 µl to measure the advancing CA. Thereafter, small decrements of 0.17 µl were used to measure the receding CA.

Before measuring the wetting properties of the modified substrates, the substrates were subjected to basic physico-chemical tests to determine their physical and chemical properties after oxygen etching and PFE deposition in the plasma reactor.

Specifically, cellulose fiber surfaces were characterized after etching and deposition of PFE layers by XPS analysis. Cellulose molecules $(C_6H_{10}O_5)_n$ are essentially polymer chains of β-d-glucose residues covalently coupled via glucosidal linkages. Consistent with this molecular structure, the XPS survey spectrum of the cellulose handsheet (see FIG. 11a) displays two intense peaks assigned to O1s (oxygen) and C1s (carbon). Moreover, the theoretical O/C ratio of cellulose (0.83) correlates well with the ratio of 0.84±0.01 determined by XPS, which indicates that the fabricated handsheets did not contain fillers or other impurities found in commercial paper, and therefore that the handsheets could be used as model substrates for cellulose fibers. Indeed, the data in EXAMPLE 1 demonstrated the similarity between the superhydrophobic character of treated handsheets and analogously treated commercial copy paper.

The primary etchant species formed in an oxygen plasma are oxygen radicals (O*) and oxygen atoms (O*), which etch cellulosic materials (P) via the reaction pathways shown in Equations 21 and 22 in EXAMPLE 1.

The XPS survey spectra of the etched handsheets (data not shown) did not detect the presence of new elements, indicating that no impurities were added to the handsheet surface during plasma etching. TABLE 4 shows the atomic percentages of carbon (C), oxygen (O) and the O/C ratio of the handsheets etched in the oxygen plasma for different etching times. The O/C ratio increased as a function of etching time, consistent with continued oxidation, surface conversion, and etching of cellulose by oxygen species.

TABLE 4

Atomic Percentages of C and O, and O/C Ratio with Respect to Etching Time

| Etching time (min) | % C | % O | O/C ratio |
|---|---|---|---|
| 0 | 54.38 ± 0.20 | 45.62 ± 0.20 | 0.84 ± 0.01 |
| 10 | 49.28 ± 2.27 | 50.72 ± 2.27 | 1.03 ± 0.10 |
| 15 | 48.05 ± 0.81 | 51.95 ± 0.81 | 1.08 ± 0.04 |
| 30 | 44.12 ± 1.20 | 55.88 ± 1.20 | 1.27 ± 0.06 |

Figure 11:
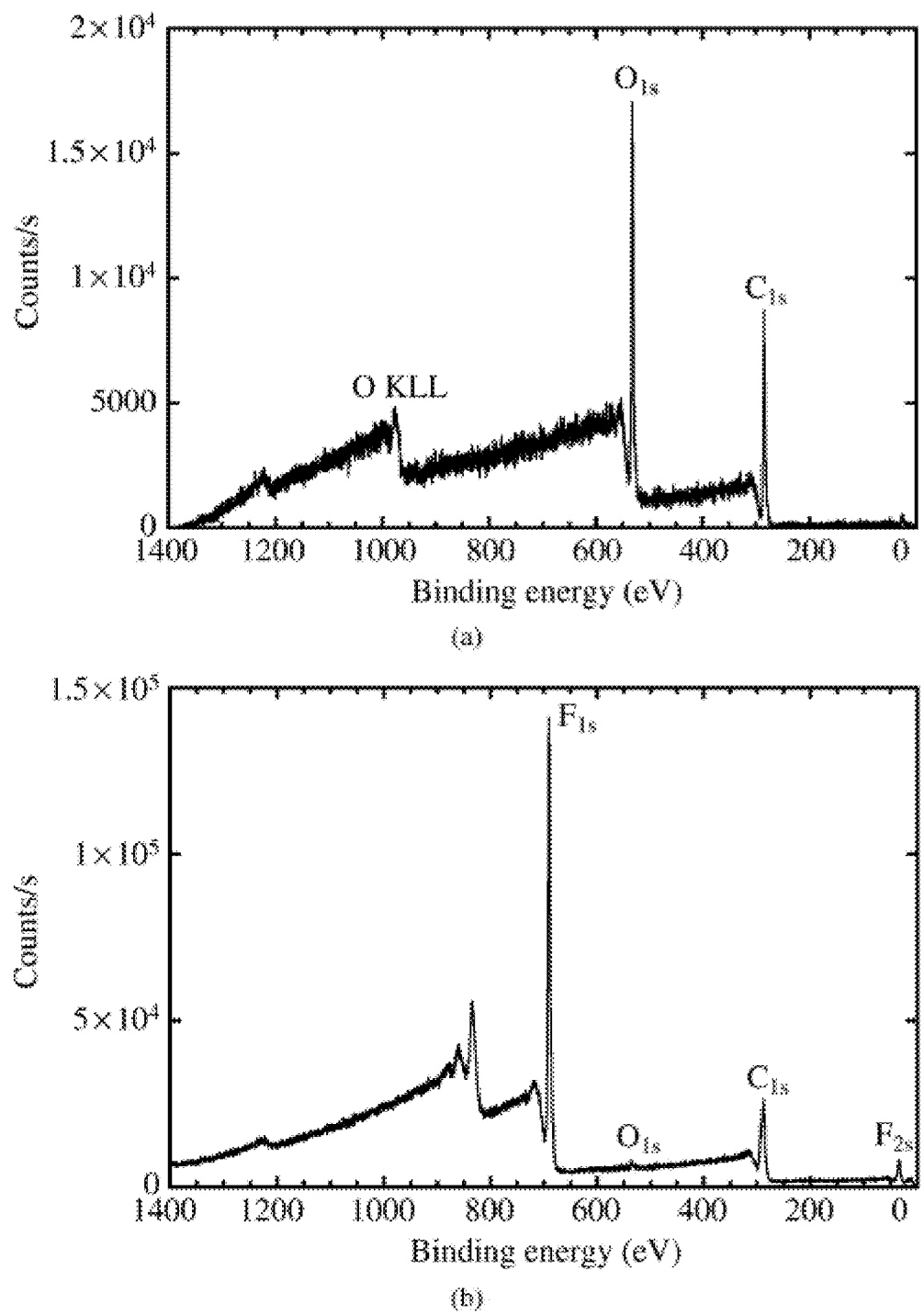
FIG. 11 includes XPS spectra of 11(a) untreated handsheet (HS-OD) and 11(b) PFE film on Si wafer in accordance with the embodiments of EXAMPLE 2.

An XPS survey spectrum after deposition of the fluorocarbon film on Si wafer from the PFE precursor is shown in FIG. 11b. The hydrophobic nature of the film is evident from the two intense fluorine peaks (F1s and F2s) and a reduction in the intensity of the oxygen peak. High resolution C1s spectra of the PFE film revealed the highly cross-linked nature of the film (F/C ratio of about 1.1) and the presence of various hydrophobic fluorinated moieties $(CF_x)$.

Figure 12:
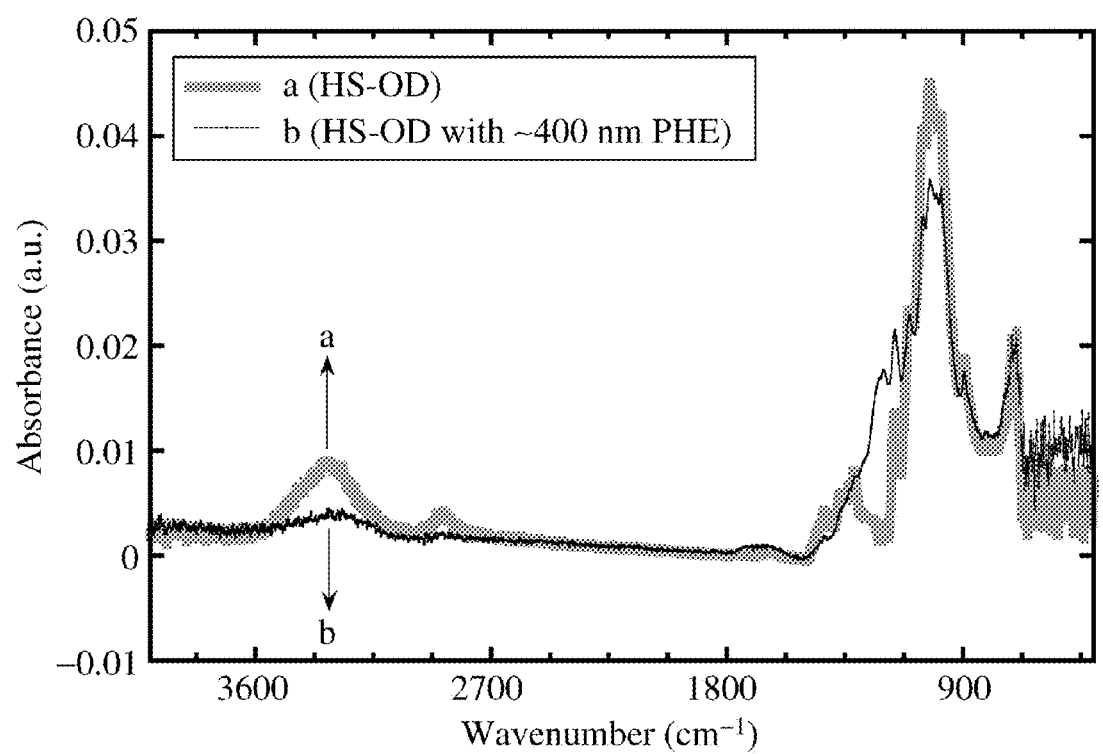
FIG. 12 is a fourier-transform infrared (FT-IR) spectrum of 12(a) untreated and 12(b) PFR-coated (with a thickness of about 400 nm) handsheets in accordance with the embodiments of EXAMPLE 2.

XPS is a surface analysis technique with a probing depth of electrons ranging from about 8 to about 10 nm. To study the chemical nature of the PFE-cellulose structure in more detail, FT-IR spectra of untreated and PFE-deposited handsheets (HS-OD) were obtained with a penetration depth of about 1.2 µm at about 900 cm$^{-1}$. FIGS. 12a and b illustrate the FT-IR spectra of the untreated and PFE-coated handsheets (film thickness of about 400 nm). The spectrum of the untreated handsheet correlates well with the FT-IR spectrum of cellulose surfaces. With the deposition of the PFE film on the handsheet (FIG. 2b), there is suppression of cellulose absorption bands: 3348 cm$^{-1}$ (O—H stretch), 1336 cm$^{-1}$ (O—H in-plane deformation), 2902 cm$^{-1}$ (C—H stretch), 1430 cm$^{-1}$ (C-H deformation, asymmetric) and 1059 cm$^{-1}$ (C—O stretch), which indicates a lower level of oxygen and hydrogen present on the surface. The presence of the new absorption bands at 1200 cm$^{-1}$ ($CF_x$ stretch) and 1700 cm$^{-1}$ (unsaturated fluorocarbon bonds) confirmed the presence of a fluorocarbon film. Thus, the spectrum of the handsheet after PFE deposition exhibited features of both an untreated handsheet (FIG. 12a) and a PFE film. This demonstrated that plasma deposition does not significantly affect the chemical nature of the cellulose fibers, although the PFE is chemically bonded to the cellulose surface.

Paper is a complex porous substrate containing tortuous pores with a wide pore size distribution. Although plasma processing of paper substrates is widely referred to as a surface modification process, one might expect that there will be some penetration and reaction of plasma species into the paper bulk. SEM images of PFE-coated handsheets after the creation of cross-sections via focused ion beam etching illustrated that the PFE deposition occurred primarily on the surface of the handsheet in spite of its porosity.

Fabrication of sticky superhydrophobic paper surfaces will now be explained. Handsheets (HS-OD, H, S and HS, as designated in FIG. 31) were exposed to PFE deposition for 2 min (no etching), which generated a film thickness of about 100 nm. Contact angle measurements were performed; TABLE 5 shows the advancing CA, receding CA, and CA hysteresis results.

TABLE 5

Contact Angle Measurements on Sticky Superhydrophobic Paper Surfaces

| Handsheet | Advancing CA (°) | Receding CA (°) | CA hysteresis (°) |
|---|---|---|---|
| HS-OD | 155.6 ± 4.0 | 8.4 ± 6.8 | 147.2 ± 6.8 |
| H | 154.3 ± 1.9 | 12.5 ± 5.0 | 141.8 ± 5.0 |
| S | 149.0 ± 2.5 | 8.5 ± 5.0 | 140.4 ± 5.0 |
| HS | 159.4 ± 7.7 | 9.7 ± 5.8 | 149.8 ± 5.8 |

Figure 13:
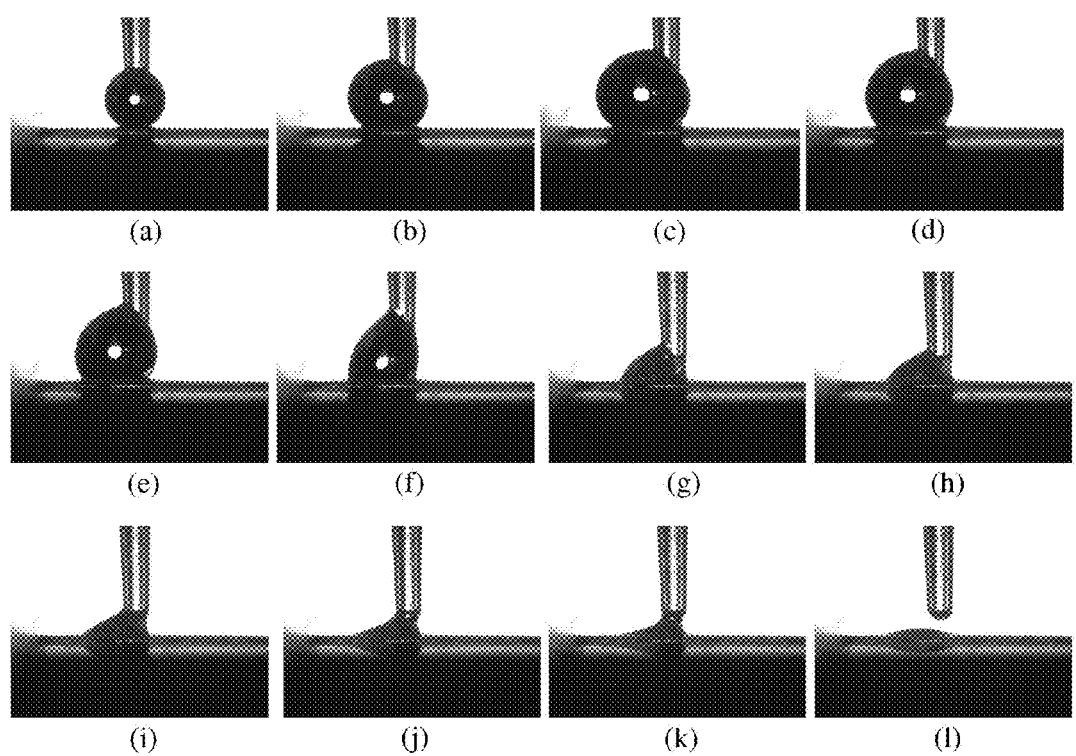
FIG. 13 provides representative images of 13(a-c) advancing and 13(d-l) receding CA measurements on a sticky superhydrophobic handsheet surface in accordance with the embodiments of EXAMPLE 2.

All four substrates exhibited extremely high hysteresis values, with advancing CAs nearly in the superhydrophobic regime and receding CAs in the superhydrophilic regime. Selected images of the advancing and receding CA measurements are shown in FIG. 13. It was evident from the image sequence in FIG. 13 that during the receding period, the apparent solid-liquid contact area did not decrease indicative of the extreme stickiness of the water drop to the surface.

The sticky superhydrophobic surface of EXAMPLE 1 had a CA hysteresis of 79.1±15.8°, far less than the CA hysteresis values shown in FIG. 31. After obtaining the extremely high hysteresis values for the sticky substrates in this example, the hysteresis was systematically varied in order to control the stickiness of the surfaces toward water drops. That is, it was believed that the stickiness (i.e., CA hysteresis) could be manipulated by controlling the physical heterogeneity of the paper surfaces. This was achieved by selectively etching the amorphous portions of the cellulose fibers by selective oxygen etching. To investigate this process, handsheets (HS-OD) were etched in an oxygen plasma for different durations (0-60 min). Film deposition was then performed onto the handsheets for about 2 and about 15 min to form a thin film of PFE.

Figure 14:
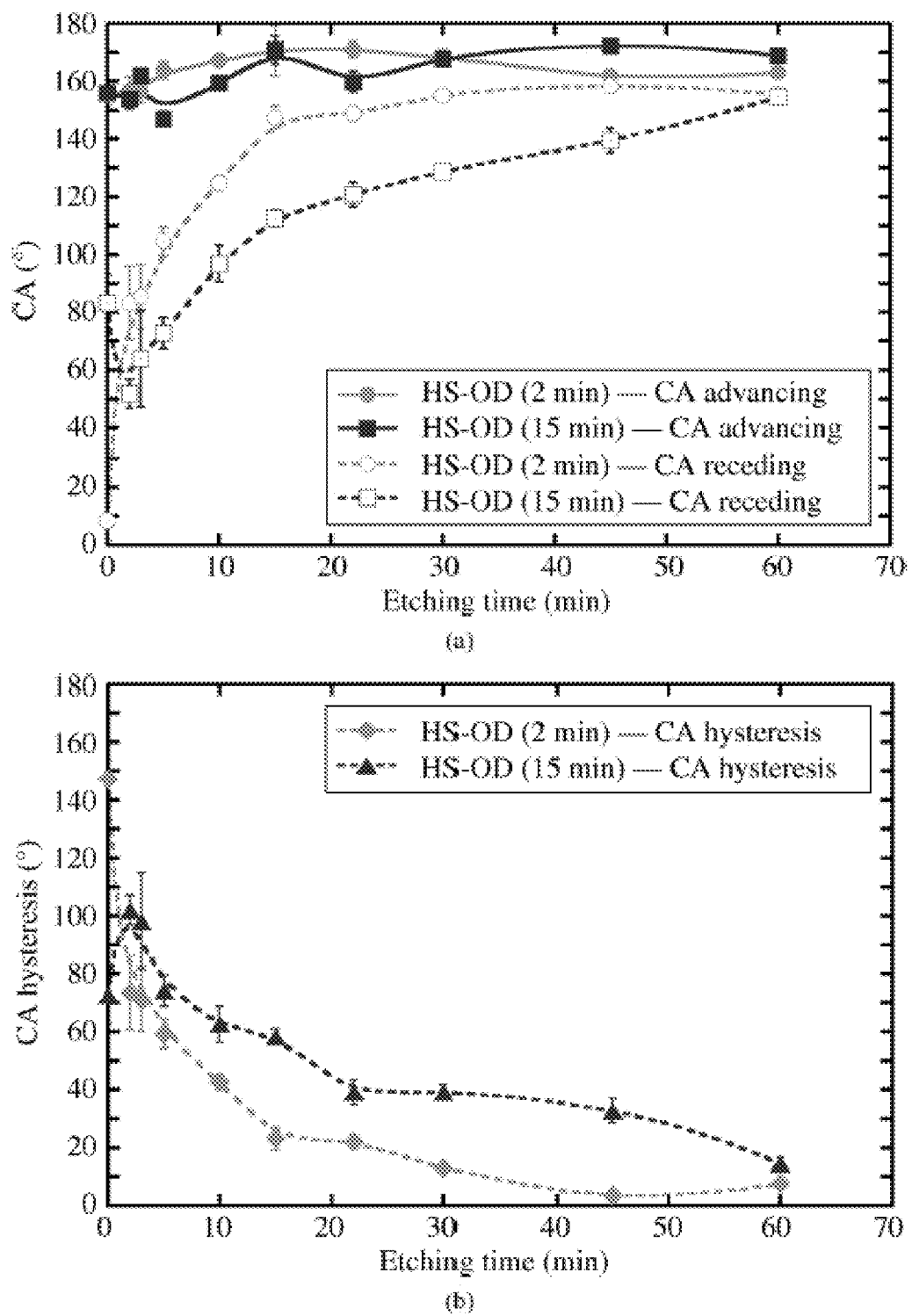
FIG. 14 provides graphs of 14(a) advancing CA and receding CA of handsheets (HS-OD) with respect to oxygen plasma etching time for 2 min and 15 min PFE depositions and 14(b) CA hysteresis of handsheets (HS-OD) with respect to oxygen plasma etching time for 2 min and 15 min PFE depositions in accordance with the embodiments of EXAMPLE 2.

FIG. 14 shows advancing CAs, receding CAs, and CA hystereses for the handsheets (HS-OD) processed with different etching times. It is evident from FIG. 14 that while the advancing CA was in the superhydrophobic regime for all samples (>150°), the receding CA increased from a superhydrophilic value of 8.4°±6.8° to superhydrophobic value of 155.4°±1.6°. This smooth transition of the receding CA resulted in tunable CA hysteresis values from 147.2°±6.8° (sticky) to 7.6°±1.6° (roll-off). Controlling the oxygen etching times thus enabled the generation of paper surfaces with various levels of stickiness.

Figure 15A:
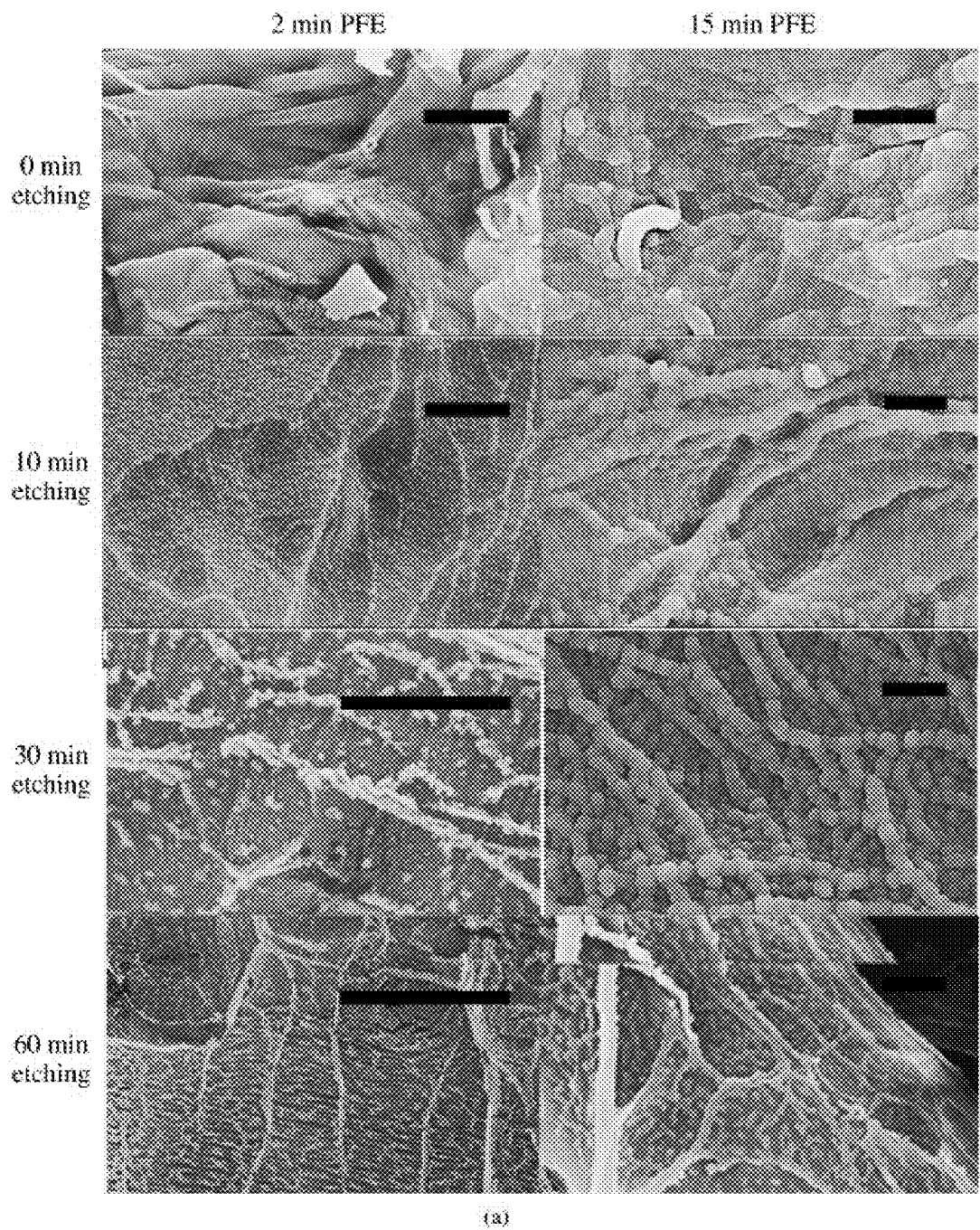
FIG. 15(a) provides high-magnification SEM images of the HS-OD (with 2 min PFE deposition) and HS-OD (with 15 min PFE deposition) for 0, 10, 30 and 60 minute etching times, wherein the scale bars correspond to 2 μm in each image, in accordance with the embodiments of EXAMPLE 2.
Figure 15B:
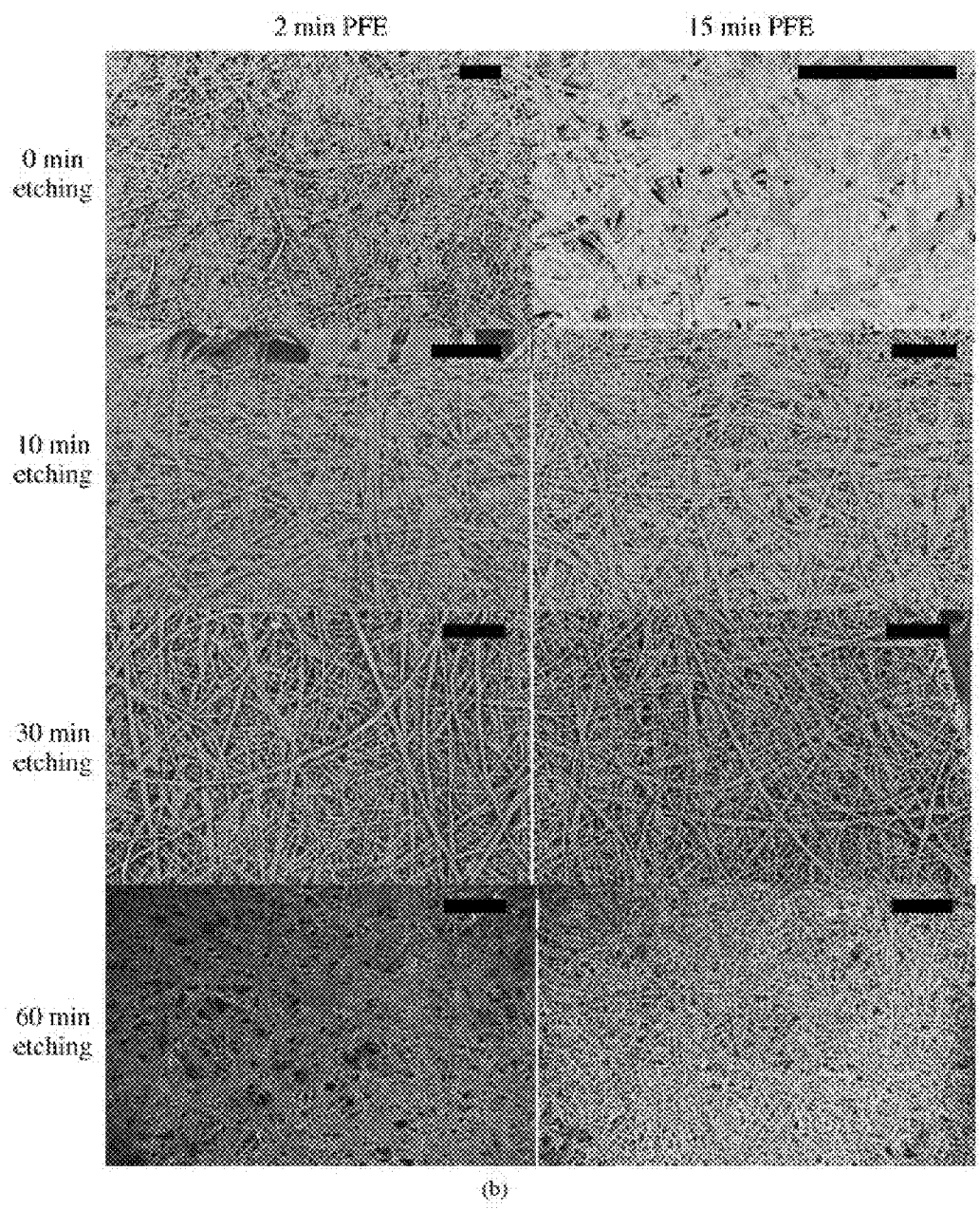
FIG. 15(b) provides low-magnification SEM images of the HS-OD (with 2 min PFE deposition) and HS-OD (with 15 min PFE deposition) for 0, 10, 30 and 60 minute etching times, wherein the scale bars correspond to 400 μm in each image, in accordance with the embodiments of EXAMPLE 2.

SEM images of the handsheets (HS-OD) for selected etch times and 2 min PFE depositions are shown in FIGS. 15a (high magnification) and b (low magnification). On the nanoscale (FIG. 15a), it was observed that as oxygen etching proceeds, the fiber surfaces were roughened due to the formation of small nano-scale features. After about 10 min of etching, the formation of mushroom-like features was apparent. The feature spacing increased with prolonged etching (30 min) and, after 60 min etching, the mushroom-like features disappeared. At this point the nano-scale roughness consisted of solid ridges. On the micro-scale (FIG. 15b), the number density of fibers on the surface decreased with etching time, resulting in enhanced micro-scale roughness. The oxygen plasma apparently etched away the soft fiber dust and primary layers of fibers. It was apparent from the SEM images that oxygen etching roughened the handsheet surface on two separate length scales; the extent of both roughness scales qualitatively increased with etching time, at least up to about 30 min of etching time.

The interactions of a liquid drop with a physically heterogeneous (rough) solid surface can be explained by two classic equations: Wenzel and Cassie. When the liquid penetrates into the rough grooves of the surface, the apparent contact angle made by the liquid drop with the surface was described by Wenzel as shown in:

$$\cos\theta = r\cos\theta_y \qquad \text{Equation 24}$$

where r is the ratio between the actual surface area to the geometric (projected) surface area (r>1 for a rough surface with complete liquid-substrate contact), θ and $\theta_y$ are the apparent and Young's contact angles of the surface, respectively.

On the other hand, when the liquid does not completely penetrate into the solid grooves, leaving air voids at the apparent solid-liquid interface, the apparent contact angle of the liquid drop with the surface was described by Cassie as shown in Equation 23.

Others later combined these two equations to model the transition from a Wenzel-type wetting to a Cassie-type wetting as a function of roughness. They concluded that for a hydrophobic surface, the CA hysteresis increases with roughness if the wetting is governed by the Wenzel state. On the other hand, the CA hysteresis decreases with roughness if the wetting is governed by the Cassie state.

Paper is a porous substrate consisting of many tortuous pores formed by the complex network of cellulose fibers. When a thin PFE film is deposited (having a thickness of about 100 nm), only the individual fibers are coated and the porosity and the roughness of the paper substrate are unchanged. Therefore, even without the presence of roughness created by oxygen etching, an inherent micro-scale roughness of the paper surface results from the network of fibers and the porosity of the paper; this causes the interaction of a liquid drop with paper to be in the Cassie regime. From FIG. 14 it is evident that the hysteresis of the handsheets (HS-OD) decreased with respect to the etching time, which suggests that the etched handsheets were also in the Cassie regime.

The static CA for a smooth PFE film deposited on a silicon wafer was approximately 105°. After a continuous PFE film covered the fiber surface, the surface chemistry of the fiber became identical to that of a PFE film (as concluded from the XPS spectrum). The PFE deposition time (2 min) for these experiments was chosen to obtain a continuous coating on the fibers with a thickness (of about 100 nm) that is sufficient to retard water absorption into paper. As a result, the fiber surface after a 2 min PFE deposition should have had a Young CA approximately equal to 105°.

Figure 16:
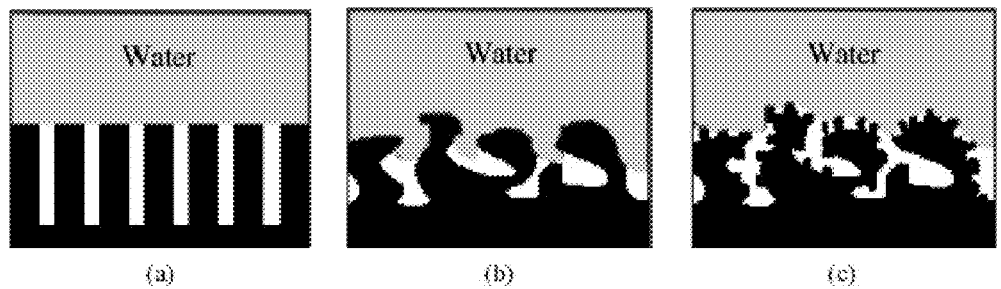
FIG. 16 includes schematics illustrations of interactions of water with surfaces at 16(a) an ideal Cassie state, 16(b) a sticky superhydrophobic state, and 16(c) a roll-off superhydrophobic state in accordance with the embodiments of EXAMPLE 2.

If the water-substrate interaction occurs in the ideal Cassie regime (FIG. 16a) with chemical heterogeneity provided by the PFE film and air, the minimum possible receding CA obtained would be about 105°. However, in FIG. 14 it was observed that for no etching, the receding CA values were well below 105°, and as low as about 10°. Such low receding CA values for these samples were only possible if pinning of the three phase contact line occurred by physical heterogeneities on the handsheet fibers. Since the wetting of handsheets appeared to be in the Cassie regime (irrespective of the etching time), the high hysteresis could result only if there was a possibility of a nano-scale Wenzel state on the top of each fiber of the handsheet, characterized by an enhanced liquid-substrate contact area (FIG. 16b). This type of interaction would increase the energy barrier between metastable states. For a surface with a very low solid-liquid contact area, a higher energy barrier greatly decreased the receding CA while only slightly increasing the advancing CA, as was observed for the handsheets. These types of interactions were believed to occur in the unetched handsheet with 2 min PFE deposition, resulting in a high, superhydrophobic advancing CA and a low, superhydrophilic receding CA. This type of interaction was categorized as Cassie state on the micro-scale and Wenzel state on the nano-scale. The unique combination of Cassie and Wenzel states provided a large energy barrier for the movement of the three phase contact line, resulting in a very low receding CA in spite of a superhydrophobic advancing CA. Similar types of interactions for different roughness scales are also referred to as 'air pocket trapping', 'Cassie impregnation', 'petal effect', 'transitional superhydrophobic state between Wenzel's and Cassie's states', and 'Cassie-Wenzel wetting transition'.

After etching, the formation of the nano-scale features on the fiber surface (see, e.g., 30 min in FIG. 15) provided a different liquid-solid interface. The additional roughness created by the nano-scale features resulted in Cassie state wetting at the nano-scale (FIG. 16c). These nano-scale features were believed to greatly reduce the wetting area, as well as the energy barrier between metastable states. As a result, the vibration energy of the drop was high enough to overcome the energy barriers, giving rise to roll-off behavior (low CA hysteresis). This type of interaction was classified as Cassie regime on the nano- and micro-scale. This type of interaction is commonly referred to as the 'lotus state', in reference to its natural occurrence on the leaves of lotus plants.

The schematics in FIGS. 16b and c can be directly compared with the SEM images (FIG. 15a and b) for 0 and 60 min etched handsheets (HS-OD). FIG. 14 shows that by varying the etching time, the hysteresis could be tuned from a sticky superhydrophobic to a roll-off superhydrophobic value. This tunability was believed to be obtained by a smooth transition from the Wenzel to Cassie state at the nano-scale (fiber surface) due to the evolution of the nano-scale features. This was supported by the SEM images in FIGS. 15a and b (2 min PFE). The transition of a drop's interaction from Cassie state to Wenzel state has been previously obtained by inducing pressure and vibration. In this example, however, this transition was obtained without using an external stimulus by controlling the topography of the fibers or, in other words, by the evolution of the nano-scale features. In conclusion, the unique combination of transition in wetting happening at the nano-scale, while maintaining a Cassie state at the micro-scale resulted in variable receding CA while maintaining a superhydrophobic advancing CA.

The significance of nano-scale roughness on the tunability of stickiness will now be discussed. Fiber diameters in the handsheet ranged from about 10 to about 40 μm. Thus, a PFE film thickness of less than about 1 μm would not have been expected to affect the micro-scale roughness. Two PFE deposition times were used to coat the etched handsheets (2 and 15 min) to study the effect of nano-scale roughness on tunability. As explained above, the 2 min PFE deposition (about 100 nm) was chosen because it just exceeds the minimum thickness to retard water absorption. The 15 min PFE deposition (about 1 μm) was chosen because this relatively thick film should not have disturbed the microscale features.

Comparisons of the advancing CA, receding CA, and CA hysteresis for the 2 min and 15 min PFE-deposited handsheets (HS-OD) are shown in FIGS. 14a and b. The 15 min PFE deposition on an unetched paper resulted in a CA hysteresis of 72.6±10°, which was lower than the value obtained for a 2 min PFE deposition. This observation was consistent with the SEM images in FIG. 15a. With increased PFE deposition (15 min), the presence of globular features was visible on the non-etched handsheets. These nano-scale features were believed to have decreased the hysteresis by enhancing roughness. On the other hand, the CA hysteresis went through a maximum value after 2 min etching and then decreased, following the same trend as the handsheets with 2 min PFE deposition. Again, hysteresis increases with roughness if the interaction between the water drop and surface is in the Wenzel state. Hence, it can be concluded that 2 min etching increases the roughness scales (from 0 min etching) appropriate for Wenzel state wetting. After 3 min etching, the fiber topography was appropriate for wetting in the Cassie regime, resulting in a decrease in the CA hysteresis with respect to etching (roughness). It was evident from FIGS. 14a and b that the hysteresis values for the etched fibers with 15 min of PFE deposition were consistently higher than for 2 min PFE deposition. This increased hysteresis may be attributed to the larger nano-scale features observed on handsheets after 15 min PFE deposition (FIG. 15a) which provided a larger solid-liquid contact area.

The morphological change on a nano-scale by longer deposition times (thicker PFE film) was a unique feature of the plasma deposition process. The plasma deposition process took place at reduced pressure (about 1 Torr). At this pressure, the reactant species flux onto the surface, which establishes the deposition rate, is determined by the surface topography. That is, the film thickness at a particular surface location depends on the acceptance angle for species impingement and thus on the geometry at that location. Ideally, at the top of a 90° step, reactant flux impinges from a 270° cone and hence this edge location receives more flux than does a flat surface (180° cone) or the corner at the bottom of this step (90° cone); deposition rates scale with these fluxes. This phenomenon plays a crucial role in the modification of the oxygen etched fiber morphology due to the variation of PFE deposition thickness and deposition time.

Handsheets made with different fiber sizes were used to study the micrometer scale roughness on the wettability. The softwood fibers (about 3-7 mm in length; about 50 μm in diameter) are typically larger than the hardwood fibers (about 1-2 mm in length; about 20 μm in diameter) by a factor of two. Changing the micro-scale roughness by changing the fiber size combinations (100% hardwood (H), 100% softwood (S) and 50% hardwood-50% softwood (HS)) did not affect the CA or CA hysteresis values (data not shown). This clearly indicated that the physical heterogeneity (roughness) created on the fibers by oxygen etching was the key to tuning contact angle hysteresis and stickiness. This verifies that the nano-scale features created by oxygen etching were the key to the transition from a Wenzel-type wetting to a Cassie-type wetting at the nano-scale.

Figure 17:
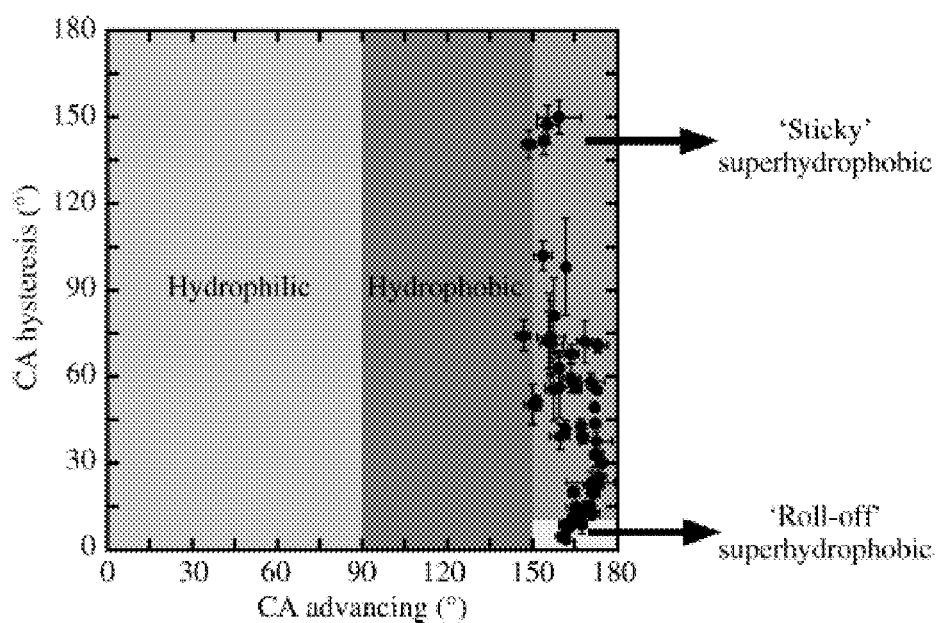
FIG. 17 graphically illustrates CA hysteresis versus CA for all samples investigated for various etching times: HS-OD, H, S, and HS with 2 min PFE deposition and also HS-OD with 15 min PFE deposition in accordance with the embodiments of EXAMPLE 2.

In FIG. 17, the CA hysteresis and advancing CA for the different handsheets were plotted for the various etching times (0-60 min) with 2 min PFE deposition (HS-OD, H, S and HS) and with 15 min PFE deposition (HS-OD). This figure illustrates that all substrates (except two) were superhydrophobic by the classical definition, but spanned a wide range of stickiness (CA hysteresis).

To summarize, this example demonstrates the fabrication of superhydrophobic paper surfaces with a wide range of contact angle hysteresis values, which resulted in variable stickiness for water drops. The tunability of hysteresis on the paper substrates was obtained by creating physical heterogeneity (roughness) on the cellulose fibers via selective oxygen plasma etching. Tunable stickiness of water drops on paper-based substrates can be important in controlling the mobility of drops resident on the surface. Those skilled in the art to which this disclosure pertains will understand that sticky superhydrophobic surfaces can be used, for example, to make "tweezers" for liquid drops that allow the transfer of a large volume of liquid with low solid-liquid contact area. Those skilled in the art will recognize that the concepts demonstrated in this example can be used in many chemical and biomedical research areas such as microfluidics, MEMS, proteomics and genomics. In addition, those skilled in the art will recognize that generation of such tunable surface properties on biodegradable, inexpensive, recyclable paper substrates can enable additional applications in these fields.

EXAMPLE 3

Design of Superhydrophobic Paper/Cellulose Surfaces via Plasma Enhanced Etching and Deposition In this example, superhydrophobicity was achieved on different paper surfaces via plasma enhanced etching and film deposition. The effects of fiber types and paper making parameters on the superhydrophobic behavior were studied. Achievement of superhydrophobic behavior depended on the formation of nano-scale features on the paper fibers established by selective etching of the amorphous domains in cellulose. Despite different fiber types and paper making processes, it was found that superhydrophobicity can be attained provided that plasma etching can occur on the fiber surface to create nano-scale features. Plasma processing conditions that allow the design of superhydrophobic paper or cellulose surfaces with specific adhesion properties will be described in this example. The significance of water drop volume on contact angle measurements and thus on characterization and analysis of superhydrophobic behavior of heterogeneous, porous paper substrates will also be discussed in this example.

The fabrication of both "roll-off" and "sticky" superhydrophobic paper surfaces using plasma etching and deposition was described in EXAMPLE 1. A methodology to tune the hysteresis (adhesion) between these two so-called "extreme" behaviors and to control the wetting mechanisms responsible for these behaviors was described in EXAMPLE 2. The tenability in hysteresis was obtained by controlled formation of nano-scale features via selective plasma etching of the cellulose fiber surfaces. During paper manufacturing, the choice of fiber source and process conditions are chosen to meet the desired, application-specific properties. Based on the data in these two examples, it is reasonable to expect that different types of paper, with different fiber sources and fiber treatments, might display significant differences in micro-scale roughness (defined by the fiber web structure) and in the evolution of nano-scale roughness due to etching. Both of these factors are important in determining their superhydrophobic behavior. Therefore, in this example the impact of variations in fiber type and paper making processes on the superhydrophobic properties of paper surfaces were investigated. The experiments in this example also provide additional insight into the appropriate window of plasma processing conditions that enable design and fabrication of superhydrophobic paper surfaces for different applications. Finally, the effect of water drop size on contact angle and contact line geometry as observed in superhydrophobicity measurements on heterogeneous porous substrates such as paper are discussed.

Five types of paper substrates were used for superhydrophobicity studies as described in TABLE 6. Handsheets (H, S, HS) were fabricated following the TAPPI method T205 sp-02 with southern hardwood kraft (Alabama River Pulp Co., Perdue Hill, Ala.) and/or southern softwood kraft (International Paper Co., Riegelwood, N.C.). Both of the fiber types (hardwood and softwood) were refined to the same level for a freeness value of about 500 prior to the paper forming process. Commercial copy paper substrates, "Premium white copy paper", were obtained from local Office Depot. Commercial paper towels, SCOTT® High Capacity Hard Roll Towels (product code 01000) were manufactured by Kimberly-Clark.

TABLE 6

Paper Substrates Used for Superhydrophobicity Studies

| Substrate designation | Description |
| --- | --- |
| H | Handsheet (100% hardwood fibers) |
| S | Handsheet (100% softwood fibers) |
| HS | Handsheet (50% hardwood-50% softwood) |
| CP | Copy paper |
| PT | Paper towel |

A 6-inch parallel plate RF (13.56 MHz) plasma reactor was used for plasma etching and deposition sequences; substrates were heated to about 110° C. Details of the reactor configuration and operational procedures for the treatment of paper substrates are described in EXAMPLE 1. Experimental conditions for oxygen etching and fluorocarbon (PFE) film deposition are listed in TABLE 7.

TABLE 7

Plasma Reactor Parameters for Etching and Deposition Steps

| Parameters | Etching | Deposition |
| --- | --- | --- |
| Gas | Oxygen | Pentafluoroethane (PFE) and Argon (carrier gas) |
| Flow rate | 75 sccm | 20 sccm (PFE) and 75 sccm (Argon) |
| Pressure | 0.55 Torr | 1 Torr |
| Power | 10 W | 120 W |
| Treatment time | 0-60 min | 2 min |

SEM micrographs were obtained using a LEO scanning electron microscope (model 1530) at an acceleration voltage of 5 kV or 10 kV depending on the damage induced by the electron beam on the paper surfaces. Prior to SEM studies, paper substrates were sputter coated (EMS 350; Electron Microscopy Sciences, Hatfield, Pa.) with a thin film of gold having a thickness of about 15 nm.

For standard contact angle measurements, a 4 µl water drop was used. Advancing and receding contact angles were measured by moving the substrate left to right with respect to the drop. This method yields improved statistically averaged CA values relative to measuring CAs at individual locations independently, since a larger area of the substrate is scanned during measurement. However, for sticky substrates with receding CA less than 10°, this method could not be used because the drop broke before the receding CA was attained. EXAMPLE 1 reported that the receding CA observed during drop breakup; this is not the true receding CA. To overcome this limitation, the standard "volume decrement" method for sticky superhydrophobic substrates for which drop breakup was observed was used. Further details regarding this contact angle measurement method can be found in EXAMPLE 2. For the sticky superhydrophobic substrates, measurement of the advancing CA was also complicated. Interaction of the water drop with a "sticky" superhydrophobic paper surface is described by the Wenzel regime on a micrometer scale. The Wenzel regime is characterized by a very high hysteresis and therefore many closely placed metastable states. This means that a range of advancing contact angles are possible depending on the force used to press the drop against the substrate. Since no quantitative measure of force was possible with the goniometer used, a slight variability in the advancing CA values was observed in the current studies relative to the CA values recited in EXAMPLE 1. For example, the advancing CA of sticky superhydrophobic HS reported in EXAMPLE 1 and this example are 140°±1.7° and 159.4°±7.7°, respectively.

Next, the contact line was analyzed by microscope. Drops with appropriate volumes were dispensed onto sticky superhydrophobic paper (HS) surfaces that had been attached to microscopic slides. The existence of a superhydrophobic contact angle made it impossible to obtain a clear microscopic image of three-phase contact lines due to the lensing effect of the drops. Hence, the water drops were allowed to evaporate until a hydrophilic contact angle was observed and the contact line was then imaged with a Leica microscope (DM4500 B) using a 10× objective.

The effects of the paper making parameters on achievement of superhydrophobicity will now be discussed. The superhydrophobicity imparted to paper substrates resulted from the combination of a low surface energy film and two-scale roughness (nano-scale and micro-scale). As gleaned from EXAMPLES 1 and 2, the nano-scale roughness originated from the protrusion of crystalline domains on fiber surfaces after removal of the surrounding amorphous domains via selective plasma etching. On the other hand, the micro-scale roughness was determined by the topography of the paper fibers, in particular the fiber size and mesh size of the cellulose web. In this example, two key paper making parameters that affect the micro- and nano-scale roughness and thus the resulting superhydrophobicity of paper substrates: (1) fiber source and (2) paper making technology were explored.

The effects of fiber type will now be discussed. Cellulose paper is typically produced from hardwood fibers, softwood fibers, or a combination of the two. This classification of cellulose fibers is based on the trees from which they are obtained: hardwood fibers come from angiosperm trees (e.g., American yew, Common juniper, Douglas fir), and softwood fibers originate from gymnosperm trees (e.g., wild plum, peach, pear). Both fiber types have approximately the same chemical composition: cellulose (40-50%), hemicellulose (25-35%) and lignin (20-35%), but there is a significant difference in physical dimensions. Softwood fibers are usually larger than hardwood fibers roughly by a factor of two as shown in TABLE 8. Considering these facts, it was expected that: (1) different cellulose fiber types would show differences with regards to the evolution of nano-scale roughness during etching (exposure of crystalline domains) and (2) the different fiber sizes will impact differently the micro-scale roughness of the paper surfaces. In EXAMPLE 1, it was shown that both length scales contribute to superhydrophobicity. In order to investigate the role of fiber type in more detail, handsheets were fabricated from three different combinations of hardwood and softwood: 100% hardwood (H), 100% softwood (S) and 50% hardwood-50% softwood (HS). Other than the origin of the fibers, all procedures for handsheet fabrication were the same.

TABLE 8

Typical Dimensions of Hardwood and Softwood Fibers

| Fiber type | Fiber length, mm | Fiber width, $\mu$m |
|---|---|---|
| Hardwood | 1.0-1.5 | 16-22 |
| Softwood | 3.0-3.7 | 27-38 |

Figure 18:
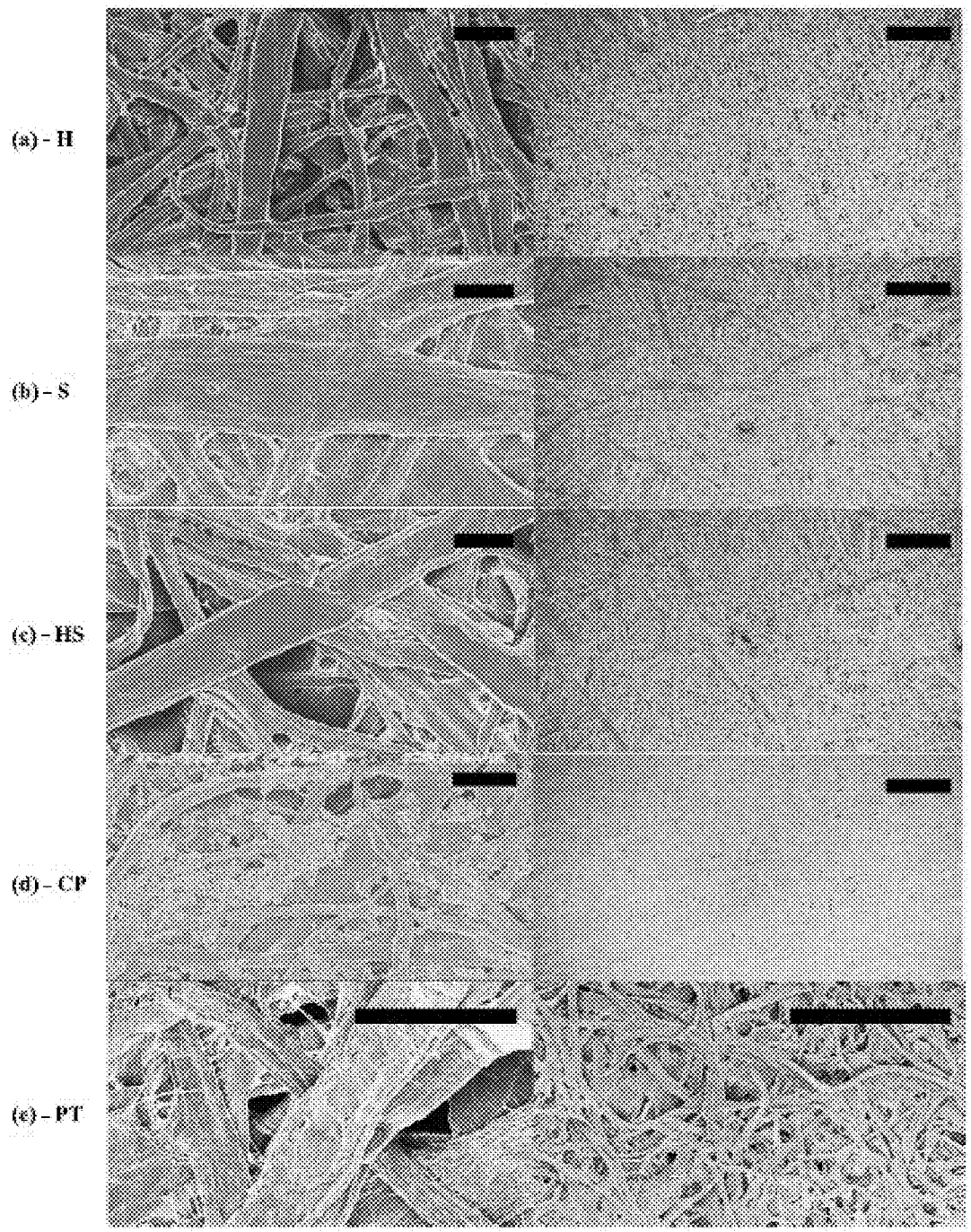
FIG. 18 provides high-(left) and low-magnification (right) SEM images of laboratory handsheets made with (a) 100% hardwood, (b) 100% softwood, (c) 50-50% hardwood and softwood, and two commercial paper samples, (d) copy paper, and (e) paper towel, wherein the scale bars correspond to 40 μm in the high-magnification images and 400 μm in the low-magnification images, in accordance with the embodiments of EXAMPLE 3.

FIGS. 18a-c show high and low magnification SEM images of untreated handsheets for 100% softwood, 100% hardwood and a 50-50% hardwood/softwood mixture, respectively. The larger size of softwood fibers in comparison with hardwood fibers was confirmed by the SEM images of FIG. 18a-c. In addition, it was confirmed by SEM images (not shown) that a thin film of PFE (about 100 nm) deposited on unetched handsheets did not alter the roughness (on either the micro- or nano-scale) of the handsheet surface (H, S, HS). This PFE deposition without oxygen etching yielded "sticky" superhydrophobic properties for all three handsheets with the following advancing and receding CAs: H ($CA_{adv}/CA_{rec}$)–154.3°±1.99 12.5°±5°, S ($CA_{adv}/CA_{rec}$)–149°±2.5°/8.5°±5° and HS ($CA_{adv}/CA_{rec}$)–159.4°±7.7°/9.65°±5.8°. The fact that the advancing and receding CAs were similar for all three handsheets confirmed that the differences in micro- and nano-scale roughnesses due to variations in fiber types did not significantly affect the "sticky" superhydrophobic behavior.

Figure 19:
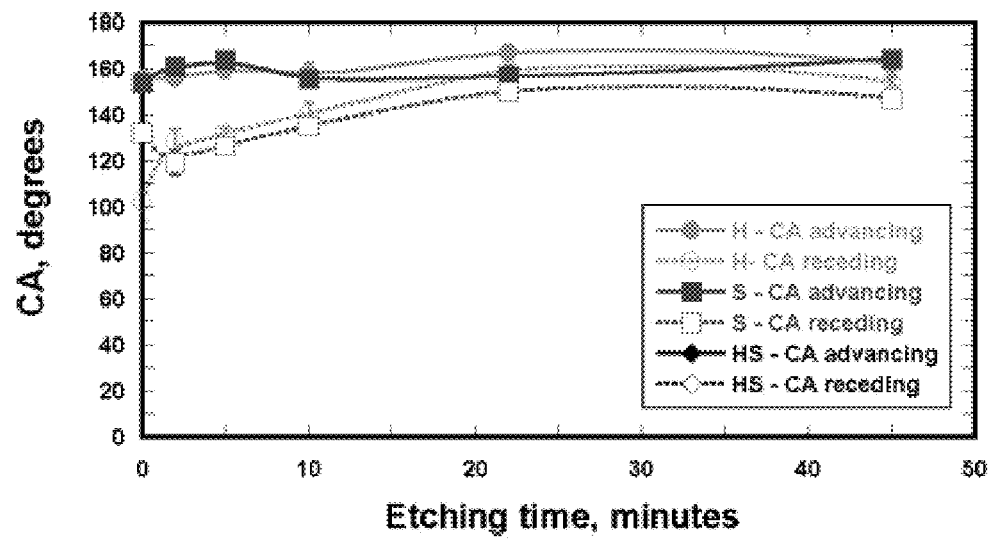
FIG. 19 graphically illustrates advancing CA and receding CA of handsheets (H, S, HS) with respect to oxygen plasma etching time for 2 minute PFE depositions to a thickness of about 100 nm in accordance with the embodiments of EXAMPLE 3.

In subsequent experiments, handsheets were etched in an oxygen plasma for different durations before depositing the PFE film. FIG. 19 displays plots of advancing and receding CAs for the different handsheets as a function of oxygen etching time. These graphs show the transition from "sticky" to "roll-off" superhydrophobicity (contact angle hysteresis<10°) after about 30 minutes of etching for all substrates. The curves in FIG. 19 overlap, showing that the rate of change of advancing and receding CAs, which is closely connected to the evolution of nano-scale features, was indistinguishable for the three handsheets within experimental error. Indeed, there were no noticeable differences between the sizes of the nano-scale features formed on etched hardwood and softwood fibers (SEM images not shown). These results verified that there is no significant difference between the nano-scale features formed on fibers of different types. In conclusion, different fiber type did not appear to affect the superhydrophobic behavior provided that the paper making procedures are constant.

The effects of paper making will now be discussed. The pulping process and the paper machine configuration vary from mill to mill in order to optimize paper properties for specific applications. The process generally involves the following steps: after wood chips are pulped and bleached, the paper web is formed in the paper machine, after which it undergoes a variety of mechanical treatments (pressing, drying and calendering) before being collected on a large roll. All of these steps of the paper making process ultimately affect the roughness of the final paper surface. Again, each paper mill uses a unique set of paper making procedures and sequences depending on the application of the final paper product. This example does not involve a comprehensive investigation of the large number of parameters invoked in paper making and their effect on superhydrophobicity. Rather, selected were two different paper types (apart from the laboratory-made handsheets) that were fabricated for unique and distinct applications: (1) a commercial copy paper (CP) which is moderately hydrophobic to yield good printability and (2) a paper towel (PT) which is extremely hydrophilic to provide high absorptivity. The copy paper and paper towel also represent two extremes of porosity and hence micro-scale roughness. Finally, the copy paper contains a significant amount of filler particles which are of similar size to the nano-scale features formed during oxygen plasma etching. The intent in this part of this example is to explore the superhydrophobic properties of copy paper and paper towels in order to obtain insight into the effect of paper-making parameters on superhydrophobicity.

The SEM images in FIGS. 18d and e show high and low magnification SEM images of untreated CP and PT, respectively. Of these two samples, the copy paper is most similar to the handsheets. The main difference was the presence of (inorganic) filler particles on the fiber surface (shown in FIG. 18d). The paper towels had a noticeably more porous surface with very loosely cross-linked fibers, since these substrates were designed for superior absorption properties. From the SEM images, it was evident that these substrates had very different surface roughness values prior to plasma treatment.

Figure 20:
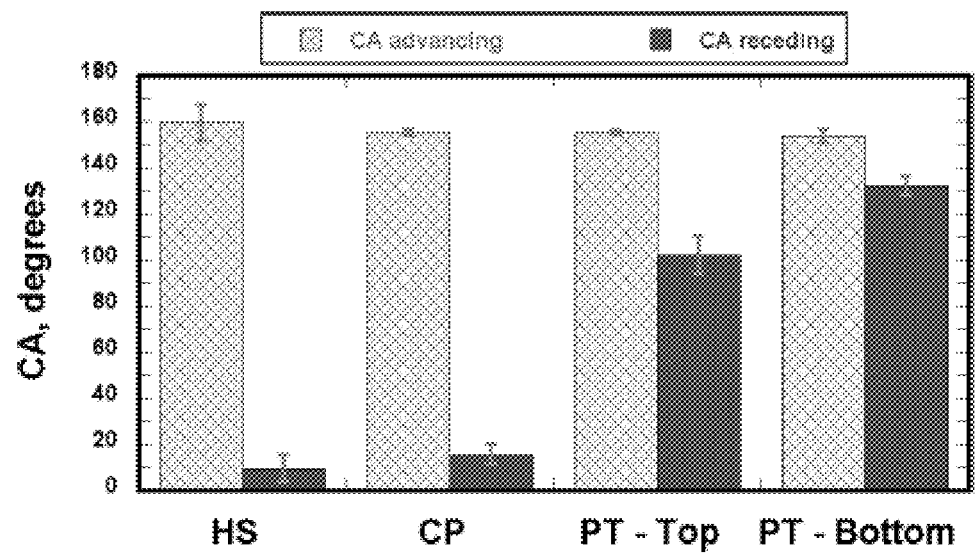
FIG. 20 graphically illustrates advancing and receding CAs of handsheet (HS), copy paper (CP), paper towel-top side (PT-top), and paper towel-bottom side (PT-bottom) after 2 min PFE deposition to a thickness of about 100 nm and without oxygen etching in accordance with the embodiments of EXAMPLE 3.

The untreated copy paper displayed an advancing CA of about 79.15°±3.37°, which confirmed its moderately hydrophobic behavior. For the untreated paper towel, the water drop was absorbed into the paper within one second; therefore, CA values could not be measured. After deposition of a thin film of PFE (without oxygen etching), the CP and PT substrates yielded different superhydrophobic behavior than that of the HS substrate, as shown in FIG. 20. The difference in receding CA values between the samples was attributed to differences in the micro- and nano-scale roughness that resulted from the distinct processing conditions in the paper mills (evident from the SEM images in FIG. 18). The advancing and receding CA values for CP, which was most similar to the HS handsheet with regard to fiber composition, were analogous to the values obtained for HS. However, the PT showed a very different receding CA relative to those for HS and CP. The increased values of the receding CA (decreased CA hysteresis) of the PT were attributed to the increased micro-scale roughness resulting from the increased porosity of this substrate. In addition, the PT showed different superhydrophobic behaviors on the two sides of the substrate (labeled PT-top and PT-bottom in FIG. 20). Although the SEM images did not reveal a significant difference between the two sides, the distinct CA values were believed to be due to the different roughness scales generated on the felt side and wire side of the paper during the manufacturing process, usually referred to as "two sidedness of paper." The copy paper did not show a difference in superhydrophobic behavior between the top and bottom sides, which was expected since applications for copy paper generally require that it has the same physical and chemical properties on both sides.

Figure 21:
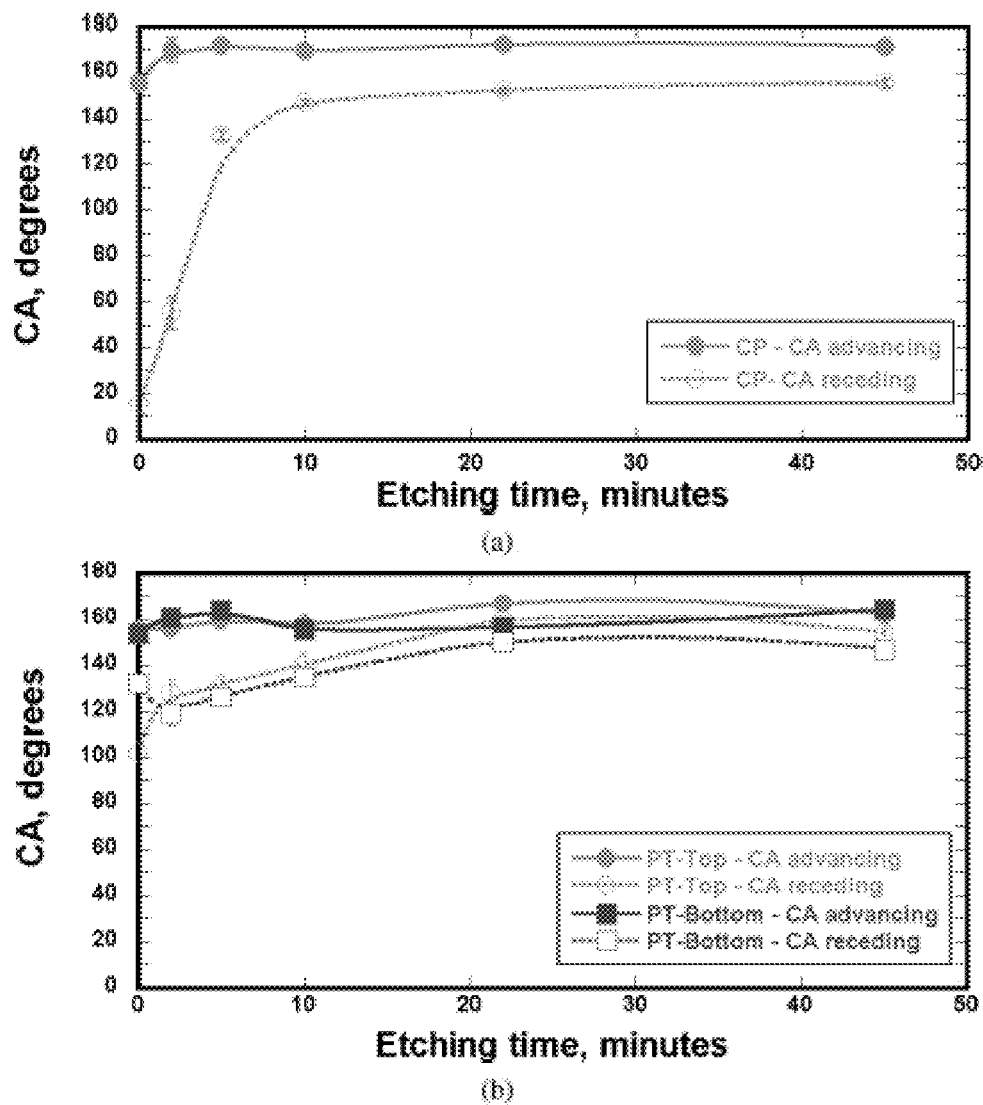
FIG. 21 graphically illustrates advancing CA and receding CA of 21(a) copy paper (CP) and 21(b) paper towel (PT-top and PT-bottom) with respect to oxygen plasma etching time for a 2 minute PFE deposition in accordance with the embodiments of EXAMPLE 3.

The paper substrates (CP, PT-top and PT-bottom) were subsequently etched in an oxygen plasma environment for different durations prior to PFE deposition. The advancing and receding CAs of these substrates with respect to oxygen etching times are shown in FIG. 21. It was evident from FIG. 21 that "roll-off" superhydrophobic behavior could be obtained for all samples tested, in spite of significant differences in paper making methods. Indeed, the nano-scale roughness established by oxygen etching, which is responsible for the "roll-off" superhydrophobic behavior, was similar for all papers (SEM images not shown).

In conclusion, the difference in CA hysteresis between various paper samples (FIG. 20) resulted in differences in the adhesion of water drops on these substrates. This demonstrated that, by control of the paper making processes, adhesion of water drops on a superhydrophobic paper surface can be tuned. Also, after the paper substrates were etched, the formation of nano-scale roughness dominated the superhydrophobic behavior, thereby leading to more similar wettability for all tested paper substrates. Although the experiments of this example do not represent a comprehensive study of the array of paper making parameters, they do provide a general picture of the effects of these parameters on superhydrophobicity as established by the plasma treatment process of the present invention. Furthermore, it can be concluded that, provided the fibers can be etched to create nano-scale features, superhydrophobicity can be imparted on any paper surface irrespective of the fiber origin or paper making technique. Those skilled in the art to which this disclosure pertains will recognize that these results can be applicable to other polymeric systems, too.

The design of superhydrophobic paper surfaces by optimization of fiber type and plasma processing conditions will now be discussed. Longer softwood fibers are usually responsible for paper strength, while shorter hardwood fibers are predominantly responsible for the paper shininess because of reduced roughness. The experiments of this example indicated that oxygen etching ultimately reduced the shininess of the paper by creating nano-scale roughness, so that the presence of hardwood fibers no longer provided enhanced optical properties in the etched handsheets. Therefore, it is believed that the fabrication of superhydrophobic paper based on softwood fibers was the most desirable approach because of the expected increased physical strength.

For longer PFE deposition times than were shown in the preceding figures (e.g., 15 minutes), roll-off superhydrophobic behavior could only be achieved after 60 minutes etching (data not shown); while for 2 min PFE deposition times, roll-off was observed after much shorter etching times (about 30 minutes), as described in EXAMPLE 2. These results were due to smoothing of the topography of the roughened surface that occurred during the deposition of a thicker PFE film. Since prolonged oxygen etching damaged the fiber surfaces, it had a significant negative impact on the strength of the paper, which is undesirable. Therefore, it is most desirable to obtain roll-off superhydrophobicity at reduced etch times. It is expected that an optimum PFE thickness exists: thick enough to retard the absorption of water, yet thin enough to prevent smoothing of the morphology created by oxygen etching. The results suggest that a film of about 100 nm, obtained from a 2 min PFE deposition, was a near-optimum thickness to achieve a roll-off superhydrophobic paper surface with good physical properties. Of course, optimizing the paper making process to tune the micro-scale roughness can offer an additional degree of freedom for the design of superhydrophobic paper surfaces.

The effect of drop size on contact angle and edge geometry will now be discussed. Measurement of contact angles on rough surfaces is more complex when the drop size is comparable to the roughness length scale of the substrate. Advances in drop dispense technologies have made it possible to vary the dispensed volume of a water drop in a controlled manner from a few picoliters to a few microliters. Here, results that describe the significance of the water drop size when measuring CAs on paper surfaces are presented.

Figure 22:
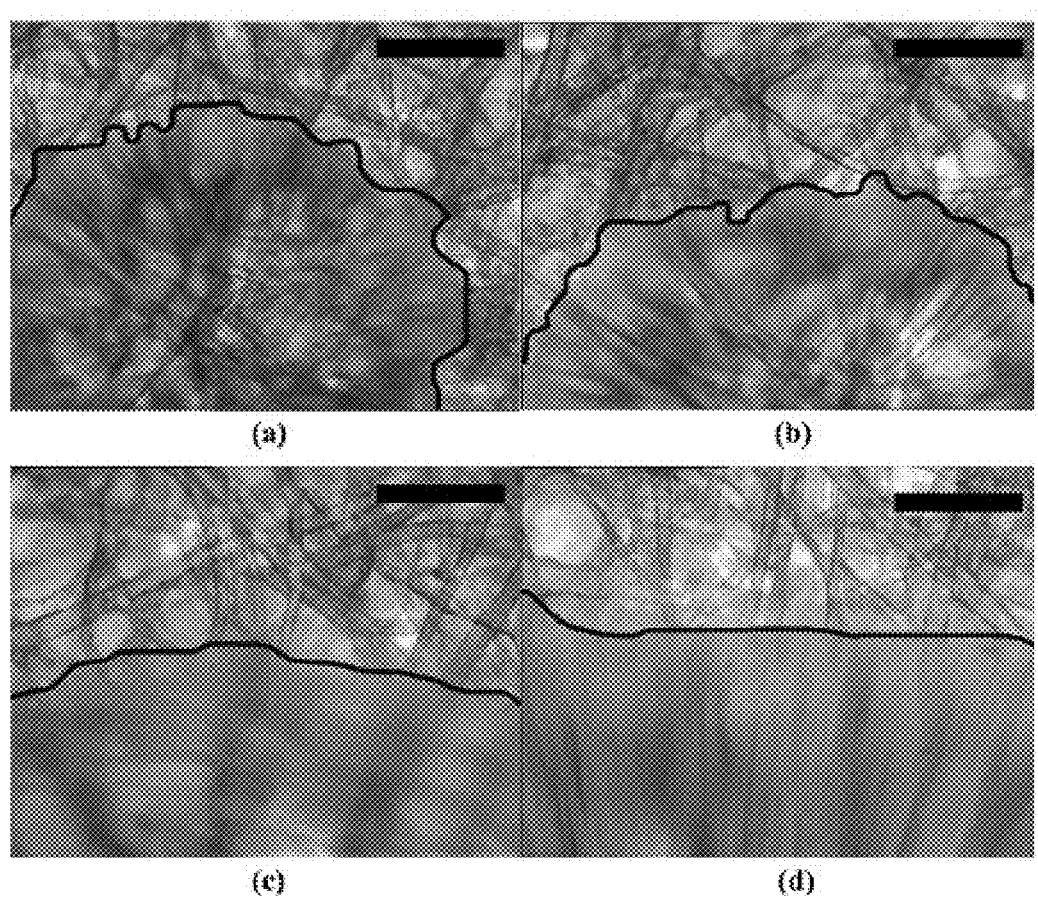
FIG. 22 illustrates the contact lines formed by 22(a) 0.1 μl, 22(b) 0.2 μl, 22(c) 4 μl, and 22(d) 8 μl water drops on a 2 minute PFE deposited (without etching) HS substrate, wherein the scale bars correspond to 160 μm in accordance with the embodiments of EXAMPLE 3.

FIG. 22 shows the contact line established by water drops of four different volumes on a HS handsheet with CA characteristics shown in FIG. 20. Solid lines were drawn along the three-phase contact lines to highlight the contact line geometry. Clearly, the contact line was more distorted by the topography of the fiber network for smaller drops (FIGS. 22a and b) than for larger drops (FIGS. 22c and d).

Figure 23:
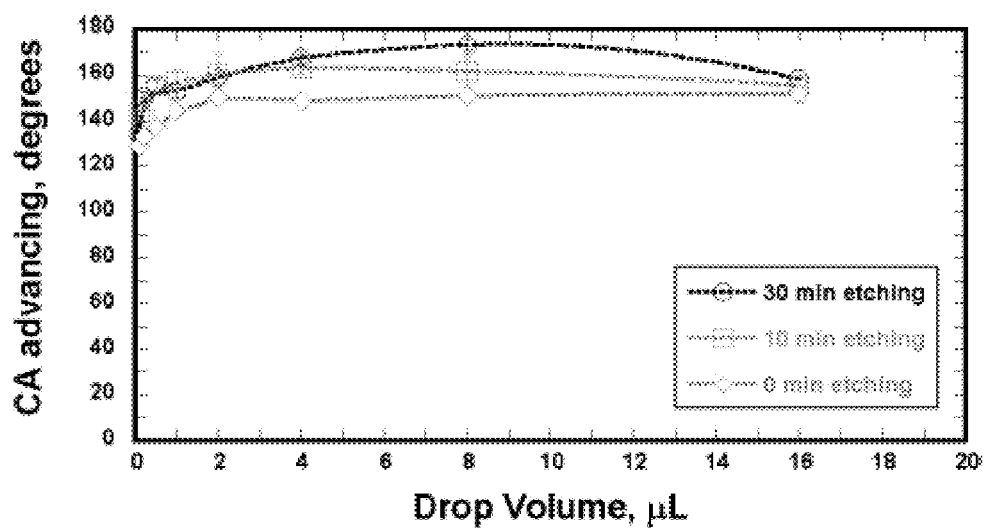
FIG. 23 graphically illustrates advancing CA with respect to drop volume for oxygen etched (0, 10 and 30 minute) and PFE deposited (2 minutes) handsheet surfaces in accordance with the embodiments of EXAMPLE 3.
Figure 24:
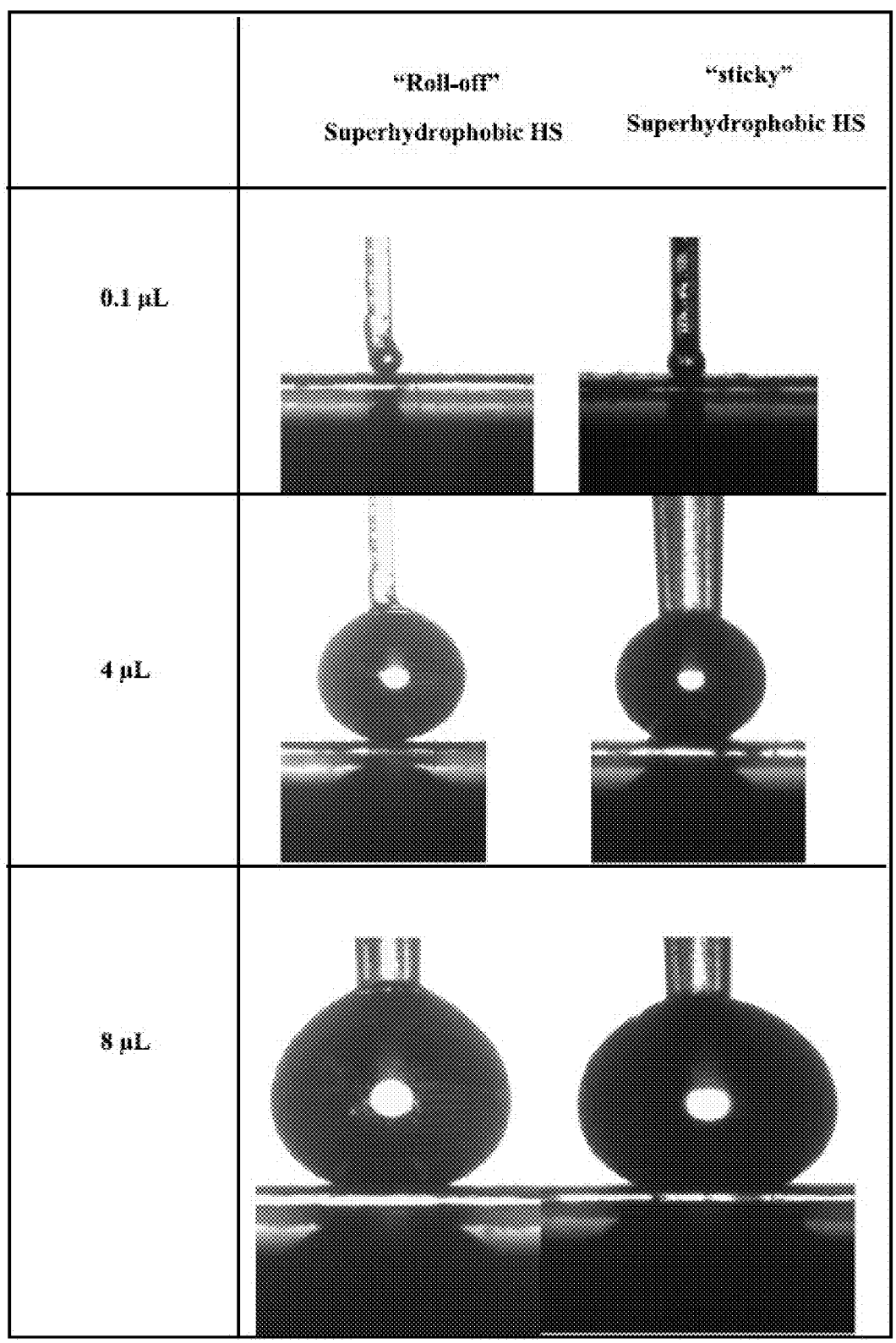
FIG. 24 provides photographs of advancing CA for different drop volumes for "roll-off" superhydrophobic (no oxygen etching and 2 minute PFE deposited) and "sticky" superhydrophobic (30 minute oxygen etch and 2 minute PFE deposited) handsheet (HS) surfaces in accordance with the embodiments of EXAMPLE 3.

In order to determine the effect of contact line distortion on the measurement of CA, the drop volume was varied from 0.1 µl to 16 µl, and the advancing CA values were measured. FIG. 23 shows the advancing CA with respect to drop volume for HS substrates etched for three different etching durations. FIG. 24 shows the images of water drops corresponding to a 30 min etched HS ("roll-off" superhydrophobic) and an unetched HS ("sticky" superhydrophobic). From FIG. 23, it was concluded that the advancing CA increased up to a volume of about 2 µl. This suggested that a lower limit of drop volume should be used to measure CA on superhydrophobic paper surfaces. On the other hand, the upper limit depends on the angular resolution of the CA goniometer. As the drop volume increases, the drop flattens due to gravity, which makes it difficult to locate exactly the three-phase contact point from a side view of the drop. This limitation can greatly affect the accuracy of CA values, which is consistent with the observation of a slight decrease in the advancing CA values for the 16 µl drop (FIG. 23). Hence, it is suggested that in order to mitigate ambiguity in CA values when measuring contact angles on porous, heterogeneous substrates such as paper, it is important to select drop sizes that (1) are larger than the length scale of fibers (to avoid the distortion of the contact line by fiber web) and (2) provide sufficient image resolution for the goniometer to identify the three-phase contact line.

In summary, the effects of fiber type and paper making parameters on the creation of superhydrophobic paper surfaces were studied in this example. The different fiber types and the paper making techniques did not affect the superhydrophobicity, provided that the fibers could be etched to create the necessary nano-scale surface features. Paper made from softwood fibers is likely to be more suitable for superhydrophobic applications because of improved physical properties with this fiber type, in particular paper strength. A PFE film of about 100 nm in thickness represented a near-optimum thickness to obtain superhydrophobicity. The importance of water drop volume in the measurement of CAs on superhydrophobic surfaces fabricated on heterogeneous and porous substrates such as paper was also discussed.

EXAMPLE 4

Directional Mobility and Adhesion of Water Drops on Patterned Superhydrophobic Surfaces In this example, directional mobility and controlled adhesion of water drops were obtained on superhydrophobic paper surfaces by generating high surface energy ink patterns using commercial desktop printing. By changing the curvature/shapes of the ink patterns, geometrical constraints were imposed on the movement of the three-phase liquid/solid/vapor contact line. With proper design of pattern shapes, the critical sliding angle of water drops was manipulated with respect to different directions. Adhesion tunability of water drops on superhydrophobic paper was established by design of chemical heterogeneity. Printing of 'checker' ink patterns with appropriate area fraction and feature dimensions allowed variation in the critical sliding angle of water drops. The manipulation of directional mobility and adhesion of water drops on superhydrophobic paper surfaces allows the design of novel components such as two-dimensional (two-dimensional) flow paths, gates/diodes, junctions, and drop size filters for emerging two-dimensional paper-based microfluidics technology for biomedical diagnostic applications.

EXAMPLE 1 described fabrication techniques for obtaining roll-off and sticky superhydrophobic behaviors on paper surfaces via plasma processing. EXAMPLE 3 described the ability to tune adhesion forces on superhydrophobic paper surfaces between two extremes (roll-off and sticky) by controlling the topography of the cellulose fibers by means of selective plasma-enhanced etching, fiber types and paper-making techniques. The objective of this example was to create surfaces with anisotropic drop mobility by using ink patterns on superhydrophobic paper.

Paper handsheets were prepared with a combination of 50% hardwood and 50% softwood fibers according to TAPPI standardized method T205 sp-02, and as described in EXAMPLE 1. The handsheets were selectively plasma etched with oxygen gas (0.55 Torr) and a thin (about 100 nm as determined by deposition onto a flat silicon substrate) fluorocarbon film was subsequently deposited onto the etched surface by plasma-assisted deposition (1 Torr) using PFE precursor. A more detailed discussion of the methods to fabricate superhydrophobic paper can be found in EXAMPLE 1.

All printed ink patterns other than the checker ones were designed with Adobe Photoshop (version 7.0; Adobe Systems Inc., San Jose, Calif.). The 'checker' patterns were designed through MATLAB (version 7.6.0; The MathWorks Inc., Natick, Mass.). For the 'checker' patterns, itemized as a, b, c and d in the control of adhesion discussion below, a predefined square area was divided into square matrices with 750×750, 250×250, 1400×1400 and 1200×1200 cells, respectively. All pixels constituting the cells of the matrix were designated white color ([R G B]=[255 255 255]) to ensure a white background. For the patterns labeled a and b, starting from the left top cell (0, 0), the pixels in every second cell (in both x and y directions) were designated 'black' color ([R G B]=[0 0 0]). For the patterns labeled c and d, starting from the left top cell (0, 0), the pixels in every fourth cell (in both x and y directions) were designated 'black' color ([R G B]=[0 0 0]). The SH paper was pasted on a piece of copy-paper using SCOTCH tape and fed through a XEROX Phaser 8500n (Xerox Corporation, Norwalk, Conn.) printer to generate the patterns.

'Checker' patterns with variable areal ink fractions on SH paper were imaged with a Leica optical microscope (DM4500 B) using a 2.5× objective. The images were then processed using Image-J (Java-based image processing program developed at the National Institutes of Health). For all imaged 'checker' substrates, a threshold value was chosen to differentiate the 'ink' pixels from the SH paper background by analyzing the histogram of pixel intensities in the image. This threshold value was then used to generate a binary black-and-white image, from which the 'total area', 'area fraction' and 'number of features' of the ink were obtained via standard Image-J procedures. Assuming square ink islands, the square root of the area per feature was calculated to obtain the size of the ink features. The distance between features was determined by measuring the center-to-center distance between features; this procedure was repeated for different features to obtain statistically averaged values. The transformation from the length designation of pixels to the more physically meaningful length unit μm was carried out using the calibrated conversion factor for the microscope with the specific objective and camera used in the experiments.

The patterned SH paper substrates were mounted on a flat surface attached to a rotating optical stage. For the directional substrates, a drop with a specific volume was placed at the center of the pattern. For the 'checker' pattern substrates, a drop with a specific volume was placed randomly. After placing the drop on the horizontal substrate, the plate was tilted gradually until roll-off was observed; the critical sliding angle was obtained from the scale of the optical stage.

A discussion of the control of directionality will now follow. First, the aspects of a design for directional sliding will be discussed.

It has been well-established that drop sliding on a surface is primarily governed by movement of the three-phase liquid/solid/vapor contact line. This contact line can be divided into segments with advancing and receding contact lines, as observed at the advancing and receding edges of a sliding drop. The sliding of drops on inclined surfaces was extensively studied and modeled in the mid-twentieth century. In 1962, Furmidge surveyed the literature at that time and formulated the following semi-empirical force balance:

$$\sin\alpha = \frac{\gamma_{LV} W drop(\cos\theta_R - \cos\theta_A)}{\rho V g} \quad \text{Equation 25}$$

where α is the critical sliding angle, $\gamma_{LV}$ is the surface tension of the liquid, $W_{drop}$ is the width of the drop perpendicular to the direction of sliding, $\theta_A$ and $\theta_R$ are the advancing and receding contact angles of the drop on the surface, ρ is the density of the liquid drop, V is the volume of the drop and g is the acceleration due to gravity. From Equation 25, it is clear that the contact angles established at the advancing ($\theta_A$) and receding ($\theta_R$) contact lines are critical in determining the drop sliding behavior. The Furmidge equation was originally derived for the (imaginary) case of a two-dimensional drop sliding on an inclined surface. For a three-dimensional (three-dimensional) drop, the contact angle varies continuously along the contact line between the advancing and receding limits. In spite of this complication, the Furmidge equation has been shown to serve as a good approximation and has been applied successfully for more than 40 years.

Figure 25:
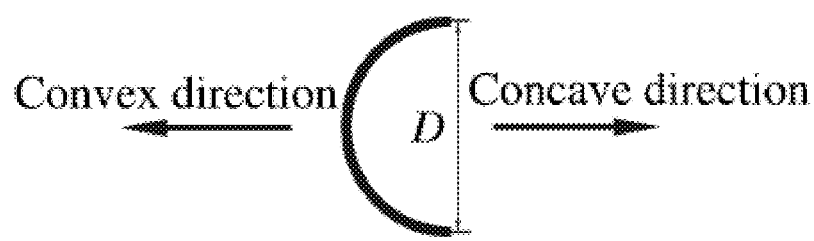
FIG. 25 graphically illustrates critical sliding angles in different sliding directions relative to drop volume for a semi-circular ink pattern printed on superhydrophobic paper substrate (D=2.55 mm), wherein the slide directions are defined in the schematic above the graph, in accordance with the embodiments of EXAMPLE 4.
Figure 25:
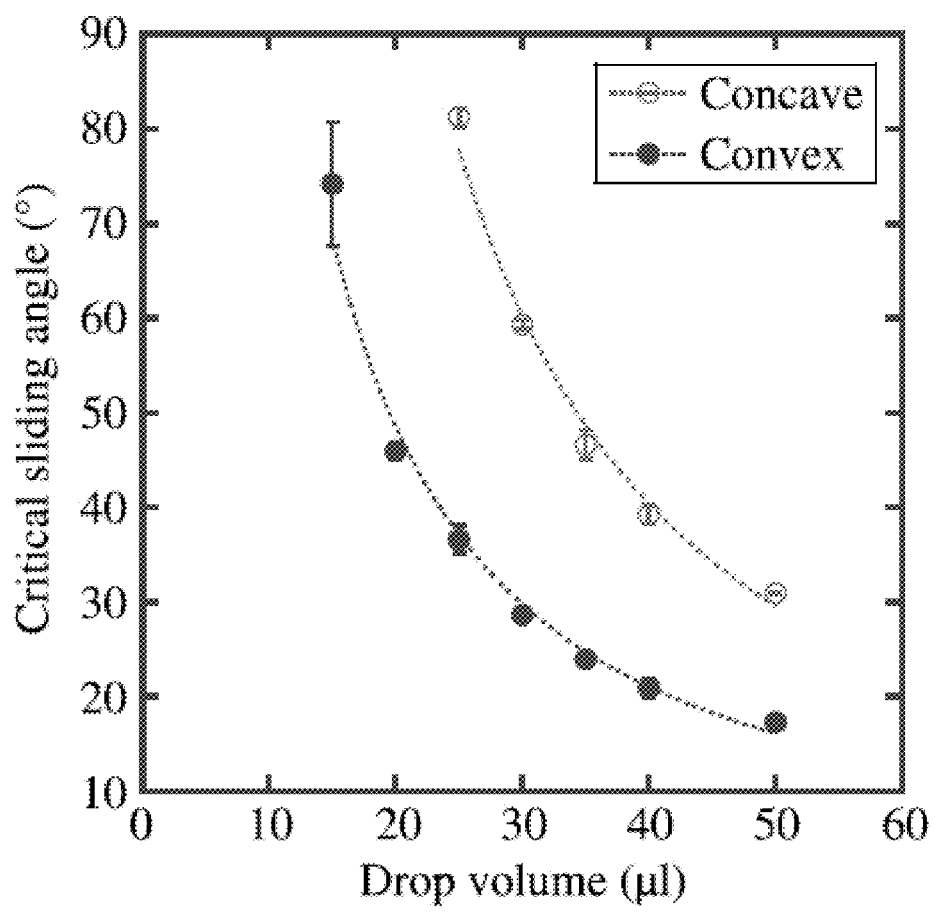

Consider a semi-circular ink pattern with diameter D printed on superhydrophobic (SH) paper, as depicted in FIG. 25. The surface energy of the ink film is higher than that of the SH paper, leading to advancing and receding CAs on the ink film that are always lower than those on the SH paper. If a water drop with a footprint diameter equal to the diameter of the semi-circle (D) is placed on the paper substrate, the semi-circle will be aligned with the contact line of the drop.

When the substrate is tilted towards the concave or convex direction of the pattern, the advancing contact line of the drop moves onto the SH paper surface; as a result, the ink pattern has no effect on the advancing CAs in either sliding direction. However, the receding contact line of the drop experiences different interactions with the ink pattern depending upon the sliding direction. For the concave direction, the ink curvature embraces the receding contact line of the drop; as a result, the receding contact line experiences only the ink surface until drop detachment from the pattern. For the convex direction, the receding contact line is more complex: during sliding, the receding contact line and semi-circular pattern form intersecting semi-circles. When the drop finally detaches from the pattern, the contact line and the pattern only touch each other at a single point. Therefore, during drop sliding in the convex direction, the majority of the receding contact line is always in the SH paper regime, while only a small fraction touches the ink film. Although the exact contact-line geometry is complex, the arguments advanced above support the qualitative hypothesis that the receding CA in the concave direction should be smaller than in the convex direction. Referring back to Equation 25, all terms on the right hand side of the equation, except for the receding CA ($\theta_R$), are constant for the both the concave and convex sliding directions. Hence, by imposing geometrical constraints on the receding contact line through the presence of an ink pattern, the $\theta_R$ value is altered, thus providing the ability to manipulate the critical sliding angle (a) in Equation 25.

The qualitative analysis described above indicates relative differences between CAs in the concave and convex sliding directions and provides new insight relative to that offered by the Furmidge equation. For a particular drop volume-pattern diameter combination, all terms on the right hand side of Equation 25 are the same for the two sliding directions except the receding CA. Because the receding CA for the concave direction is smaller than that in the convex direction as discussed above, the critical sliding angle ($\alpha$) will be higher for the concave direction. FIG. 25 shows a plot of the critical sliding angles for the concave and convex directions for various drop volumes on the semi-circular pattern with a diameter of about 2.55 mm. It is evident that the critical sliding angle in the concave direction was consistently higher for all drop volumes investigated.

Figure 26A:
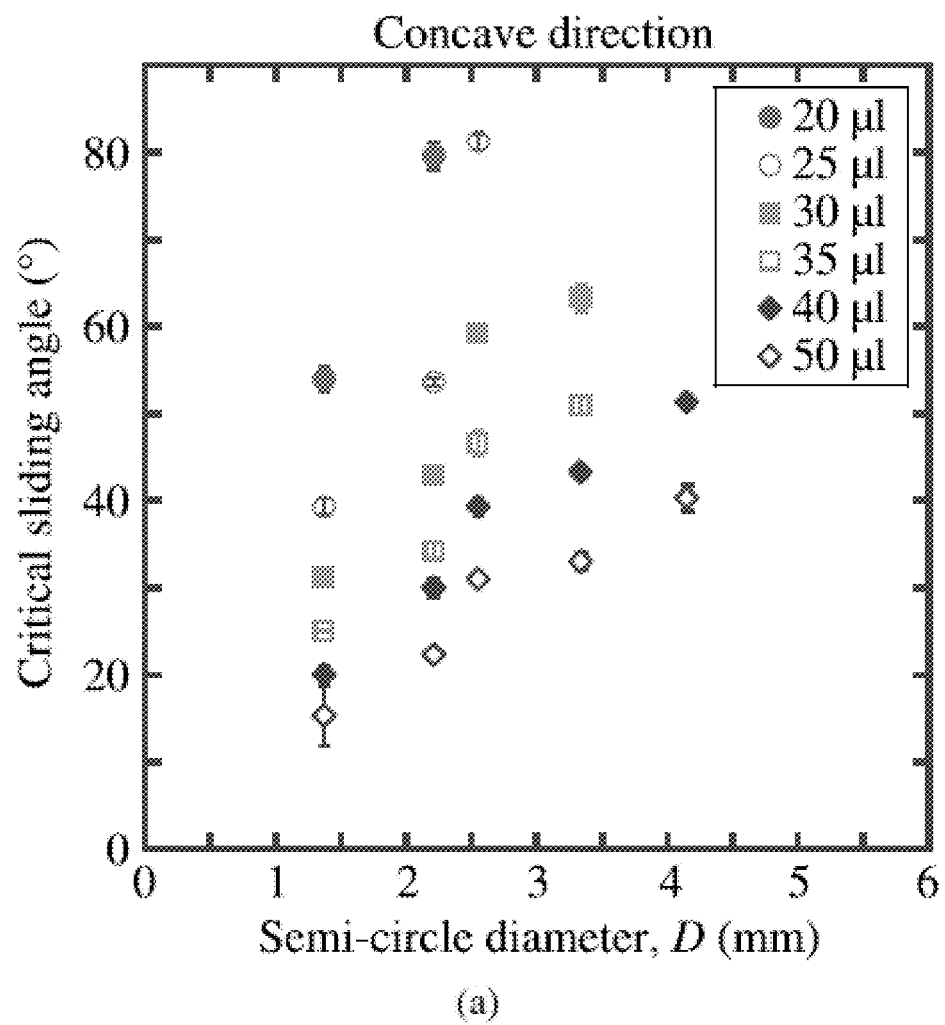
FIG. 26 graphically illustrates the critical sliding angle relative to diameter of semi-circular ink patterns printed on superhydrophobic paper substrates for various drop volumes in 26(a) concave 26(b) and convex sliding directions (see FIG. 25 for definition of sliding direction) in accordance with the embodiments of EXAMPLE 4.
Figure 26B:
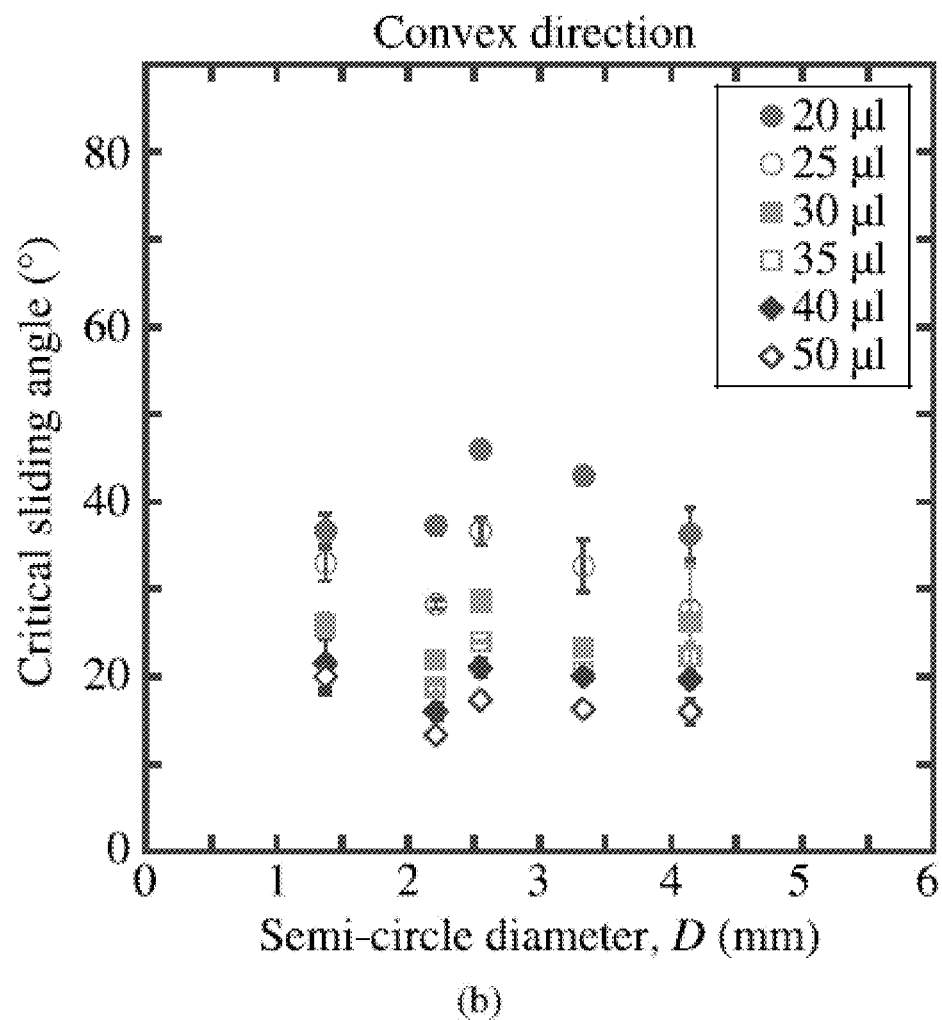

To further investigate this directional sliding behavior, the critical sliding angles for a variety of semi-circle diameters were studied. FIG. 26a shows a plot of the critical sliding angle relative to semi-circle diameter for the concave direction. For all drop volumes, the critical sliding angle increased with semi-circle diameter. For combinations of large semi-circles with small drops (diameter of about 3.33 mm for drop volume V<30 µl and diameter of about 4.14 mm for V<40 µl), drops slide along the curved semicircle towards the ends of the lines rather than breaking away from the pattern at the cusp of the semi-circle. Data points for such asymmetric roll-off events were not plotted in FIG. 26a. FIG. 26b shows a plot of the critical sliding angle relative to the diameter of semi-circles for the convex direction. Unlike the concave direction (FIG. 26a), the convex sliding direction (FIG. 26b) displayed no clear trend in critical sliding angle with respect to pattern size.

In concave direction sliding (FIG. 26a), the ink pattern curvature tried to embrace the receding contact line of the drop. As a result, the ink pattern size had a direct impact on the fraction of receding contact line touching the ink film: the larger the pattern size, the larger the fraction of receding contact line that touched the ink film. A larger ink-contact line interface enhanced the adhesion of the drop to the ink pattern and hence increased the critical sliding angle. Therefore, the critical sliding angle increased with semi-circle diameter (FIG. 26a). On the other hand, in convex direction sliding (FIG. 26b), because the receding contact line primarily experienced the SH regime, the ink pattern size had less effect on drop adhesion and thus on the critical sliding angle. For this reason, the critical sliding angle was essentially independent of semi-circle diameter (FIG. 26b).

Mathematical modeling of the critical sliding angle on semi-circular ink patterns is complex because the CA varies continuously along the contact line. Despite the lack of a quantitative model, the qualitative comparisons described above provide a reasonable understanding of water drop sliding behavior on the ink patterns. Clearly, critical sliding angles could be altered by establishing positive or negative curvature of ink patterns to achieve directional mobility of water drops on superhydrophobic paper surfaces.

Directional sliding of water drops on superhydrophobic surfaces may offer novel approaches for the design of two-dimensional microfluidic devices. By way of example, those skilled in the art to which this disclosure pertains will recognize that anisotropy can be exploited to create two-dimensional flow paths, valves/diodes, and junctions for drops on these surfaces. In the following, several examples of patterns that apply the concept described above to achieve specific droplet manipulation are presented.

Figure 27:
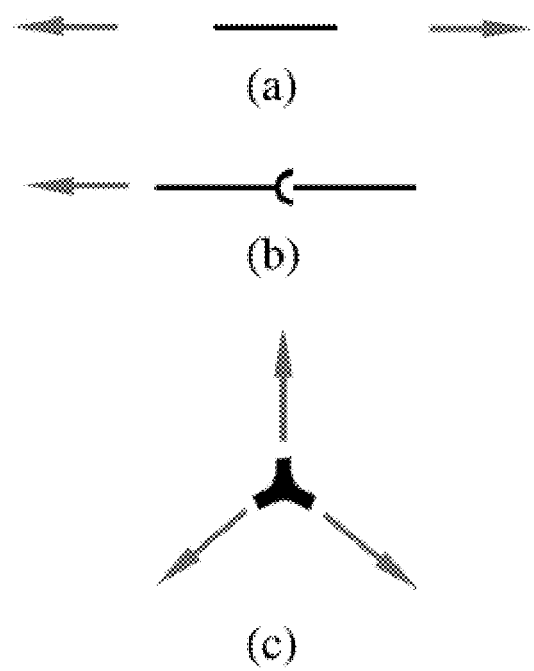
FIG. 27 schematically illustrates potential 27(a) flow path, 27(b) gate/diode, and 27(c) junction components designed for a two-dimensional microfluidic system generated by SH paper ink patterns in accordance with the embodiments of EXAMPLE 4.
Figure 28A:
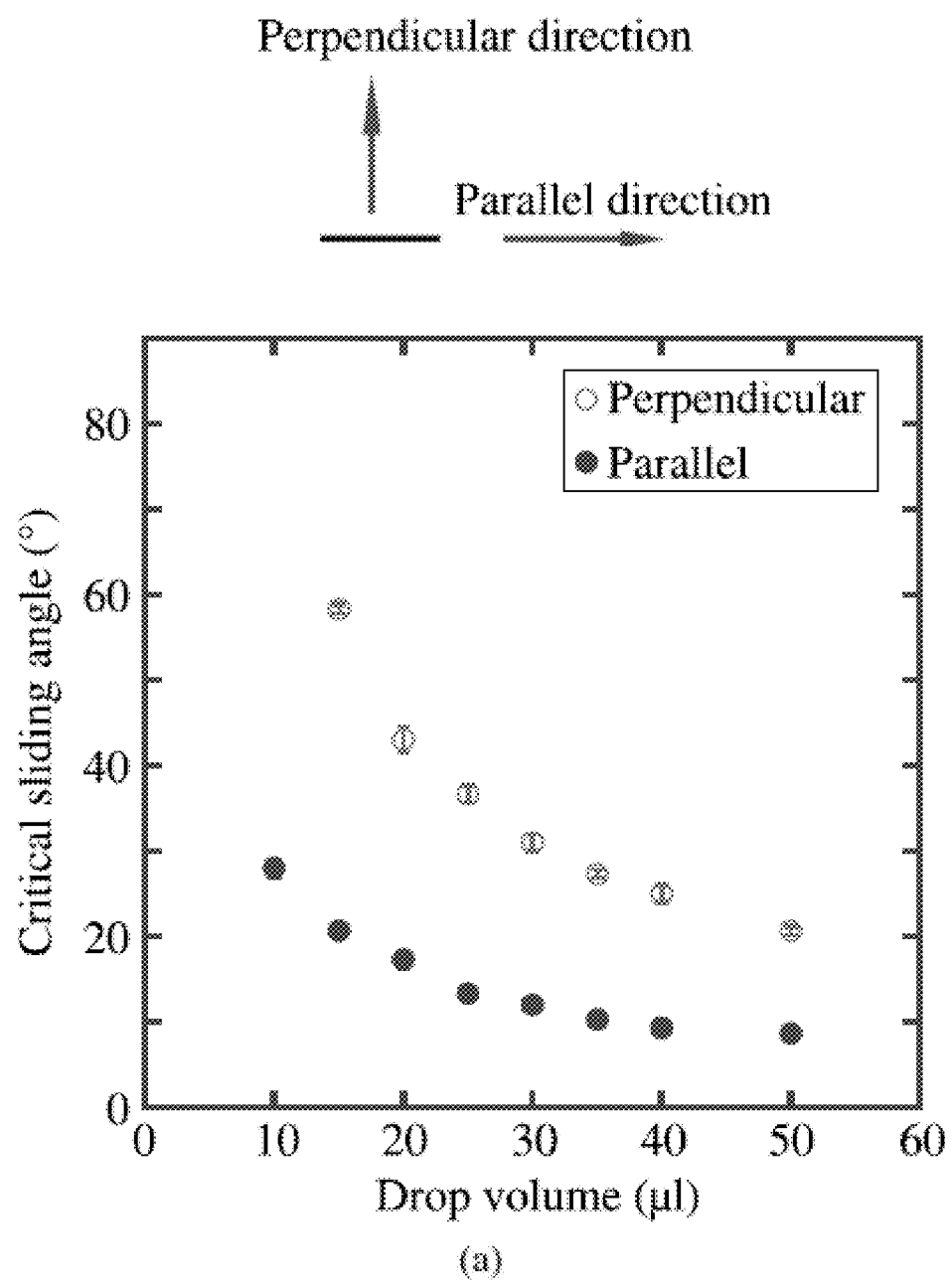
FIG. 28 schematically illustrates ink patterns with specific sliding directions (top) and graphically illustrates critical sliding angle relative to drop volume (bottom) for 28(a) flow path, 28(*b*) gate/diode, and 28(*c*) junction patterns in accordance with the embodiments of EXAMPLE 4.

FIG. 27a shows the simplest anisotropic design, a straight line. When a drop is placed on this line pattern, the width of the drop ($W_{drop}$) in the parallel sliding direction is always smaller than in the perpendicular sliding direction. This is because of the elongation of the drop along the line as a result of the higher surface energy of the ink line. The receding CAs for both sliding directions were similar to that of the receding CA on the ink. While the advancing CA in the perpendicular direction was similar to that of the advancing CA on SH paper, the advancing CA in the parallel direction was similar to that of the advancing CA on ink. Such behavior was expected, because as the drop slid along the line (parallel direction), the part of the drop that resided on the line always remained in contact with the ink film. Thus perpendicular direction sliding always has a larger width ($W_{drop}$) and advancing CA ($\theta_A$) relative to the parallel direction. Combining this qualitative analysis with the Furmidge equation (1), it was evident that drop sliding parallel to the line was easier than sliding perpendicular to the line. FIG. 28a clearly shows the anisotropy of drop sliding in directions parallel and perpendicular to a line (width=0.43 mm). A water drop placed on a line therefore moves easily along the line but needs a higher tilt angle to detach from the line in the perpendicular direction. This two-directional sliding functionality of the line pattern can be used to design two-dimensional flow paths for two-dimensional microfluidic devices. For example, those skilled in the art will recognize that lines can be used to ensure directional mobility of drops from one position to another on a two-dimensional microfluidic device by merely tilting the substrate.

Figure 28B:
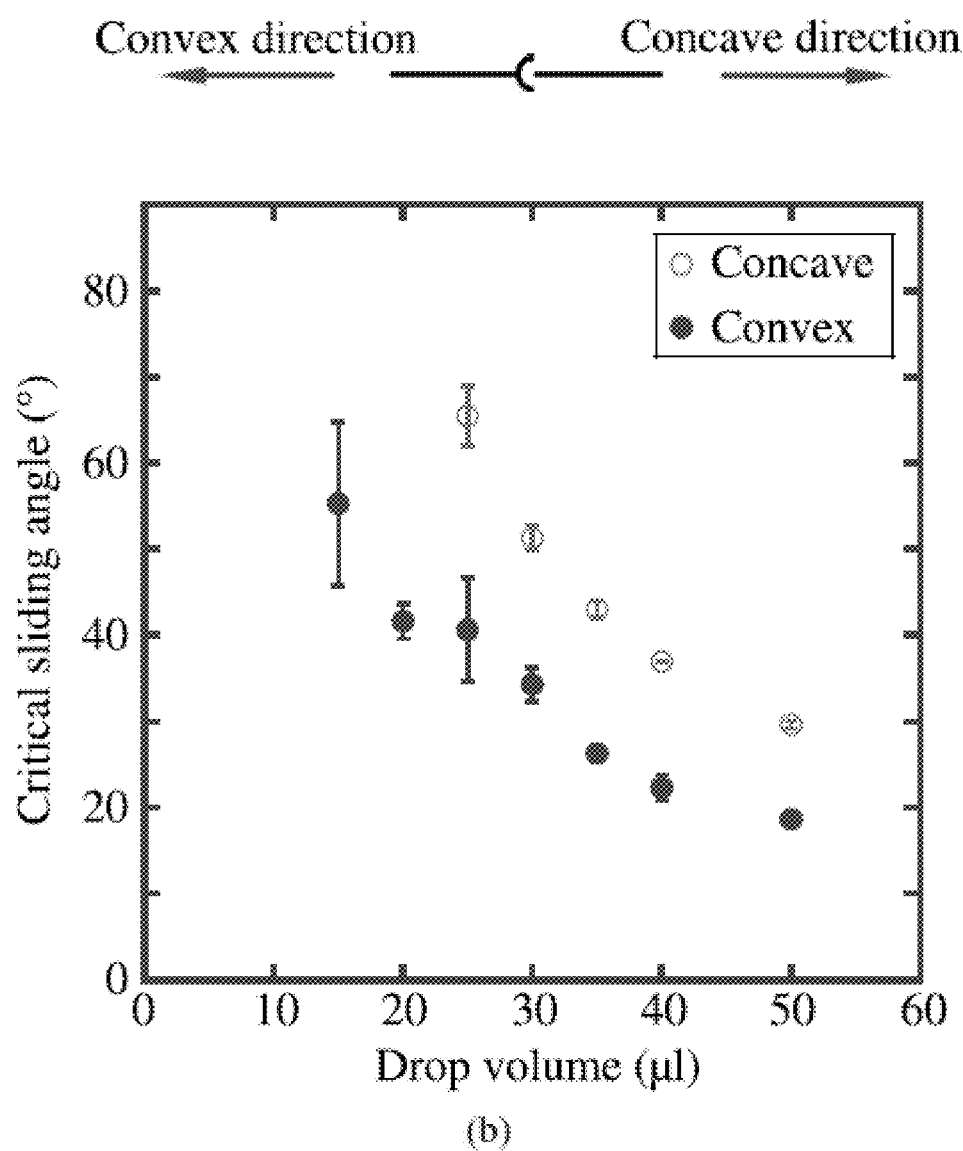

While a simple straight line pattern exhibits two-directional sliding, a semicircle can be inserted between two lines to establish anisotropy for sliding in one-direction only. FIG. 28*b* shows such a design which is composed of a semicircle (D=2.55 mm and width=0.52 mm) placed between two line elements (width=0.43 mm). As described above, a semi-circle exhibits preferential drop sliding toward the convex side of the semi-circle; lines are included in the design to create a defined flow path for drops moving toward and away from the semi-circle element. The intent in this design was to create a droplet gate or diode, which allows transport of the drop along the line only in one direction. FIG. 28*b* presents critical sliding angles in the concave and convex sliding directions for a variety of drop volumes. Comparison of these data with the results for an isolated semi-circle in FIG. 25 shows that the presence of lines near the semi-circle did not affect the directionality of drop sliding on the semi-circle. At the appropriate tilt angle, while a drop sliding along the line in the concave direction will have its movement inhibited by the semi-circle pattern, a drop sliding in the convex direction will pass the semi-circle unhindered. Of course, different drop volumes result in different sliding angle values for both directions during passage through the semi-circle gate. Those skilled in the art will recognize that the ability to exhibit different tilt angles for passage of different volume drops sliding in different directions on this pattern allows for the fabrication of two-dimensional gates/diodes and valves for two-dimensional microfluidic devices.

Figure 28C:
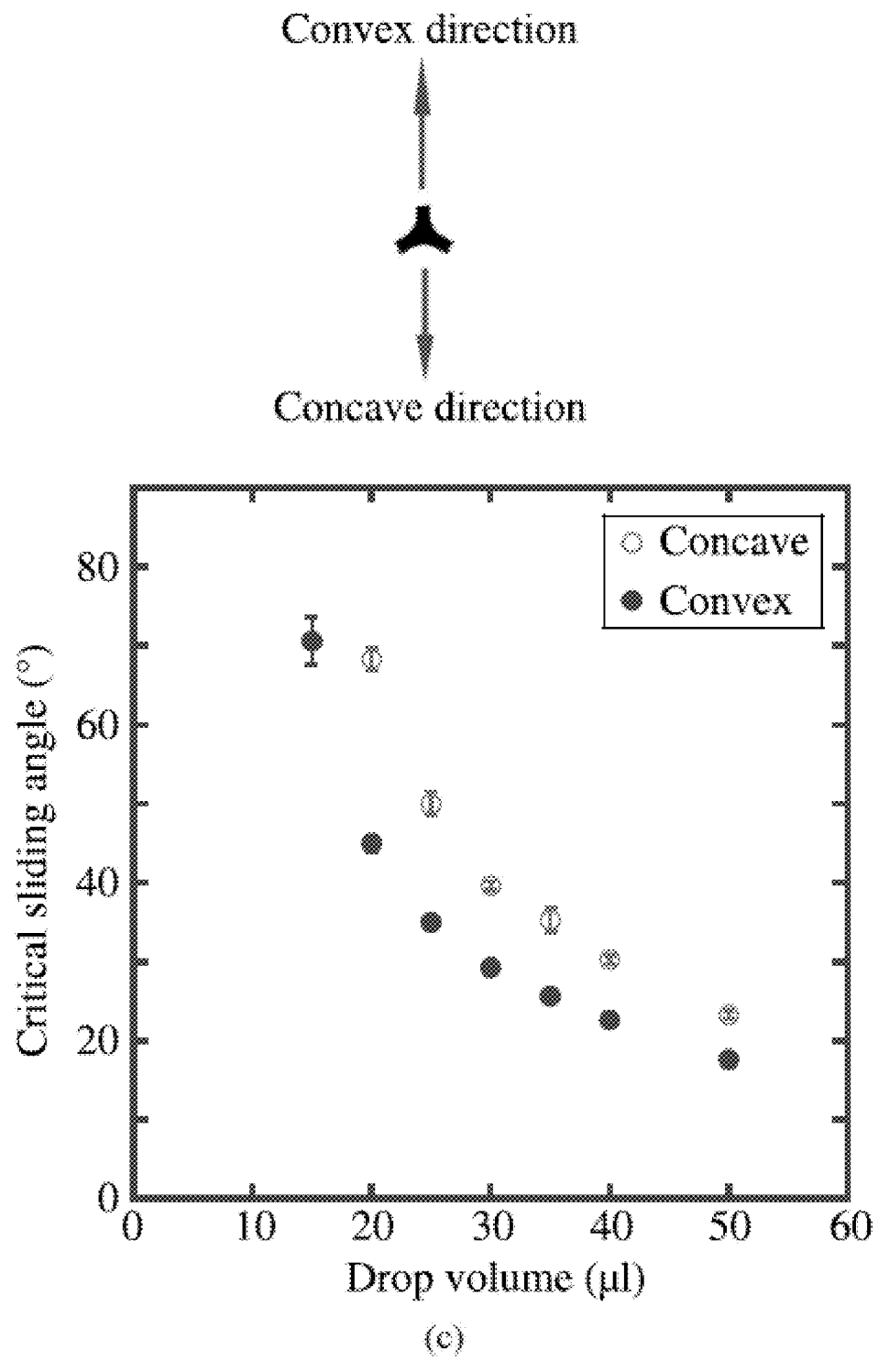

FIG. 27*c* is a schematic of a pattern created from three arcs (sections of semicircles with D=2.55 mm and width=0.52 mm) that touch each other. The center island was then filled with ink. As discussed above, for a single semi-circle, a drop slides more easily in the convex direction than in the concave direction because of the geometrical constraints imposed on the movement of the receding contact line. The same anisotropy applied for each of the three semi-circle sections in FIG. 27*c* and is evident from the results shown in FIG. 28*c*. Those skilled in the art will recognize that this functionality can be used to design two-dimensional junctions for flow paths on two-dimensional microfluidic devices. For example, two flow channels can be merged into a single channel using this tri-directional junction pattern.

The control of adhesion will now be discussed. Interaction of water droplets with ink or superhydrophobic surfaces offers the ability to tune the adhesion of water drops on superhydrophobic paper surfaces using ink patterns. In 1944, Cassie proposed the following model to predict the apparent contact angles observed on composite surfaces:

$$\cos\theta^* = \sigma_1\cos\theta_1 + \sigma_2\cos\theta_2 \qquad \text{Equation 26}$$

where $\theta^*$ is the apparent contact angle, $\sigma_1$ and $\sigma_2$ are the area fractions of the surface with intrinsic contact angle values $\theta_1$ and $\theta_2$, respectively. Equation 26 was originally formulated for a static drop. Later, Johnson and Dettre proposed that for a dynamic drop, the contact angle hysteresis (difference between the advancing and receding CAs) is more important than the static CA, and hence the above equation is not valid to explain the scenario of a dynamic drop on a composite surface.

It was also proposed that the contact angle hysteresis can, in principle, be altered by changing the area fractions $\sigma_1$ and $\sigma_2$. In addition to the area fractions, the contact angle hysteresis also depends on the vibrational energy of the drop and the height of the energy barriers between metastable states that the drop encounters immediately before roll-off occurs. Johnson and Dettre mathematically showed that a variety of hysteresis values can be observed for the same area fractions provided that the vibrational energy of the drop and the heights of energy barriers between metastable states differ. The two mathematical parameters invoked (defined as vibrational energy and the heights of energy barriers) were subsequently studied in more detail and related to the topography of the three-phase contact line. The work of Chen et al. demonstrated that the topography of the contact line can be altered by changing the sizes/shapes of the different surface elements on the composite surface. Finally, altering the CA hysteresis, or in other words the advancing and receding CAs, alters the critical sliding angle of water drops on the composite surfaces according to Equation 25. Therefore, previous studies in this field suggest that the hysteresis, or the critical sliding angle, can be altered by changing the area fraction and sizes/shapes of the different materials that make up the composite surface.

The fabrication of superhydrophobic surfaces with tunable sliding angles for a wide range of drop volumes is now described. Composite surfaces (a, b, c and d) were prepared by printing ink patterns comprising square ink dots as described above (see FIG. 29). The patterns in FIG. 29 were designed in such a way that the area fraction and feature size were varied independently. TABLE 9 shows the area fraction of ink, feature size of ink spot and distance between the ink spots for the four patterns (a, b, c and d) shown in FIG. 29. From TABLE 9, patterns a and b had the same area fraction (about 25%) of ink printed on the superhydrophobic paper. However, the ink spot size in FIG. 29*b* was larger than that in FIG. 29*a*. Similarly, patterns c and d had the same area fraction (about 8%) of ink but had different feature sizes (TABLE 9).

TABLE 9

| Ink features in checker patterns printed on superhydrophobic paper surfaces | | |
|---|---|---|
| Pattern | Area fraction (%) | Feature size (μm) | Distance between features (μm) |
| a | 25.4 ± 0.9 | 176.3 ± 3.4 | 346.8 ± 4.6 |
| b | 25.7 ± 1.2 | 532.9 ± 8.1 | 1041.5 ± 6.0 |
| c | 8.1 ± 0.2 | 107.2 ± 1.7 | 371.2 ± 1.2 |
| d | 7.9 ± 0.4 | 123.4 ± 2.7 | 431.7 ± 0.4 |

Figure 29:
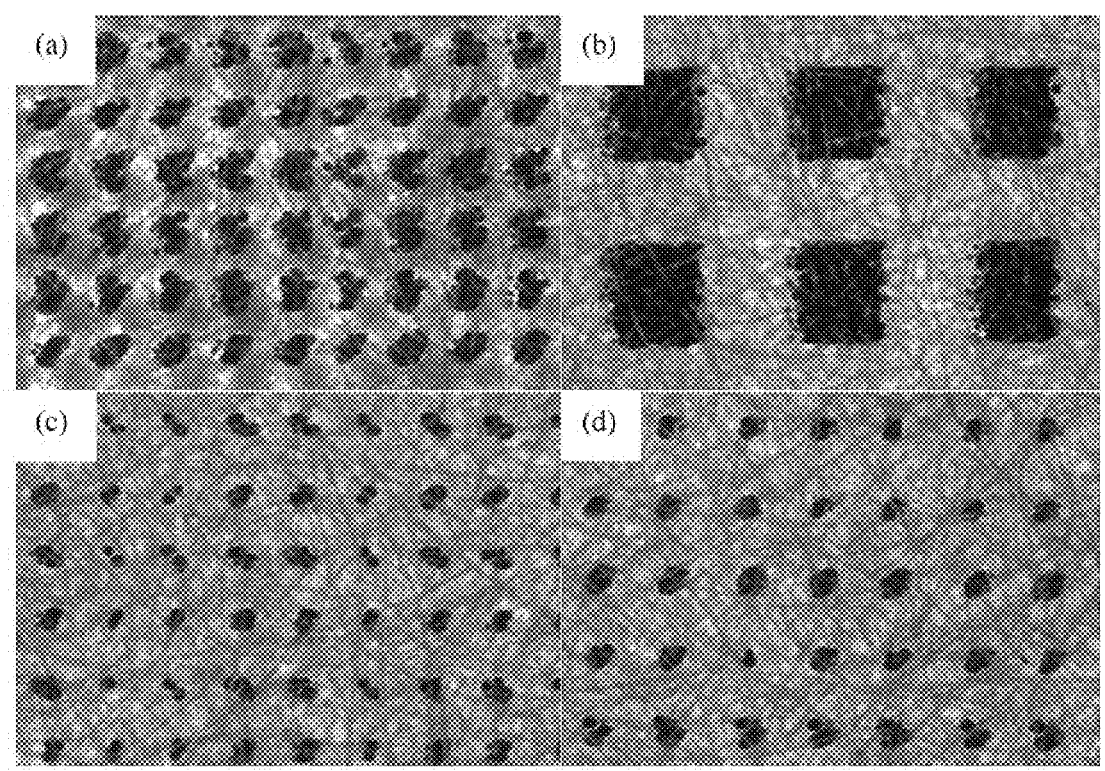
FIG. 29 provides bright field microscope images of checker patterns printed on superhydrophobic paper surfaces, wherein the sizes of the features are provided in TABLE 1 in accordance with the embodiments of EXAMPLE 4.
Figure 30:
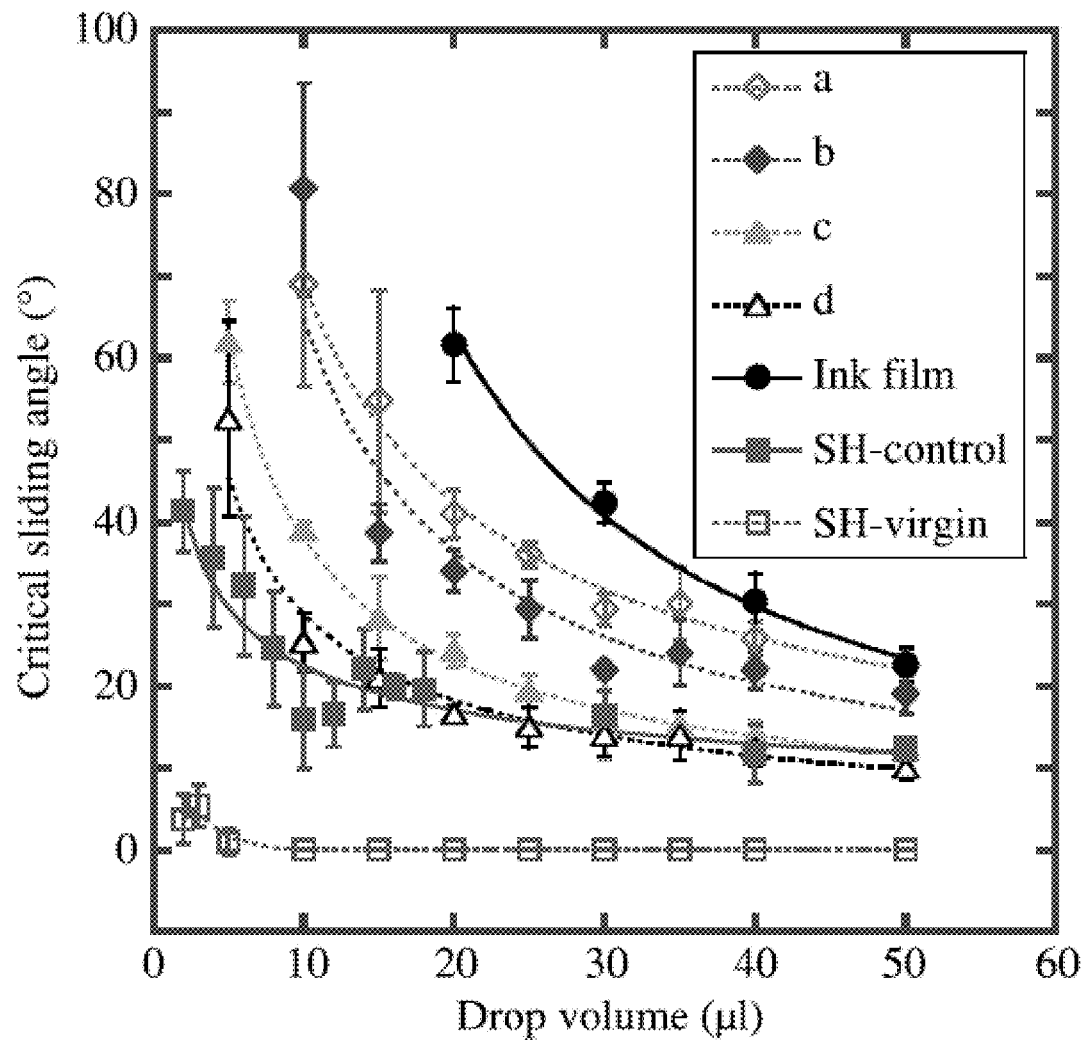
FIG. 30 graphically illustrates critical sliding angle relative to drop volume for the different checker patterns (a, b, c and d) as shown in FIG. 29 in accordance with the embodiments of EXAMPLE 4.

FIG. 30 shows the sliding angle of water drops as a function of drop volume for the substrates shown in FIG. 29 along with sliding angles for a continuous ink film, for SH paper after passage through the printer but without printing (SH-control) and for SH paper that was not fed through the printer (SH-virgin). From these results, it was evident that composite surfaces with an ink fraction of about 25% (FIG. 30, curves a and b) display results close to those for the ink film, while the composite surfaces with an ink fraction of about 8% (FIG. 30, curves c and d) display results close to those for the SH-control. These results indicated that by changing the area fraction of the composite surface, critical sliding angle values could be tuned between the values obtained for SH paper (control) and an ink film. Further consideration of the curves in FIG. 30 with the same area fraction but different feature sizes demonstrated that the sliding angles could be altered by changing the feature sizes. When feature size increased, the corrugations of the contact line had a larger radius of curvature and the tension on the three-phase contact line was reduced. This lowered the energy barrier for drop sliding which, in turn, altered the critical sliding angle. Indeed, FIG. 30 shows that patterns with larger features (curves b and d) consistently displayed lower sliding angles than did patterns with smaller features (curves a and c) although the area fractions are the same.

The SH-control substrate showed higher critical sliding angle values than the SH-virgin paper. It is believed that the enhanced stickiness of the SH-control substrate was caused by some damage to the plasma-treated surfaces as a result of paper passage through the printer. Heterogeneous damage incurred by the SH paper after feeding it through the printer was the likely cause of the relatively large error bars in FIG. 30 at small drop volumes. Nevertheless, the trends displayed in FIG. 30 were consistent with differences between the surfaces and drop sizes investigated. The ability to tune critical sliding angles offers flexibility in the design of two-dimensional microfluidic devices with controlled adhesion. Those skilled in the art will recognize that, for example, such substrates could be used as drop size filters to slide and transport only drops with a volume above a threshold value.

To summarize, this example demonstrates that the critical sliding angle of a water drop can be manipulated by changing the curvature (positive or negative) of the ink pattern contacting the receding contact line. For instance, a semi-circular ink pattern allows a water drop to slide easily in the convex direction, but not in the concave direction. For a straight line pattern printed on superhydrophobic (SH) paper, the drop can move along the line more easily than it can detach in a direction perpendicular to the line. These concepts have been used to design fundamental components of two-dimensional microfluidic devices such as flow paths, gate/diode, and junctions.

Also described in this example is the tunability of critical sliding angle on SH paper, which was obtained by establishing chemical heterogeneity on the paper surfaces. Area fraction, ink spot sizes, and the distance between ink spots were controlled in order to demonstrate tunability of critical sliding angles on a composite paper surface. These structures allowed for control of the adhesion of drops on SH paper surfaces, which can be used to permit the design of two-dimensional drop filters for two-dimensional microfluidic devices.

This example ultimately demonstrated directional mobility and tunability in the adhesion of water drops on superhydrophobic surfaces. That is, control was achieved by imposing geometrical constraints on the contact lines by printing specific ink patterns. As will be understood by those skilled in the art, the ability to generate these functionalities on paper substrates using commercially available desktop printing techniques offers considerable flexibility in designing paper-based two-dimensional microfluidic devices.

While the invention has been disclosed in its exemplary forms, it will be apparent to those skilled in the art that many modifications, additions, and deletions can be made therein without departing from the spirit and scope of the invention and its equivalents, as set forth in the following claims.

We claim:

1. A method of processing a substrate to create surface regions of variable adhesive force thereon, comprising:
   providing a substrate with a surface, the surface having crystalline and amorphous regions in a first ratio of crystalline-to-amorphous regions;
   processing the surface to form "roll-off" regions having a contact angle of water greater than approximately 150°, and water contact angle hysteresis less than approximately 10°; and
   processing the surface to form "sticky" regions having a contact angle of water greater than approximately 140°, and water contact angle hysteresis greater than approximately 10°;
   wherein the processing the surface comprises selective etching of at least a portion of the amorphous regions of the surface and coating at least a portion of the etched surface with a fluorocarbon film; and
   wherein the processing steps each comprise solvent-free processing.

2. The method of claim 1, wherein the substrate is a paper substrate.

3. The method of claim 1, wherein the "roll-off" regions have a contact angle of water greater than approximately 165°, and water contact angle hysteresis less than approximately 4°.

4. The method of claim 1, wherein the "sticky" regions have a contact angle of water greater than approximately 144°, and water contact angle hysteresis greater than approximately 75°.

5. The method of claim 1, wherein the "roll-off" regions have a contact angle of water in the range of approximately $166.7°\pm0.9°$, and water contact angle hysteresis in the range of approximately $3.4°\pm0.1°$; and wherein the "sticky" regions have a contact angle of water in the range of approximately $144.8°\pm5.7°$, and water contact angle hysteresis in the range of approximately $79.1°\pm15.8°$.

6. The method of claim 1, wherein the selective etching of at least a portion of the amorphous regions of the surface provides a second ratio of crystalline-to-amorphous regions, wherein the second ratio is greater than the first ratio.

7. The method of claim 1, wherein selective etching of at least a portion of the amorphous regions of the surface comprises domain-selective etching of at least a portion of the amorphous regions via a plasma treatment.

8. The method of claim 7, wherein the steps of processing the surface further comprise varying the plasma treatment in order to provide the roll-off and sticky regions.

9. The method of claim 5, wherein the steps of processing the surface comprise domain-selective etching of amorphous portions of the surface in an oxygen plasma and subsequently coating at least portions of the etched surface with a thin fluorocarbon film deposited via plasma-enhanced chemical vapor deposition using pentafluoroethane (PFE) as a precursor.

10. A vapor phase, plasma processing "external sizing" method for controlling the adhesion forces on a superhydrophobic cellulosic surface comprising:
    tuning the adhesion forces by controlling the topography of the cellulosic surface, wherein controlling the topography of the cellulosic surface comprises solvent-free, plasma-enhanced etching regions of the cellulosic surface to form an etched cellulosic surface; and
    coating at least a portion of the etched cellulosic surface with a fluorocarbon film.

11. The method of Claim 10, wherein controlling the topography of the cellulosic surface comprises inkjetting regions of the cellulosic surface.

12. The method of claim 10, wherein controlling the topography of the cellulosic surface comprises manipulating cellulosic type of the cellulosic surface.

13. A microfluidic device comprising:
    a paper substrate;
    at least one region of a superhydrophobic surface on the paper substrate forming a "roll-off" region having a contact angle of water greater than approximately 50°, and water contact angle hysteresis less than approximately 10°; and
    at least one region of a superhydrophobic surface on the paper substrate forming a "sticky" region having a contact angle of water greater than approximately 140°, and water contact angle hysteresis greater than approximately 10°;

wherein the device is a two-dimensional lab-on-paper device; and wherein at least a portion of the surface of the substrate comprises a fluorocarbon coating.

14. The device of claim 13, wherein the at least one sticky region comprises ink.

15. The microfluidic device of claim 13 further comprising at least one liquid droplet.

16. The microfluidic device of claim 15 wherein the at least one sticky region is configured to control an operation of the at least one liquid droplet.

17. The microfluidic device of claim 16, wherein an operation of the least one liquid droplet comprises one or more of registering at least one liquid droplet in a desired location on the paper substrate, confining at least one liquid droplet in a desired location on the paper substrate, transferring at least one liquid droplet from a first location to a second location on the paper substrate, wherein no liquid droplets are located at the second location prior to transfer, and transferring at least one liquid droplet from a first location to a second location on the paper substrate, wherein at least one liquid droplet is located at the second location prior to transfer.

* * * * *